(12) United States Patent
Eguchi et al.

(10) Patent No.: US 8,647,948 B2
(45) Date of Patent: Feb. 11, 2014

(54) METHOD OF MANUFACTURING VERTICAL PLANAR POWER MOSFET AND METHOD OF MANUFACTURING TRENCH-GATE POWER MOSFET

(71) Applicant: Renesas Electronics Corporation, Kanagawa (JP)

(72) Inventors: Satoshi Eguchi, Kanagawa (JP); Yuya Abiko, Kanagawa (JP); Junichi Kogure, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/742,489

(22) Filed: Jan. 16, 2013

(65) Prior Publication Data
US 2013/0189819 A1 Jul. 25, 2013

(30) Foreign Application Priority Data

Jan. 25, 2012 (JP) .................................. 2012-013030

(51) Int. Cl.
*H01L 21/78* (2006.01)
*H01L 21/336* (2006.01)

(52) U.S. Cl.
USPC ....................... 438/269; 438/270; 257/E21.41

(58) Field of Classification Search
USPC ...................... 438/268–270; 257/330, E21.41
See application file for complete search history.

(56) References Cited

U.S. PATENT DOCUMENTS

| | | | |
|---|---|---|---|
| 6,706,604 B2* | 3/2004 | Inagawa et al. ............... | 438/270 |
| 7,928,470 B2 | 4/2011 | Yamaguchi et al. | |
| 2010/0019314 A1* | 1/2010 | Kachi ........................... | 257/330 |
| 2011/0115033 A1* | 5/2011 | Tamaki et al. ................ | 257/409 |
| 2011/0136308 A1 | 6/2011 | Shibata et al. | |
| 2011/0215399 A1* | 9/2011 | Matsuura et al. ............. | 257/331 |
| 2011/0278650 A1* | 11/2011 | Tamaki et al. ................ | 257/288 |
| 2011/0284957 A1* | 11/2011 | Tamaki et al. ................ | 257/339 |
| 2011/0294278 A1* | 12/2011 | Eguchi et al. ................. | 438/401 |

FOREIGN PATENT DOCUMENTS

| | | |
|---|---|---|
| JP | 2007-173783 A | 7/2007 |
| JP | 2008-283151 A | 11/2008 |

\* cited by examiner

*Primary Examiner* — Savitr Mulpuri
(74) *Attorney, Agent, or Firm* — Mattingly & Malur, PC

(57) ABSTRACT

In the manufacturing steps of a super-junction power MOSFET having a drift region having a super junction structure, after the super junction structure is formed, introduction of a body region and the like and heat treatment related thereto are typically performed. However, in the process thereof, a dopant in each of P-type column regions and the like included in the super junction structure is diffused to result in a scattered dopant profile. This causes problems such as degradation of a breakdown voltage when a reverse bias voltage is applied between a drain and a source and an increase in ON resistance. According to the present invention, in a method of manufacturing a silicon-based vertical planar power MOSFET, a body region forming a channel region is formed by selective epitaxial growth.

4 Claims, 48 Drawing Sheets

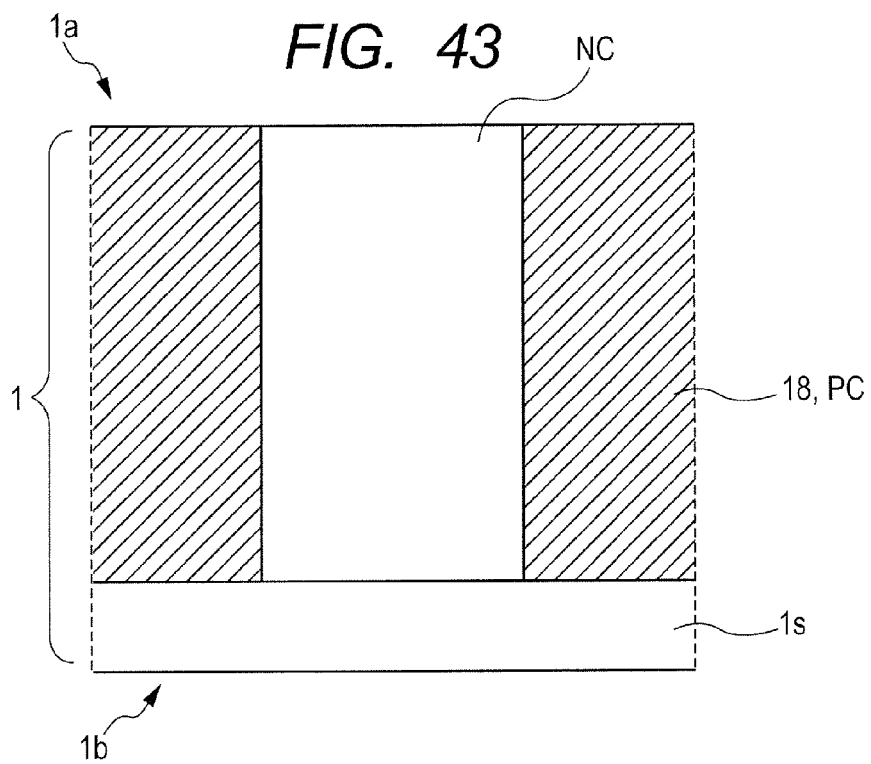
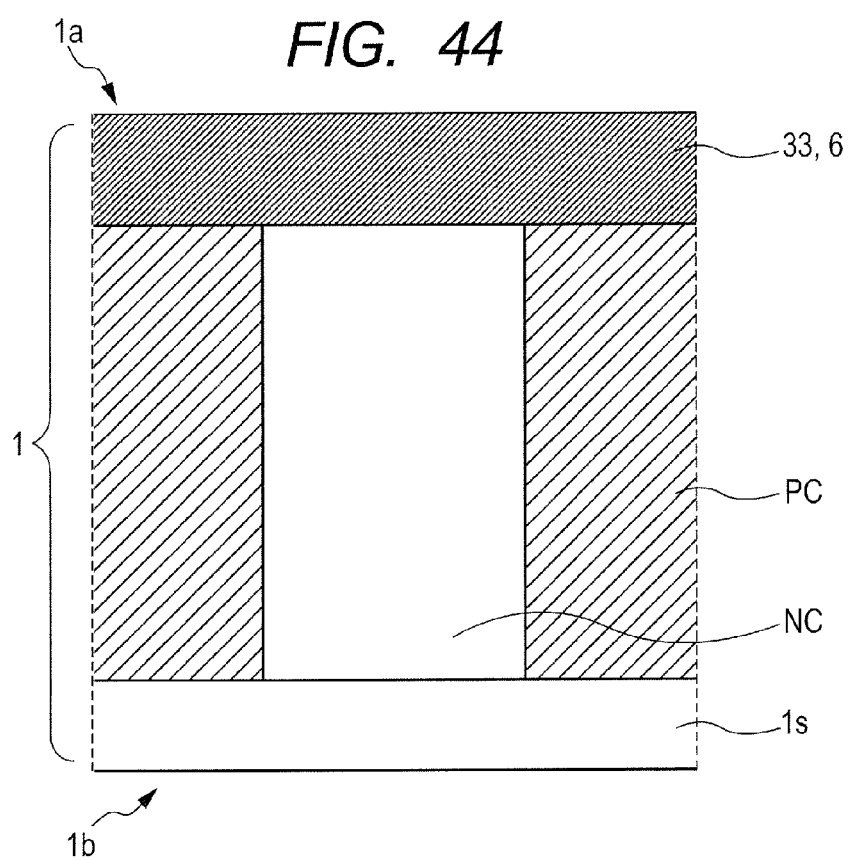

US 8,647,948 B2

METHOD OF MANUFACTURING VERTICAL PLANAR POWER MOSFET AND METHOD OF MANUFACTURING TRENCH-GATE POWER MOSFET

CROSS-REFERENCE TO RELATED APPLICATIONS

The disclosure of Japanese Patent Application No. 2012-013030 filed on Jan. 25, 2012 including the specification, drawings and abstract is incorporated herein by reference in its entirety.

BACKGROUND

The present invention relates to a technology which is effective when applied to a device structure and a device manufacturing technique in a semiconductor device (or semiconductor integrated circuit device) such as a vertical planar power MOSFET or a trench-gate MOSFET and a method of manufacturing the semiconductor device.

Japanese Unexamined Patent Publication No. 2007-173783 (Patent Document 1) or U.S. Pat. No. 7,928,470 (Patent Document 2) corresponding thereto discloses a technique in which, in a silicon-based vertical planar power MOSFET, a P⁻-type body region (channel region) is formed over the entire surface of a super junction drift area by epitaxial growth.

Also, Japanese Unexamined Patent Publication No. 2008-283151 (Patent Document 3) or US Patent Publication No. 2011-136308 (Patent Document 4) corresponding thereto discloses a technique in which, in a silicon-based trench power MOSFET, a P-type body region (channel region) is formed over the entire surface of a super-junction drift area by epitaxial growth.

RELATED ART DOCUMENTS

Patent Documents

[Patent Document 1]
Japanese Unexamined Patent Publication No. 2007-173783
[Patent Document 2]
U.S. Pat. No. 7,928,470
[Patent Document 3]
Japanese Unexamined Patent Publication No. 2008-283151
[Patent Document 4]
US Patent Publication No. 2011-136308

SUMMARY

In the manufacturing steps of a super-junction power MOSFET having a drift area having a super junction structure, after the super junction structure is formed, introduction of a body region and the like and heat treatment related thereto are typically performed. However, in the process thereof, a dopant in each of P-type column regions and the like included in the super junction structure is diffused to result in a scattered dopant profile. This causes problems such as degradation of a breakdown voltage when a reverse bias voltage is applied between a drain and a source and an increase in ON resistance.

The present invention has been achieved to solve such problems.

An object of the present invention is to provide a highly reliable manufacturing process for a semiconductor device.

The above and other objects and novel features of the present invention will become apparent from a statement in the present specification and the accompanying drawings.

The following is a brief description of a representative aspect of the invention disclosed in the present application.

That is, according to an aspect of the invention disclosed in the present application, in a method of manufacturing a silicon-based vertical planar power MOSFET, a body region forming a channel region is formed by selective epitaxial growth.

The following is a brief description of an effect obtained according to the representative aspect of the invention disclosed in the present application.

That is, in the method of manufacturing the silicon-based vertical planar power MOSFET, the body region forming the channel region is formed by selective epitaxial growth. This can steepen a dopant profile in a P-type column region or the like included in a super junction structure.

BRIEF DESCRIPTION OF THE DRAWINGS

FIG. 43 is a device cross-sectional view (of the step of forming a super junction structure in a drift region) during the manufacturing step corresponding to the B-B' cross section of the partially cut-away region R2 of the cell portion of FIG. 41, which is for illustrating a wafer process in the method of manufacturing the semiconductor device of the other embodiment of the present invention;

FIG. 44 is a device cross-sectional view (of the step of epitaxial growth of P-type body regions) during the manufacturing step corresponding to the B-B' cross section of the partially cut-away region R2 of the cell portion of FIG. 41, which is for illustrating the wafer process in the method of manufacturing the semiconductor device of the other embodiment of the present invention;

DETAILED DESCRIPTION

<Outline of Embodiments>

Figure 1:
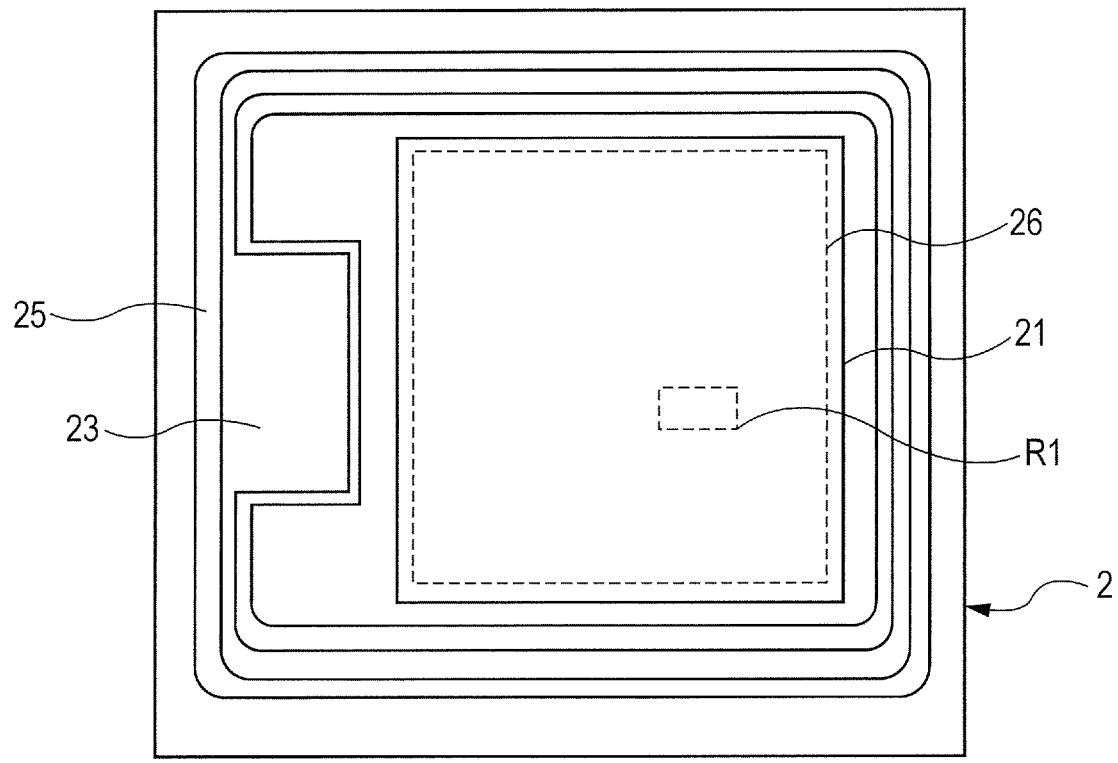
FIG. 1 is a view of the entire upper surface of a semiconductor chip for illustrating the chip layout of a vertical planar power MOSFET as an example of a target device in a manufacturing method of a semiconductor device of an embodiment of the present invention.

First, a description will be given to the outline of representative embodiments of the invention disclosed in the present application.

1. In a method of manufacturing a vertical planar power MOSFET, the vertical planar power MOSFET includes: (a) a silicon-based semiconductor substrate having a first main surface and a second main surface; (b) a drift region having a super junction structure in which a column region of a first conductivity type and a column region of a second conductivity type which are provided in the semiconductor substrate are alternately and repeatedly formed; (c) a drain region of the first conductivity type provided in a semiconductor back surface area of the semiconductor substrate closer to the second main surface; (d) a metal drain electrode provided over the second main surface of the semiconductor substrate; (e) a body region of the second conductivity type provided in a semiconductor top surface area of the semiconductor substrate closer to the first main surface; (f) a source region of the first conductivity type which is the semiconductor top surface area of the semiconductor substrate closer to the first main surface and provided in the body region; (g) a gate electrode provided over the first main surface of the semiconductor substrate via a gate insulating film; and (h) a metal source electrode provided over the first main surface of the semiconductor substrate so as to be electrically coupled to the source region. The method of manufacturing the vertical planar power MOSFET includes the steps of: (x1) forming the super junction structure on the top surface side of the silicon-based wafer of the first conductivity type; (x2) forming a trench to be filled with the body region for embedding the body region in a surface of the super junction structure; and (x3) filling the trench to be filled with the body region by selective epitaxial growth.

2. In the method of manufacturing the vertical planar power MOSFET according to article 1, the body region has an area doped with carbon.

3. In the method of manufacturing the vertical planar power MOSFET according to article 1 or 2, the source region has an area doped with carbon.

4. In the method of manufacturing the vertical planar power MOSFET according to any one of articles 1 to 3, the column region of the second conductivity type is doped with germanium or carbon.

5. In the method of manufacturing the vertical planar power MOSFET according to any one of articles 1 to 4, a growth temperature for the selective epitaxial growth ranges from 600 to 900° C.

6. In the method of manufacturing the vertical planar power MOSFET according to any one of articles 3 to 5, the area of the source region doped with carbon is formed by selective epitaxial growth.

7. In the method of manufacturing the vertical planar power MOSFET according to any one of articles 3 to 5, the area of the source region doped with carbon is formed by ion implantation of cluster carbon.

8. In a method of manufacturing a trench-gate power MOSFET, the trench gate power MOSFET includes: (a) a semiconductor substrate having a first main surface and a second main surface; (b) a drift region having a super junction structure in which a plurality of column regions each of a first conductivity type and a plurality of column regions each of a second conductivity type which are provided in the semiconductor substrate are alternately formed; (c) a drain region of the first conductivity type provided in a semiconductor back surface area of the semiconductor substrate closer to the second main surface; (d) a metal drain electrode provided over the second main surface of the semiconductor substrate; (e) a body region of the second conductivity type provided in a semiconductor top surface area of the semiconductor substrate closer to the first main surface; (f) a trench extending from within each of the plurality of column regions each of the first conductivity type through the body region and reaching the first main surface of the semiconductor substrate; (g) a source region of the first conductivity type which is the semiconductor top surface area of the semiconductor substrate closer to the first main surface and provided in the body region; (h) a trench gate electrode provided in the trench via a gate insulating film; (i) a SiGe epitaxial region of the second conductivity type provided closer to the first main surface of the semiconductor substrate so as to oppose the trench gate electrode with the body region being interposed therebetween; and (j) a metal source electrode provided over the first main surface of the semiconductor substrate so as to be electrically coupled to the source region. The method of manufacturing the trench-gate power MOSFET includes the steps of: (x1) forming the super junction structure on the top surface side of the silicon-based wafer of the first conductivity type; (x2) forming the body region of the second conductivity type over the super junction structure on the top surface side of the silicon-based wafer; (x3) forming a trench to be filled with the SiGe epitaxial region in the body region so as to leave the body region between the trench to be filled with the SiGe epitaxial region and the trench gate electrode; and (x4) filling the trench to be filled with the SiGe epitaxial region by selective epitaxial growth.

9. In the method of manufacturing the trench-gate power MOSFET according to article 8, each of the column regions of the second conductivity type is doped with germanium or carbon.

10. In a method of manufacturing a trench-gate power MOSFET, the trench-gate power MOSFET includes: (a) a semiconductor substrate having a first main surface and a second main surface; (b) a drift region having a super junction structure in which a plurality of column regions each of a first conductivity type and a plurality of column regions each of a second conductivity type which are provided in the semiconductor substrate are alternately formed; (c) a drain region of the first conductivity type provided in a semiconductor back surface area of the semiconductor substrate closer to the second main surface; (d) a metal drain electrode provided over the second main surface of the semiconductor substrate; (e) a body region of the second conductivity type provided in a semiconductor top surface area of the semiconductor substrate closer to the first main surface; (f) a trench extending from within each of the plurality of column regions each of the first conductivity type through the body region and reaching the first main surface of the semiconductor substrate; (g) a source region of the first conductivity type which is the semiconductor top surface area of the semiconductor substrate closer to the first main surface and provided in the body region; (h) a trench gate electrode provided in the trench via a gate insulating film; (i) a SiGe semiconductor region of the second conductivity type provided closer to the first main surface of the semiconductor substrate so as to oppose the trench gate electrode with the body region being interposed therebetween; and (j) a metal source electrode provided over the first main surface of the semiconductor substrate so as to be electrically coupled to the source region. The method of manufacturing the trench-gate power MOSFET includes the steps of: (x1) forming the super junction structure on the top surface side of the silicon-based wafer of the first conductivity type; (x2) forming the body region of the second conductivity type over the super junction structure on the top surface side of the silicon-based wafer; (x3) forming the source region in a surface of the body region; and (x4) forming the SiGe semiconductor region in a part of the body region by ion implantation so as to leave the body region between the SiGe semiconductor region and the trench gate electrode.

11. In the method of manufacturing the trench-gate power MOSFET according to article 10, each of the column regions of the second conductivity type is doped with germanium or carbon.

12. A vertical planar power MOSFET includes: (a) a silicon-based semiconductor substrate having a first main surface and a second main surface; (b) a drift region having a super junction structure in which a column region of a first conductivity type and a column region of a second conductivity type which are provided in the semiconductor substrate are alternately and repeatedly formed; (c) a drain region of the first conductivity type provided in a semiconductor back surface area of the semiconductor substrate closer to the second main surface; (d) a metal drain electrode provided over the second main surface of the semiconductor substrate; (e) a body region of the second conductivity type provided in a semiconductor top surface area of the semiconductor substrate closer to the first main surface; (f) a source region of the first conductivity type which is the semiconductor top surface area of the semiconductor substrate closer to the first main surface and provided in the body region; (g) a gate electrode provided over the first main surface of the semiconductor substrate via a gate insulating film; and (h) a metal source electrode provided over the first main surface of the semiconductor substrate so as to be electrically coupled to the source region. Here, the body region is formed by selective epitaxial growth.

13. In the vertical planar power MOSFET according to article 12, the body region has an area doped with carbon.

14. In the vertical planar power MOSFET according to article 12 or 13, the source region has an area doped with carbon.

15. In the vertical planar power MOSFET according to any one of articles 12 to 14, the column region of the second conductivity type is doped with germanium or carbon.

16. In the vertical planar power MOSFET according to article 14 or 15, the area of the source region doped with carbon is formed by selective epitaxial growth.

17. In the vertical planar power MOSFET according to article 14 or 15, the area of the source region doped with carbon is formed by ion implantation of cluster carbon.

18. A trench-gate power MOSFET includes: (a) a semiconductor substrate having a first main surface and a second main surface; (b) a drift region having a super junction structure in which a plurality of column regions each of a first conductivity type and a plurality of column regions each of a second conductivity type which are provided in the semiconductor substrate are alternately formed; (c) drain region of the first conductivity type provided in a semiconductor back surface area of the semiconductor substrate closer to the second main surface; (d) a metal drain electrode provided over the second main surface of the semiconductor substrate; (e) a body region of the second conductivity type provided in a semiconductor top surface area of the semiconductor substrate closer to the first main surface; (f) a trench extending from within each of the plurality of column regions each of the first conductivity type through the body region and reaching the first main surface of the semiconductor substrate; (g) a source region of the first conductivity type which is the semiconductor top surface area of the semiconductor substrate closer to the first main surface and provided in the body region; (h) a trench gate electrode provided in the trench via a gate insulating film; (i) a SiGe epitaxial region of the second conductivity type provided closer to the first main surface of the semiconductor substrate so as to oppose the trench gate electrode with the body region being interposed therebetween; and (j) a metal source electrode provided over the first main surface of the semiconductor substrate so as to be electrically coupled to the source region.

19. In the trench-gate power MOSFET according to article 18, the SiGe epitaxial region is formed by selective epitaxial growth.

20. In the trench-gate power MOSFET according article 18, the SiGe epitaxial region is formed by implantation of Ge ions into the body region.

<Explanation of Description Form, Basic Terminology, and Use thereof in Present Application>

1. In the present application, if necessary for the sake of convenience, the description of an embodiment may be such that the embodiment is divided into a plurality of sections in the description thereof. However, they are by no means independent of or distinct from each other unless particularly explicitly described otherwise, and one of the individual parts of a single example is details, variations, and so forth of part or the whole of the others. In principle, a repeated description of like parts will be omitted. Each constituent element in the embodiment is not indispensable unless particularly explicitly described otherwise, unless the constituent element is theoretically limited to a given number, or unless it is obvious from the context that the constituent element is indispensable.

Also in the present application, when a "semiconductor device" is mentioned, it primarily refers to various stand-alone transistors (active elements) or to a device in which a resistor, a capacitor, and the like are integrated around such a stand-alone transistor over a semiconductor chip or the like (e.g., a single-crystal silicon substrate). Representative examples of the various transistors which can be shown include MISFETs (Metal Insulator Semiconductor Field Effect Transistors) represented by a MOSFET (Metal Oxide Semiconductor Field Effect Transistor). Representative examples of the various stand-alone transistors that can be shown include a power MOSFET and an IGBT (Insulated Gate Bipolar Transistor). These representative examples are generally categorized into power semiconductor devices and include not only the power MOSFET and the IGBT, but also a bipolar power transistor, a thyristor, a power diode, and the like.

A representative form of the power MOSFET is a double diffused vertical power MOSFET having a source electrode on the top surface thereof and having a drain electrode on the back surface thereof or a vertical power MOSFET. The double diffused vertical power MOSFET or the vertical power MOSFET can be primarily classified into two types. The first type is a planar gate type described mainly in the embodiments. The second type is a trench gate type such as a U-MOSFET.

Another example of the power MOSFET is an LD-MOSFET (Lateral-Diffused MOSFET).

2. Likewise, even when such wording as "X comprised of A" is used in association with a material, a composition, or the like in the description of the embodiments or the like, it does not exclude a material, a composition, or the like which contains an element other than A as one of the main constituent elements thereof unless particularly explicitly described otherwise or unless it is obvious from the context that it excludes such a material, a composition, or the like. For example, when a component is mentioned, the wording means "X containing A as a main component" or the like. It will be appreciated that, even when, e.g., a "silicon member" or the like is mentioned, it is not limited to pure silicon, and a member containing a SiGe alloy, another multi-element alloy containing silicon as a main component, another additive, or the like is also included. Likewise, it will also be appreciated that, even when a "silicon oxide film", "silicon-oxide-based insulating film", or the like is mentioned, it includes not only a relatively pure undoped silicon dioxide, but also a thermal oxide film of FSG (Fluorosilicate Glass), TEOS-based silicon oxide, SiOC (Silicon Oxicarbide), carbon-doped silicon oxide, OSG (Organosilicate glass), PSG (Phosphorus Silicate Glass), BPSG (Borophosphosilicate Glass), or the like, a CVD oxide film, a coated silicon oxide such as SOG (Spin ON Glass) or NCS (Nano-Clustering Silica), silica-based Low-k insulating film (porous insulating film) obtained by introducing voids into the same member as mentioned above, a composite film with another silicon-based insulating film which contains any of these mentioned above as a main constituent element thereof, and the like.

As a silicon-based insulating film commonly used in a semiconductor field along with a silicon-oxide-based insulating film, there is a silicon-nitride-based insulating film. Materials belonging to this system include SiN, SiCN, SiNH, SiCNH, and the like. Here, when "silicon nitride" is mentioned, it includes both of SiN and SiNH unless explicitly described otherwise. Likewise, when "SiCN" is mentioned, it includes both of SiCN and SiCNH unless particularly explicitly described otherwise.

SiC has properties similar to those of SiN while, in most cases, SiON should rather be categorized into a silicon-oxide-based insulating film.

3. Likewise, it will also be appreciated that, although a preferred example is shown in association with a graphical figure, a position, an attribute, or the like, the graphical figure, position, attribute, or the like is not strictly limited thereto unless particularly explicitly described otherwise or unless it is obvious from the context that the graphical figure, position, attribute, or the like is strictly limited thereto.

4. Further, when a specific numerical value or numerical amount is mentioned, it may be a value more or less than the specific numerical value unless particularly explicitly described otherwise, unless the numerical value is theoretically limited to a given number, or unless it is obvious from the context that the numeral value is limited to a given number.

5. When a "wafer" is mentioned, it typically refers to a single-crystal silicon wafer over which a semiconductor device (the same as a semiconductor integrated circuit device or an electronic device) is formed, but it will be appreciated that the "wafer" also includes a composite wafer of an insulating substrate and a semiconductor layer or the like, such as an epitaxial wafer, a SOI substrate, or an LCD glass substrate.

When a "single-crystal region" or the like is mentioned in the present application, it is assumed to include an epitaxial region unless particularly explicitly described otherwise or unless it obviously does not.

6. In regard to a drift region in a power MOSFET or the like, for the purpose of avoiding restrictions placed by a related-art silicon limit to implement a high-breakdown-voltage FET having a low ON resistance or the like, a super junction structure has been introduced which alternately has relatively highly doped slab-like N-type column regions and P-type column regions in the drift region (main current path). Methods of introducing the super junction structure are roughly divided into three types of methods, i.e., a multi-epitaxial method, a trench-insulating-film embedding method, and a trench-fill method (trench filling method, automatic filling method, or trench epitaxial filling method). Among them, the multi-epitaxial method in which epitaxial growth and ion implantation are repeated multiple times has high process/design flexibility and accordingly complicated process steps, resulting in high cost. In the trench-insulating-film embedding method, after oblique ion implantation into trenches is performed, the trenches are filled with a CVD (Chemical Vapor Deposition) insulating film. The trench-insulating-film embedding method is simpler in terms of process, but is disadvantageous in terms of area due to the area of the trenches. By contrast, the trench-fill method has relatively low process/design flexibility due to constraints on growth conditions for filling epitaxial growth, but has the advantage of simple process steps.

In general, a super junction structure is such that, into a semiconductor region of a given conductivity type, columnar or plate-like column regions of the opposite conductivity type have been substantially equidistantly inserted so as to maintain a charge balance. In the present application, when a "super junction structure" formed by a trench-fill method is mentioned, it refers to, in principle, a structure in which, into a semiconductor region of a given conductivity type, plate-like "column regions" (which are typically shaped like flat plates, but may also be curved or bent) of the opposite conductivity type have been substantially equidistantly inserted so as to maintain a charge balance. In the embodiment, a description will be given to a structure formed by equidistantly placing P-type columns in parallel in an N-type semiconductor layer (e.g., a drift region).

In regard to a super junction structure, "orientation" indicates the longitudinal direction of a P-type column or an N-type column included in the super junction structure when the P-type column or N-type column is two-dimensionally viewed correspondingly to the main surface of a chip (in a plane parallel with the main surface of the chip or wafer).

Note that the super junction structure can be applied not only to a power MOSFET, but also to a drift region (alternatively, a region corresponding thereto or a main current path) in a general power semiconductor device with substantially no alteration or with necessary alternation.

7. In the present application, when a crystal plane is shown by (100) or the like, it is assumed to include a crystal plane equivalent thereto. Likewise, when a crystal orientation is shown by <100>, <110>, or the like, it is assumed to include a crystal orientation equivalent thereto.

[Details of Embodiments]

The embodiments will be described in greater detail. In each of the drawings, the same or like parts are designated by the same or similar marks or reference numerals, and a description thereof will not be repeated in principle.

In the accompanying drawings, hatching or the like may be omitted even in a cross section when hatching or the like results in complicated illustration or when the distinction between a portion to be hatched and a vacant space is distinct. In relation thereto, even a two-dimensionally closed hole may have a background outline thereof omitted when it is obvious from the description or the like that the hole is two-dimensionally closed, and so forth. On the other hand, even though not shown in a cross section, a portion other than a vacant space may be hatched to clearly show that the hatched portion is not a vacant space.

Note that other examples of a related-art patent application which discloses a filling epitaxial technique involving the addition of carbon or the like with regard to a MOSFET having a super junction structure include Japanese Unexamined Patent Publication No. 2011-146429 (date of publication of JP application is Jul. 28, 2011).

1. Description of Vertical Planar Power MOSFET, etc. as Example of Target Device in Manufacturing Method of Semiconductor Device of Embodiment of Present Invention (See Mainly FIGS. 1 to 3)

Here, by way of example, a device having a source-drain breakdown voltage of about 600 V will be described specifically. However, it will be appreciated that the following embodiment is also applicable to a device having another breakdown voltage.

Figure 2:
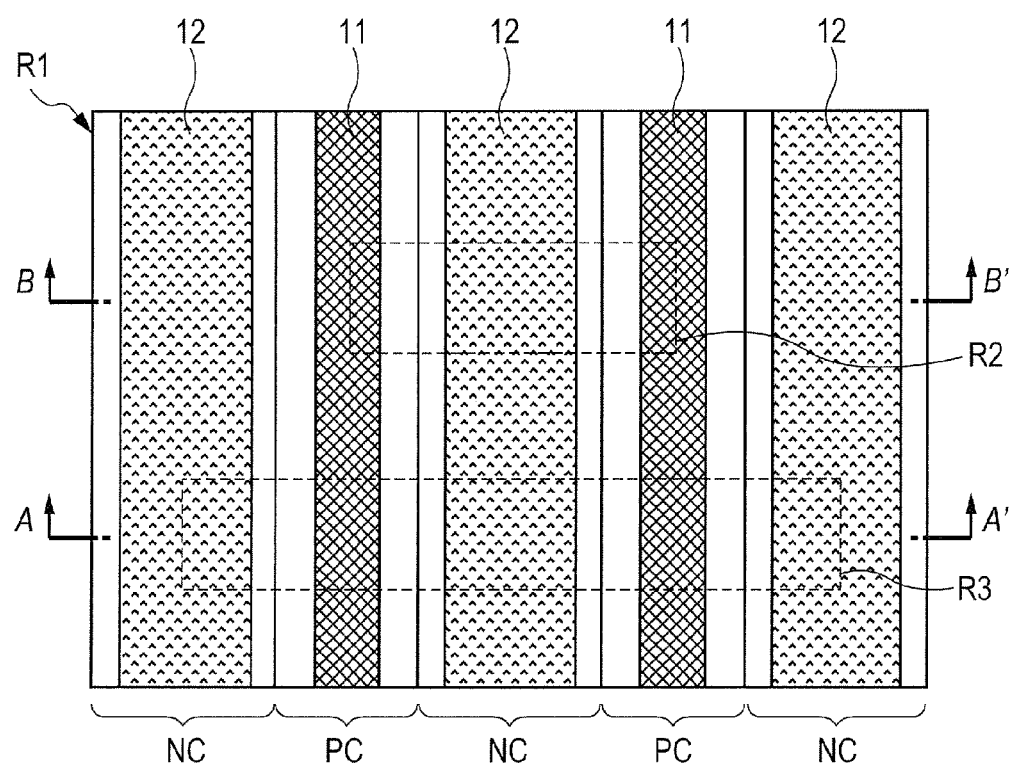
FIG. 2 is an enlarged plan view of the partially cut-away region R1 of the cell portion of FIG. 1.
Figure 3:
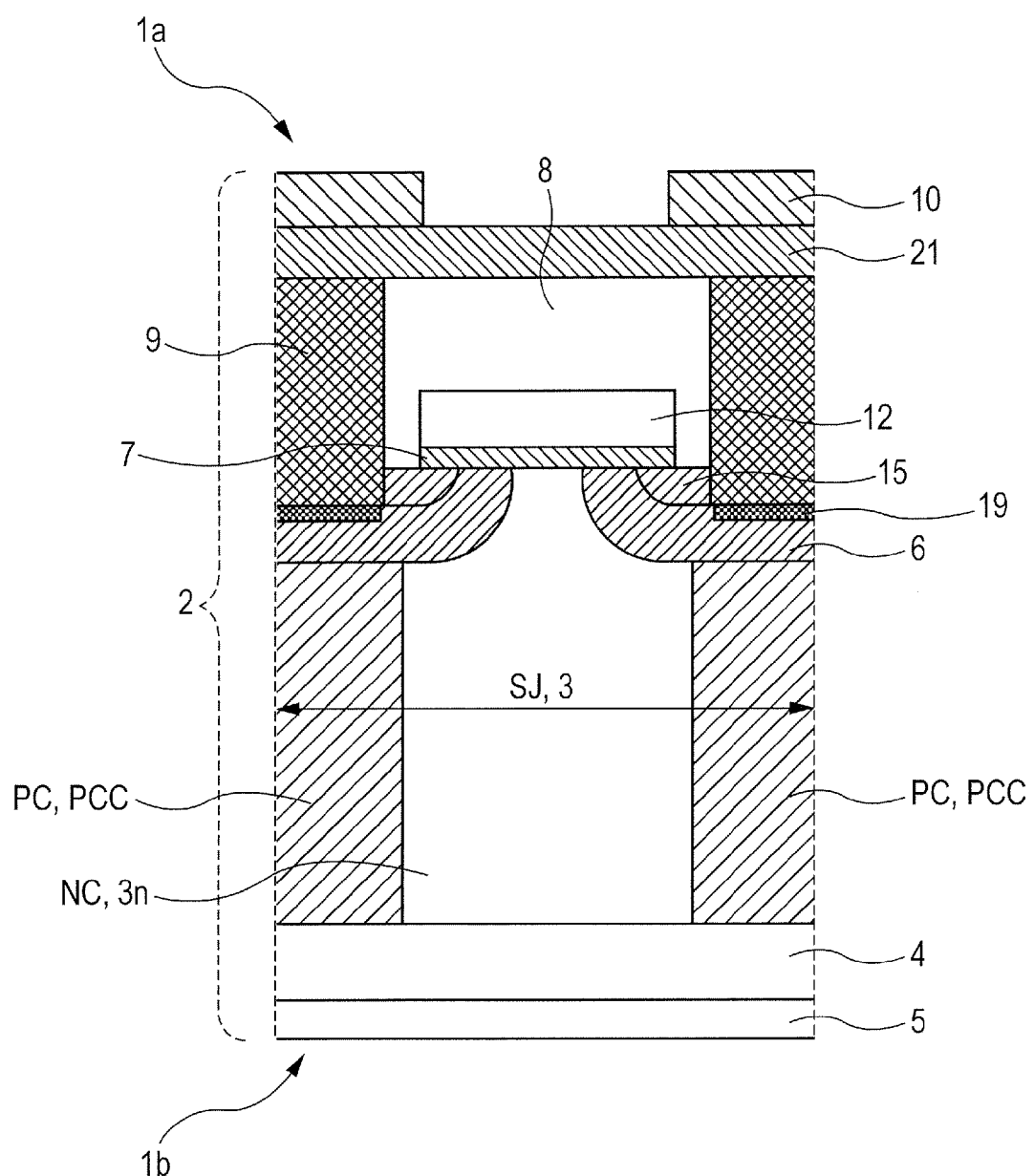
FIG. 3 is a device cross-sectional view of a unit active cell region corresponding to the B-B' cross section of the partially cut-away region R2 of the cell portion of FIG. 2.

FIG. 1 is a view of the entire upper surface of a semiconductor chip for illustrating the chip layout of a vertical planar power MOSFET as an example of a target device in a manufacturing method of a semiconductor device of an embodiment of the present invention. FIG. 2 is an enlarged plan view of the partially cut-away region R1 of the cell portion of FIG. 1. FIG. 3 is a device cross-sectional view of a unit active cell region corresponding to the B-B' cross section of the partially cut-away region R2 of the cell portion of FIG. 2. Based on these drawings, a description will be given to the vertical planar power MOSFET or the like as the example of the target device in the method of manufacturing the semiconductor device of the embodiment of the present invention.

First, based on FIGS. 1 and 2 (partially cut-away region R1 of the cell portion of FIG. 1), an overall structure of a semiconductor chip 2 will be described. As shown in FIG. 1, in the power MOSFET element chip 2 in which an element is formed over a square or rectangular plate-like silicon-based semiconductor substrate (which is a wafer before being divided into individual chips), a metal source electrode 21 located at a center portion thereof occupies a major area. Under the metal source electrode 21, there is a repeated-stripe device pattern region where a large number of stripe gate electrodes 12 (gate electrodes) and stripe contact trenches 11 each extending sufficiently longer than the width thereof (or the pitch therebetween) are alternately arranged, i.e., an active cell region 26. Here, the cell region 26 has spread under substantially the entire metal source region 21, and the part R1 (partially cut-away region R1 of the cell portion) enclosed by the broken line is a part thereof. On the periphery of the linear cell region 26, there is a gate pad region 23 for extracting the gate electrodes 12 from the periphery to the outside. Further around the gate pad region 23, an aluminum guard ring 25 is provided.

Next, using FIGS. 2 and 3, a detailed structure of the cell region 26 (FIG. 1) is described. As shown in FIGS. 2 and 3, over an $N^+$-type Si single-crystal substrate region 1$s$, a drift region 3 having a super junction structure SJ is provided. In the drift region 3, N-type column regions NC and P-type column regions PC each having a plate-like shape and extending in a direction perpendicular to paper surfaces with FIGS. 2 and 3 are alternately formed. In this portion, the N-type column regions NC function as $N^-$-type drift regions 3$n$. Note that, by adding carbon or germanium (element having an ability to inhibit boron diffusion) to the P-type column regions PC and providing P-type column regions PCC doped with carbon or germanium, it is possible to reduce the scattering of an impurity profile due to heat treatment, though the addition of carbon or germanium is not mandatory. Here, as a preferred range of the concentration of added carbon, a range of, e.g., about 0.01 to 1.0 at % can be shown by way of example. Also, as a preferred range of the composition of germanium or the concentration of added germanium, a range of, e.g., about 5 to 30 at % can be shown by way of example.

Here, if the breakdown voltage of the drift region is assumed to be about 600 V, as a preferred thickness thereof, e.g., about 45 μm can be shown by way of example. As a preferred width of each of the N-type column regions, e.g., about 6 μm can be shown by way of example. Likewise, as a preferred width of each of the P-type column regions, e.g., about 4 μm can be shown by way of example. Note that the inner angle of the lower portion of each of the side surfaces of the N-type column region is typically 88 to 90 degrees.

In the upper end portion (closer to the substrate upper surface 1$a$) of the drift region 3, P-type body regions 6 forming channel regions are provided. In the P-type body regions 6, $N^+$-type source regions 15 are provided. $P^+$-type body contact regions 19 are provided so as'to come in contact with the $N^+$-type source regions 15. On the device surface 1$a$ side of the semiconductor substrate 2, polysilicon gate electrodes 12 are provided each via a gate insulating film 7. Each of the polysilicon gate electrodes 12 is covered with an interlayer insulating film 8. In the interlayer insulating film 8, contact trenches are formed and filled with tungsten plugs 9 (normally via a barrier metal layer of Ti/TiN, TiW, or the like). Over the interlayer insulating film 8, the aluminum-based metal source electrode 21 (normally via a battier metal layer of Ti/TiN, TiW, or the like) is formed so as to be coupled to the tungsten plugs 9. Note that, as shown in, e.g., FIG. 42, the metal source electrode 21 may also be formed directly without interposition of the tungsten plugs 9.

Over the aluminum-based metal source electrode 21, as a final passivation film 10, e.g., a polyimide-based insulating film 10 is formed. Note that, here, the opening of the final passivation film 10 corresponding to a source pad opening is shown schematically, but a real source pad opening is wider. Preferred examples of the final passivation film 10 include not only an organic single-layer film of a polyimide resin (polyimide-based resin), BCB (Benzocyclobutene), or the like, but also an organic/inorganic composite final passivation film including a plasma TEOS (Tetraethylorthosilicate)-based silicon oxide film or another silicon oxide film, a silicon nitride film, a polyimide-based resin film, and the like which are shown in ascending order, an inorganic final passivation film including a silicon oxide film, a silicon nitride film, and the like which are shown in ascending order, and the like.

On the other hand, the lower end portion of the drift region 3 serves as an $N^+$-type drain region 4 (i.e., the $N^+$-type semiconductor substrate 1$s$) and, on the back surface 1$b$ side of the $N^+$-type drain region 4, a metal drain electrode 5 (including, e.g., Ti/Ni/Au layers shown in order of increasing distance from the silicon substrate).

As will be described later, the P-type body regions 6 are formed by selective epitaxial growth. This can prevent an impurity profile in each of the P-type column regions PC and the like included in the super junction structure SG from being scattered in contrast to the case where the P-type body regions 6 are formed by a typical method including ion implantation, activation heat treatment, and the like.

2. Description of Wafer Process in Manufacturing Method (Pre-Channel Process) of Semiconductor Device of Embodiment of Present Invention (See Mainly FIGS. 4 to 16)

In this section, a description will be given to an example of a manufacturing method based on a trench-fill method, which is intended for the device structure described in Section 1.

Figure 4:
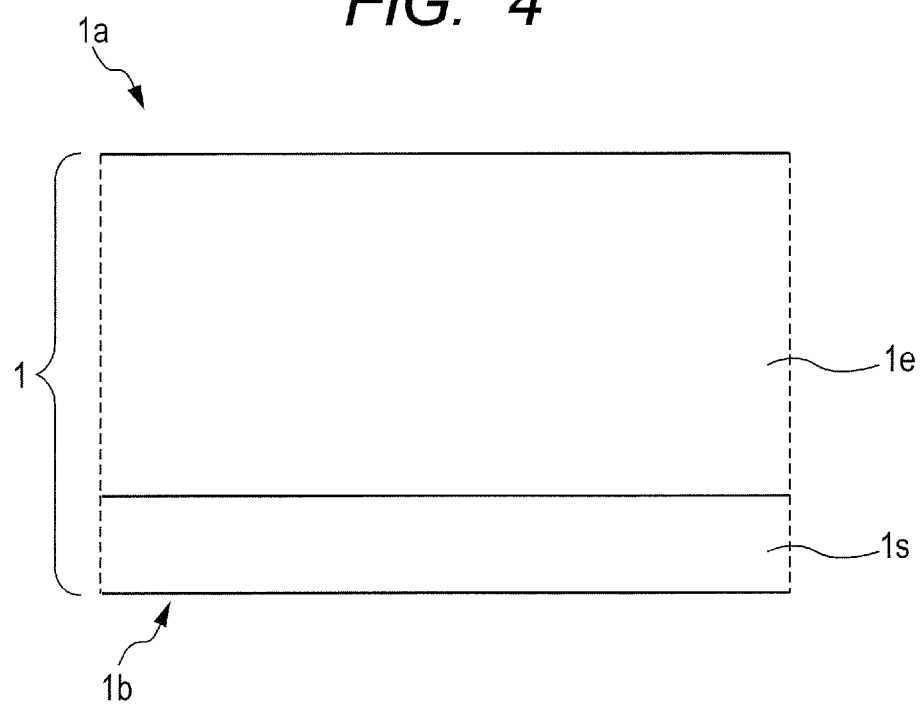
FIG. 4 is a device cross-sectional view (of the step of growing an N⁻-type silicon epitaxial layer) during the manufacturing step corresponding to the A-A' cross section of the partially cut-away region R2 of the cell portion of FIG. 2, which is for illustrating the manufacturing method (pre-channel process) of the semiconductor device of the embodiment of the present invention.
Figure 5:
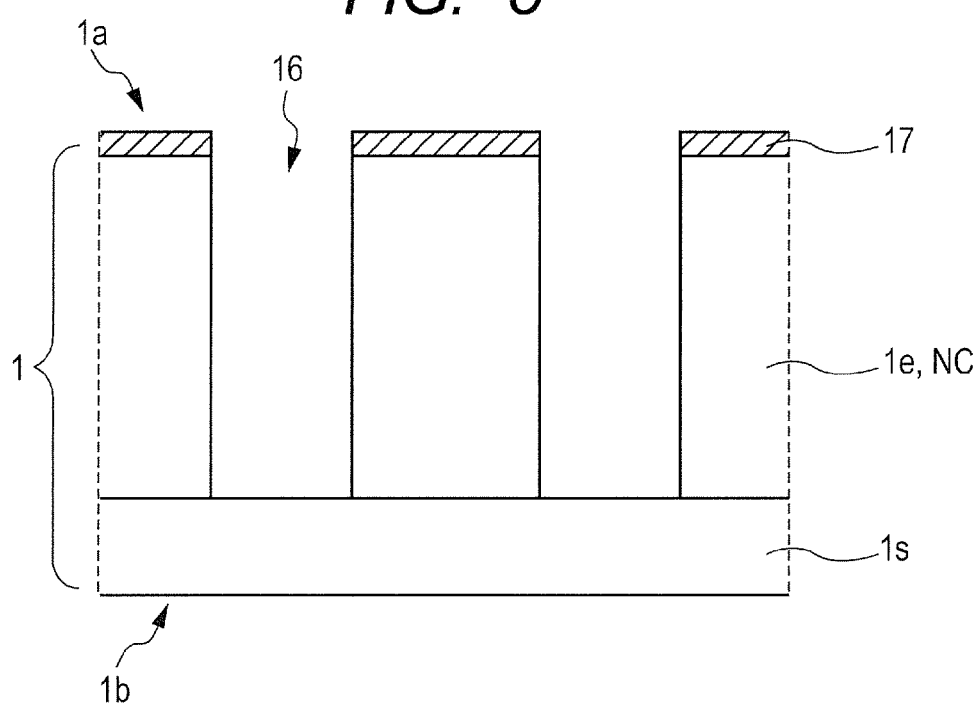
FIG. 5 is a device cross-sectional view (of the step of forming trenches to be filled with P-type columns) during the manufacturing step corresponding to the A-A' cross section of the partially cut-away region R2 of the cell portion of FIG. 2, which is for illustrating the manufacturing method (pre-channel process) of the semiconductor device of the embodiment of the present invention.
Figure 6:
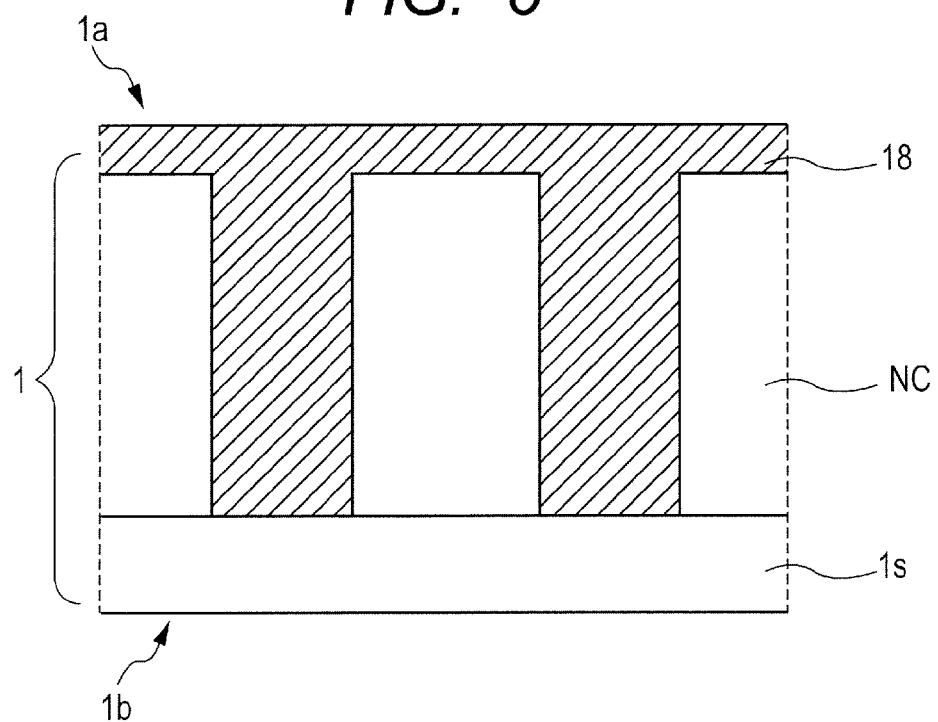
FIG. 6 is a device cross-sectional view (of the step of Si epitaxial growth for embedding P-type columns) during the manufacturing step corresponding to the A-A' cross section of the partially cut-away region R2 of the cell portion of FIG. 2, which is for illustrating the manufacturing method (pre-channel process) of the semiconductor device of the embodiment of the present invention.
Figure 7:
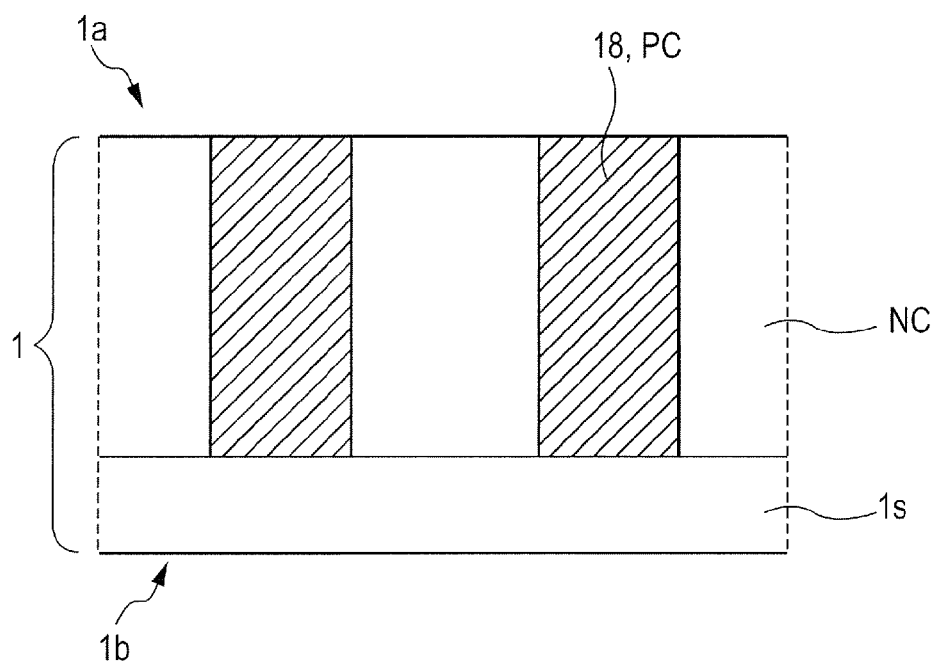
FIG. 7 is a device cross-sectional view (of the step of planarization after embedding the P-type columns) during the manufacturing step corresponding to the A-A' cross section of the partially cut-away region R2 of the cell portion of FIG. 2, which is for illustrating the manufacturing method (pre-channel process) of the semiconductor device of the embodiment of the present invention.
Figure 8:
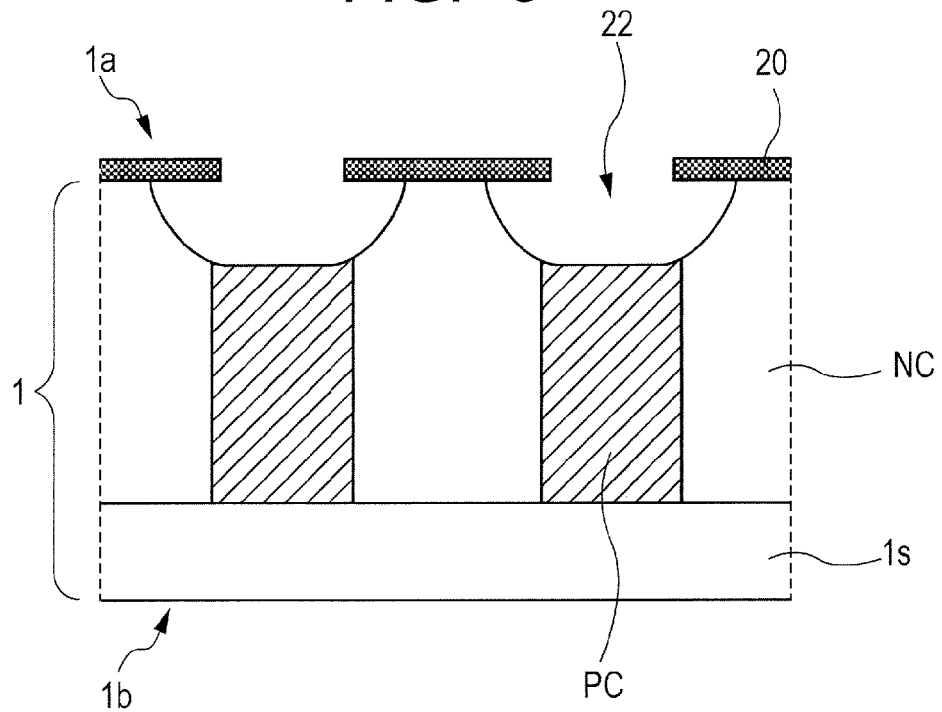
FIG. 8 is a device cross-sectional view (of the step of forming trenches to be filled with P-type body regions) during the manufacturing step corresponding to the A-A' cross section of the partially cut-away region R2 of the cell portion of FIG. 2, which is for illustrating the manufacturing method (pre-channel process) of the semiconductor device of the embodiment of the present invention.
Figure 9:
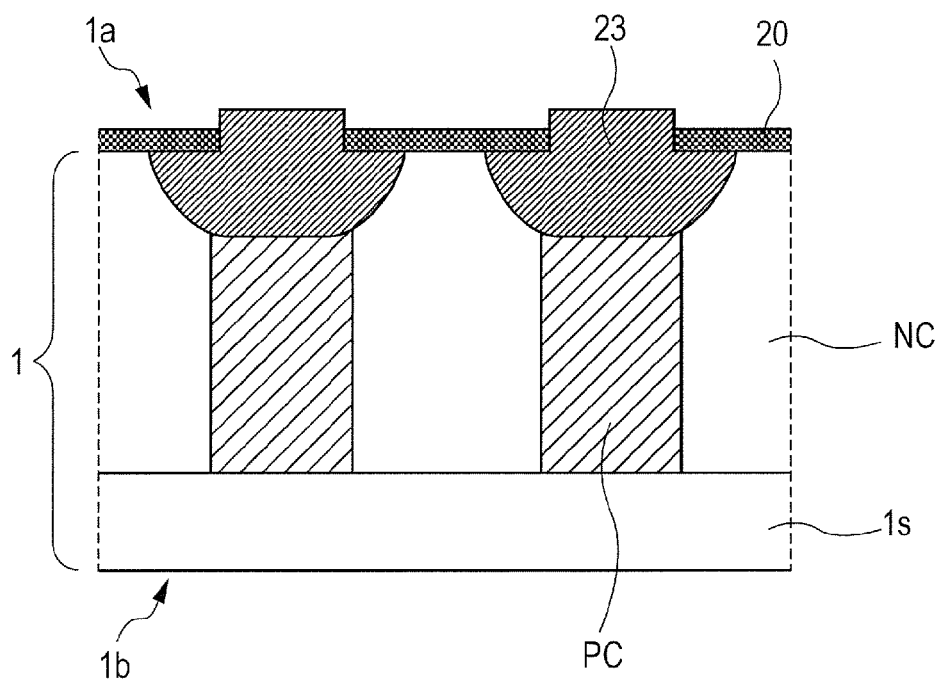
FIG. 9 is a device cross-sectional view (of the step of selective epitaxial growth of the P-type body regions) during the manufacturing step corresponding to the A-A' cross section of the partially cut-away region R2 of the cell portion of FIG. 2, which is for illustrating the manufacturing method (pre-channel process) of the semiconductor device of the embodiment of the present invention.
Figure 10:
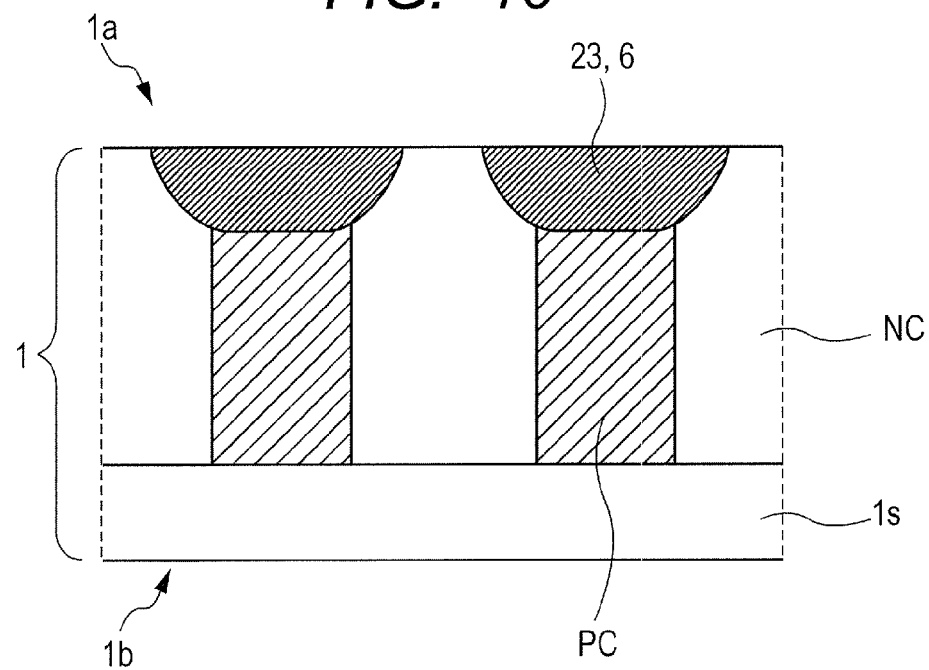
FIG. 10 is a device cross-sectional view (of the step of planarization after selective epitaxial growth of P-type body regions) during the manufacturing step corresponding to the A-A' cross section of the partially cut-away region R2 of the cell portion of FIG. 2, which is for illustrating the manufacturing method (pre-channel process) of the semiconductor device of the embodiment of the present invention.
Figure 11:
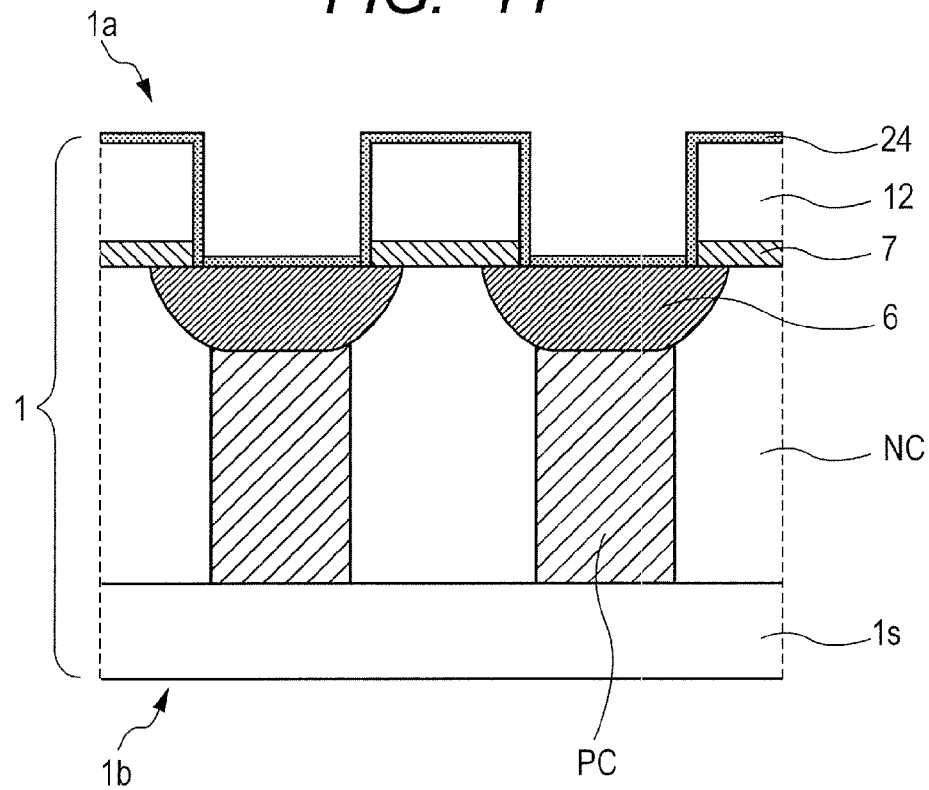
FIG. 11 is a device cross-sectional view (of the step of forming gate electrodes) during the manufacturing step corresponding to the A-A' cross section of the partially cut-away region R2 of the cell portion of FIG. 2, which is for illustrating the manufacturing method (pre-channel process) of the semiconductor device of the embodiment of the present invention.
Figure 12:
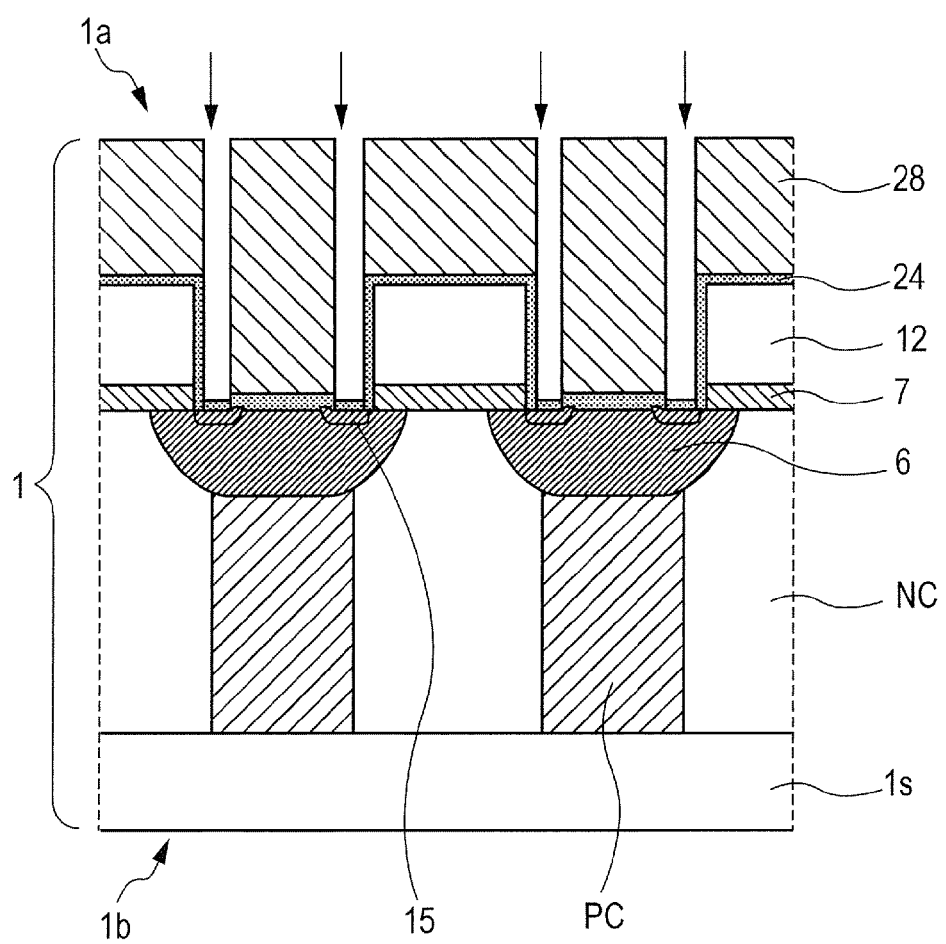
FIG. 12 is a device cross-sectional view (of the step of introducing $N^+$-type source regions) during the manufacturing step corresponding to the A-A' cross section of the partially cut-away region R2 of the cell portion of FIG. 2, which is for illustrating the manufacturing method (pre-channel process) of the semiconductor device of the embodiment of the present invention.
Figure 13:
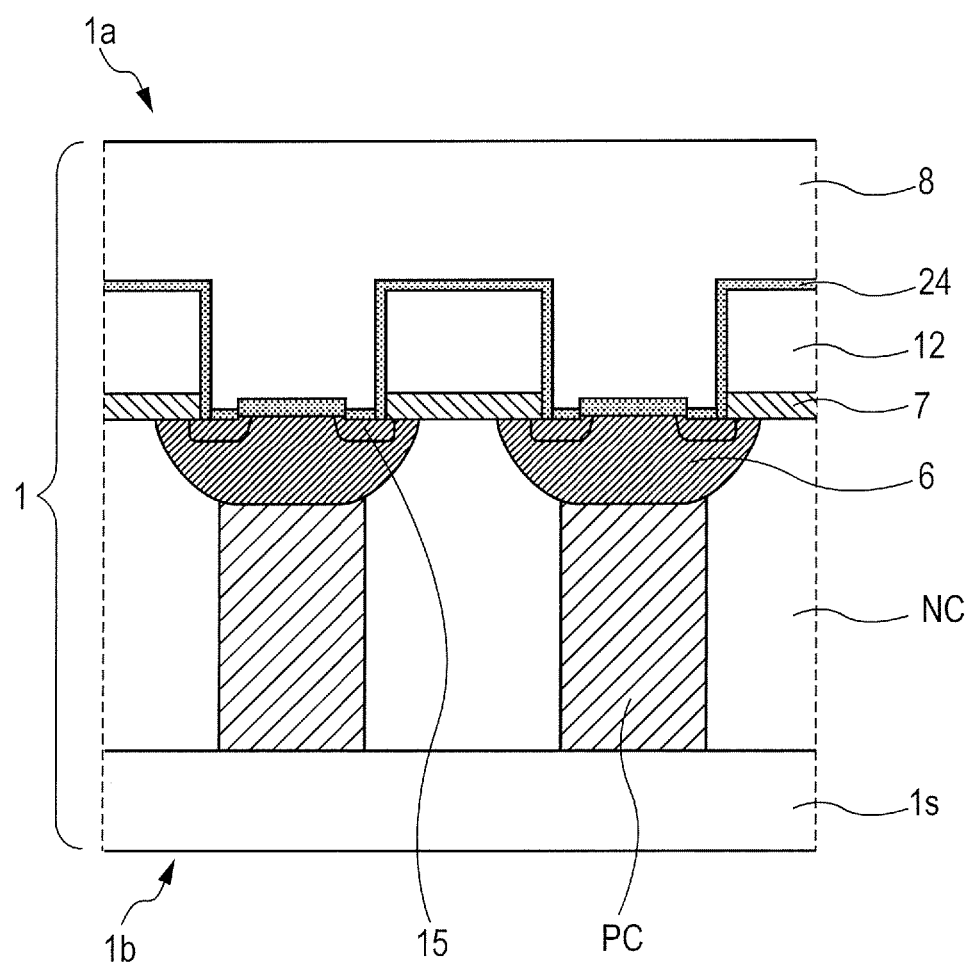
FIG. 13 is a device cross-sectional view (of the step of forming an interlayer insulating film) during the manufacturing step corresponding to the A-A' cross section of the partially cut-away region R2 of the cell portion of FIG. 2, which is for illustrating the manufacturing method (pre-channel process) of the semiconductor device of the embodiment of the present invention.
Figure 14:
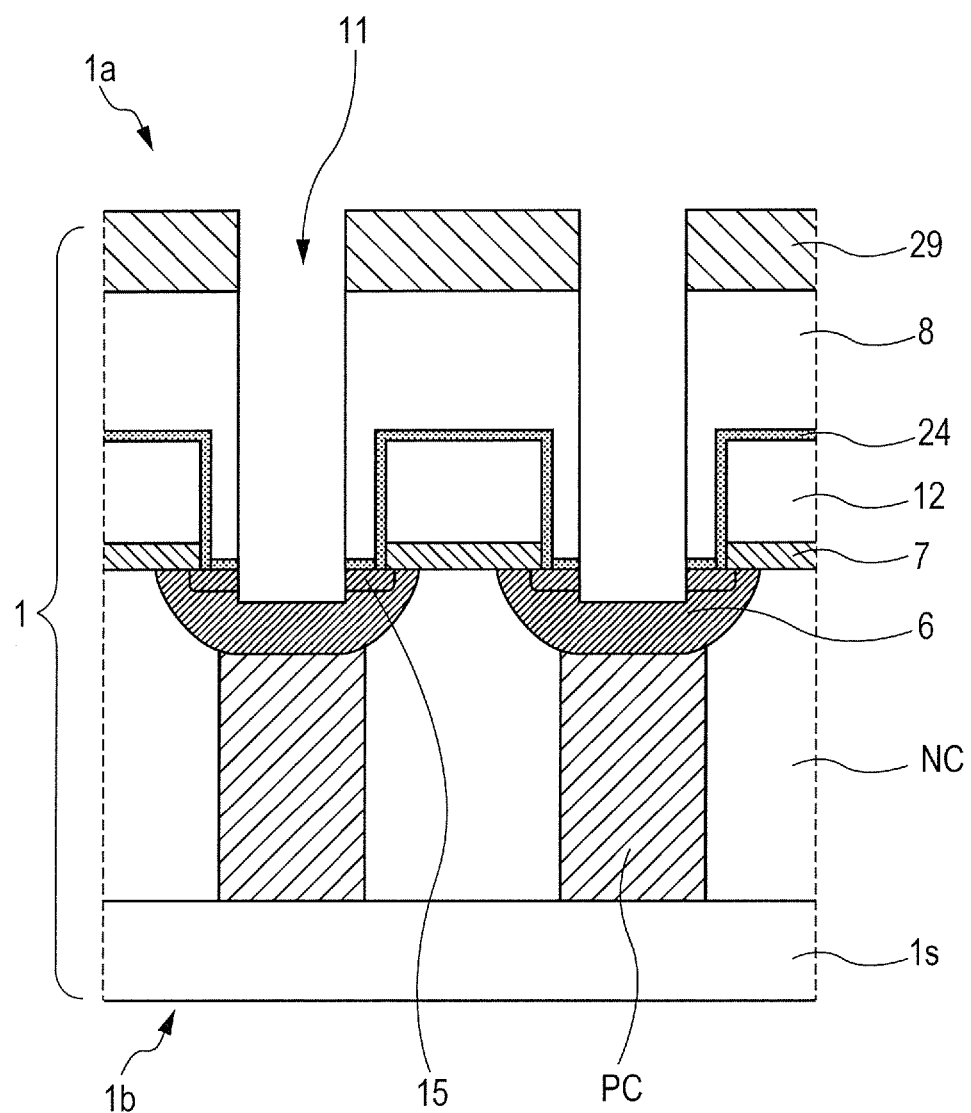
FIG. 14 is a device cross-sectional view (of the step of forming contact trenches) during the manufacturing step corresponding to the A-A' cross section of the partially cut-away region R2 of the cell portion of FIG. 2, which is for illustrating the manufacturing method (pre-channel process) of the semiconductor device of the embodiment of the present invention.
Figure 15:
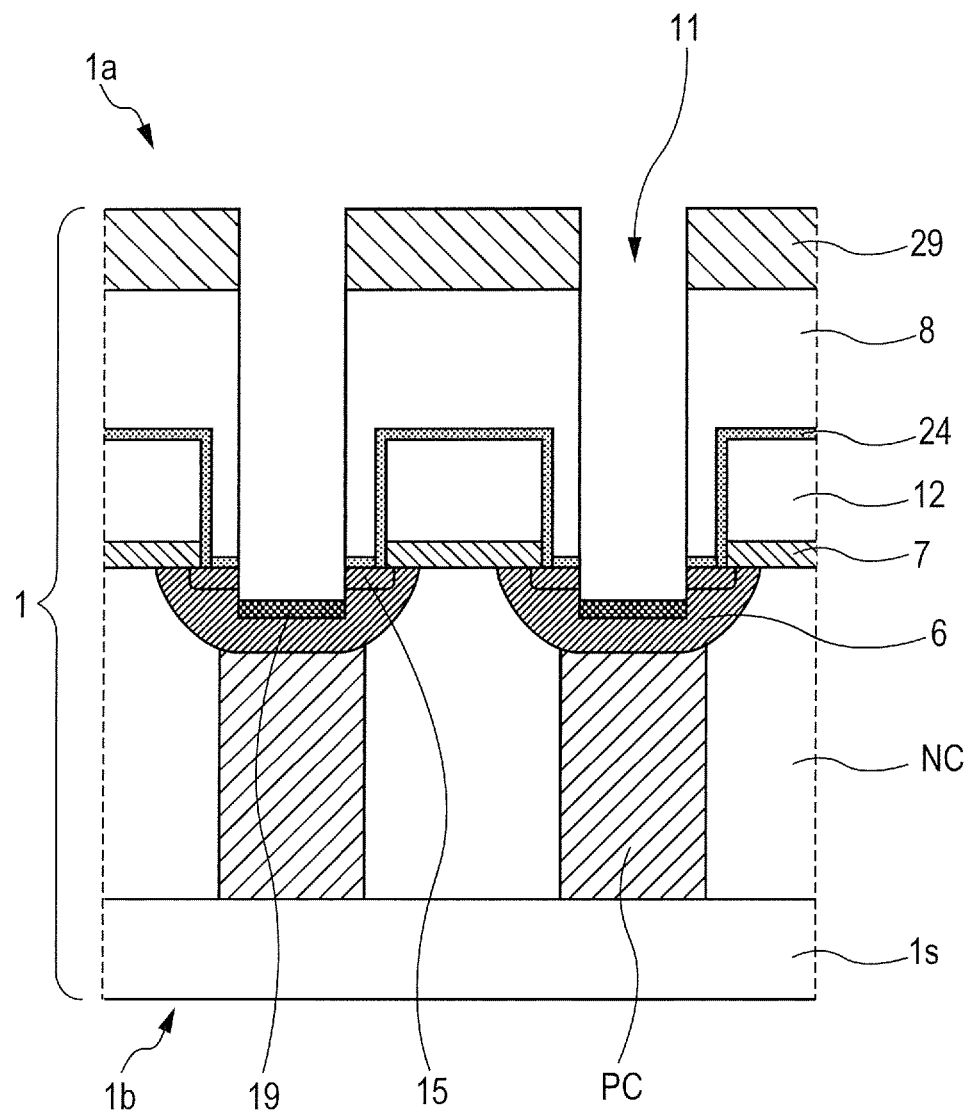
FIG. 15 is a device cross-sectional view (of the step of introducing $P^+$-type body contact regions) during the manufacturing step corresponding to the A-A' cross section of the partially cut-away region R2 of the cell portion of FIG. 2, which is for illustrating the manufacturing method (pre-channel process) of the semiconductor device of the embodiment of the present invention.
Figure 16:
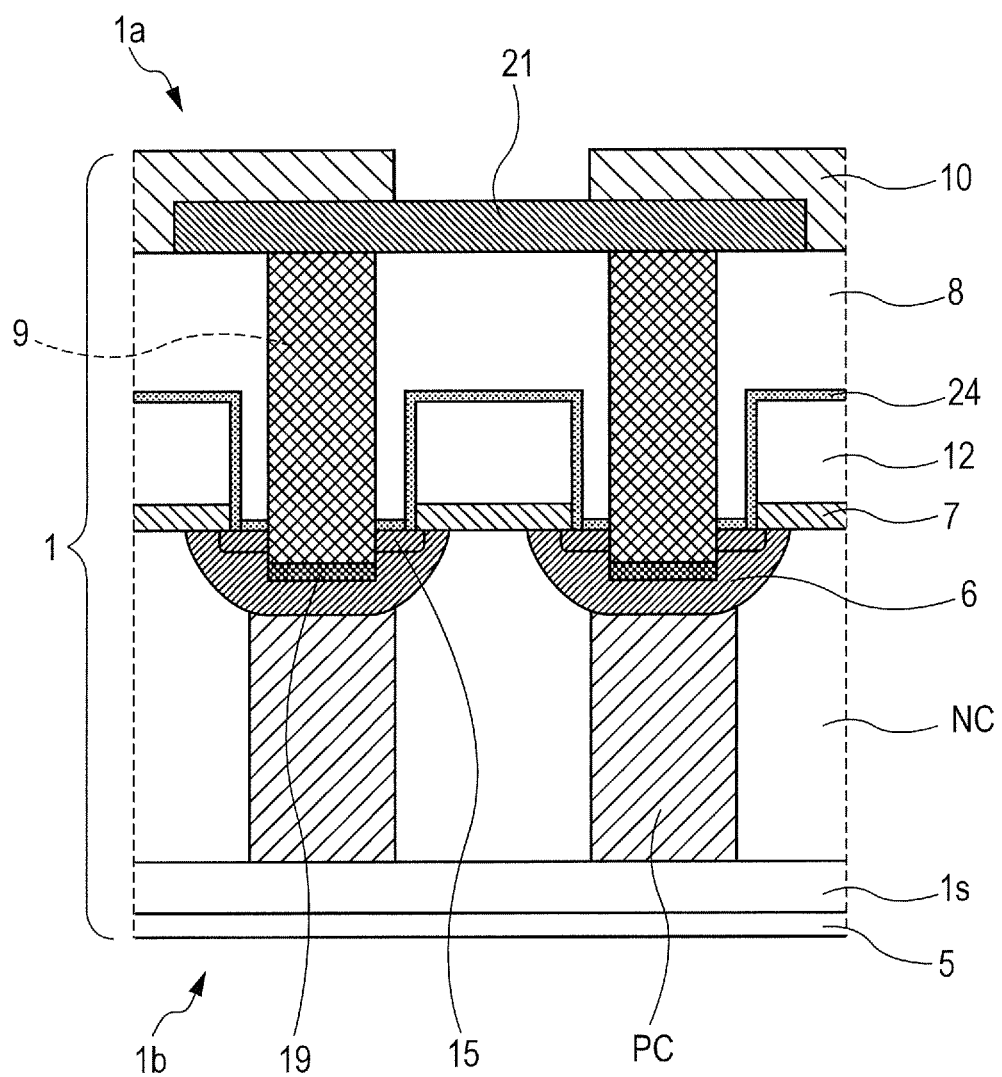
FIG. 16 is a device cross-sectional view (of the step of forming source metal electrodes, etc.) during the manufacturing step corresponding to the A-A' cross section of the partially cut-away region R2 of the cell portion of FIG. 2, which is for illustrating the manufacturing method (pre-channel process) of the semiconductor device of the embodiment of the present invention.

FIG. 4 is a device cross-sectional view (of the step of growing an $N^-$-type silicon epitaxial layer) during the manufacturing step corresponding to the A-A' cross section of the partially cut-away region R2 of the cell portion of FIG. 2, which is for illustrating the manufacturing method (pre-channel process) of the semiconductor device of the embodiment of the present invention. FIG. 5 is a device cross-sectional view (of the step of forming trenches to be filled with P-type columns) during the manufacturing step corresponding to the A-A' cross section of the partially cut-away region R2 of the cell portion of FIG. 2, which is for illustrating the manufacturing method (pre-channel process) of the semiconductor device of the embodiment of the present invention. FIG. 6 is a device cross-sectional view (of the step of Si epitaxial growth for embedding P-type columns) during the manufacturing step corresponding to the A-A' cross section of the partially cut-away region R2 of the cell portion of FIG. 2, which is for illustrating the manufacturing method (pre-channel process) of the semiconductor device of the embodiment of the present invention. FIG. 7 is a device cross-sectional view (of the step of planarization after embedding the P-type columns) during the manufacturing step corresponding to the A-A' cross section of the partially cut-away region R2 of the cell portion of FIG. 2, which is for illustrating the manufacturing method (pre-channel process) of the semiconductor device of the embodiment of the present invention. FIG. 8 is a device cross-sectional view (of the step of forming trenches to be filled with P-type body regions) during the manufacturing step corresponding to the A-A' cross section of the partially cut-away region R2 of the cell portion of FIG. 2, which is for illustrating the manufacturing method (pre-channel process) of the semiconductor device of the embodiment of the present invention. FIG. 9 is a device cross-sectional view (of the step of selective epitaxial growth of the P-type body regions) during the manufacturing step corresponding to the A-A' cross section of the partially cut-away region R2 of the cell portion of FIG. 2, which is for illustrating the manufacturing method (pre-channel process) of the semiconductor device of the embodiment of the present invention. FIG. 10 is a device cross-sectional view (of the step of planarization after selective epitaxial growth of P-type body regions) during the manufacturing step corresponding to the A-A' cross section of the partially cut-away region R2 of the cell portion of FIG. 2, which is for illustrating the manufacturing method (pre-channel process) of the semiconductor device of the embodiment of the present invention. FIG. 11 is a device cross-sectional view (of the step of forming gate electrodes) during the manufacturing step corresponding to the A-A' cross section of the partially cut-away region R2 of the cell portion of FIG. 2, which is for illustrating the manufacturing method (pre-channel process) of the semiconductor device of the embodiment of the present invention. FIG. 12 is a device cross-sectional view (of the step of introducing $N^+$-type source regions) during the manufacturing step corresponding to the A-A' cross section of the partially cut-away region R2 of the cell portion of FIG. 2, which is for illustrating the manufacturing method (pre-channel process) of the semiconductor device of the embodiment of the present invention. FIG. 13 is a device cross-sectional view (of the step of forming an interlayer insulating film) during the manufacturing step corresponding to the A-A' cross section of the partially cut-away region R2 of the cell portion of FIG. 2, which is for illustrating the manufacturing method (pre-channel process) of the semiconductor device of the embodiment of the present invention. FIG. 14 is a device cross-sectional view (of the step of forming contact trenches) during the manufacturing step corresponding to the A-A' cross section of the partially cut-away region R2 of the cell portion of FIG. 2, which is for illustrating the manufacturing method (pre-channel process) of the semiconductor device of the embodiment of the present invention. FIG. 15 is a device cross-sectional view (of the step of introducing $P^+$-type body contact regions) during the manufacturing step corresponding to the A-A' cross section of the partially cut-away region R2 of the cell portion of FIG. 2, which is for illustrating the manufacturing method (pre-channel process) of the semiconductor device of the embodiment of the present invention. FIG. 16 is a device cross-sectional view (of the step of forming source metal electrodes, etc.) during the manufacturing step corresponding to the A-A' cross section of the partially cut-away region R2 of the cell portion of FIG. 2, which is for illustrating the manufacturing method (pre-channel process) of the semiconductor device of the embodiment of the present invention. Based on these drawings, a description will be given to a wafer process in the manufacturing method (pre-channel process) of the semiconductor device of the embodiment of the present invention.

First, as shown in FIG. 4, a semiconductor wafer 1 is prepared in which, over the $N^+$-type single-crystal silicon substrate 1s (which is, e.g., a 200-φ wafer here, but the diameter of the wafer may also be any of 150φ, 300φ, and 450φ) doped with, e.g., antimony (at a concentration of the order of, e.g., $10^{18}$ to $10^{19}/cm^3$), an N-type epitaxial layer 1e (drift region at a concentration of the order of, e.g., about $10^{15}/cm^3$) doped with phosphorus and having a thickness of about 45 μm (on the assumption that a breakdown voltage is about 600 V) is formed. Note that the thickness of the $N^+$-type single-crystal silicon substrate is is, e.g., about 500 to 1000 μm.

Next, as shown in FIG. 5, over the device surface 1a (main surface opposite to the back surface 1b) of the semiconductor wafer 1, a hard mask 17 for forming trenches to be filled with P-type columns made of, e.g., p-TEOS (Plasma-Tetraethylorthosilicate) or the like is formed (note that the trenches may also be formed using a resist as a mask without using the hard mask).

Next, using the patterned hard mask 17 for forming trenches to be filled with P-type columns as a mask, the N-type epitaxial layer 1e and the like are dry-etched (as an etching gas, a $SF_6/O_2$-based or HBr/Cl-based gas can be shown by way of example) to form trenches 16 to be filled with P-type columns. Subsequently, the hard mask film 17 which is no longer needed is removed using, e.g., a fluoric-acid-based etchant for a silicon oxide film.

Next, as shown in FIG. 6, filling epitaxial growth is performed for the trenches 16 to be filled with P-type columns to form a P-type Si epitaxial layer 18 for embedded P-type columns (at a concentration of the order of, e.g., about $10^{15}/cm^3$). Examples of conditions for the filling epitaxial growth that can be shown include a barometric pressure of 5 kPa to 110 kPa in a deposition chamber, a deposition temperature of 900 to 1100° C., a silicon source gas of DCS, i.e., dichlorosilane, an etchant gas of hydrochloride, and a boron dopant source gas of diborane.

Note that, when the P-type column regions PCC doped with germanium or carbon are to be formed, either of the followings is added depending on which one of carbon and germanium is to be added to the foregoing. That is, a carbon dopant source gas of, e.g., MMS (Monomethylsilane) and a germanium dopant source gas of monogerman can be shown by way of example.

Next, as shown in FIG. 7, the P-type Si epitaxial layer 18 for embedded P-type columns outside the trenches 16 to be filled with P-type columns is removed by a planarization step, e.g., CMP (Chemical Mechanical Polishing), while the surface 1a of the semiconductor wafer 1 is planarized. Thus, the P-type column regions PC and the N-type column region NC are formed.

Note that, here, a super junction structure as shown in FIG. 7 may also be formed not only by the trench-fill method, but also by a multi-epitaxial method.

Next, as shown in FIG. 8, over the device surface 1a of the wafer 1, a hard mask 20 for processing for formation of trenches to be filled with P-type body regions, such as a TEOS-based silicon oxide film, is formed by, e.g., typical lithography. At this time, the widths of openings corresponding to trenches in the hard mask 20 for processing for formation of trenches to be filled with P-type body regions are, e.g., about 1 to 2 μm.

Next, using the hard mask 20 for processing for formation of trenches to be filled with P-type body regions, trenches 22 to be filled with P-type body regions (trenches to be filled with channel regions) are formed by, e.g., dry etching. As a preferred example of a dry etching method (first method, i.e., a full dry etching method) for the trenches to be filled with P-type body regions, a method including the following first and second steps can be shown by way of example. That is, in the first step (1), the semiconductor substrate is etched by, e.g., about 1 μm by anisotropic dry etching. Preferred examples of conditions for the etching treatment and the like which can be shown include the use of a high-density plasma etching apparatus such as an ICP (Inductively Coupled Plasma) etcher as an etching apparatus, a processing barometric pressure of, e.g., about 4 Pa, gas conditions, flow rates, and the like of, e.g., Ar, $SF_6$, and $O_2$ which are 200 sccm, 100 sccm, and 70 sccm, an ICP excitation power of, e.g., 150 W, a power applied to a stage of, e.g., 20 W, and the like. Note that the etching apparatus may also be an ECR (Electron Cyclotron Resonance) etcher (high-density plasma etching apparatus) or another form of dry etcher. However, in the case of using the high-density plasma etching apparatus, a high selectivity can be ensured. Subsequently, in the second step (2), the semiconductor substrate is further etched by, e.g., about 1 μm by isotropic dry etching. Preferred examples of conditions for the etching treatment and the like which can be shown include the use of a high-density plasma etching apparatus such as an ICP (Inductively Coupled Plasma) etcher as an etching apparatus, a processing barometric pressure of, e.g., about 10 Pa, gas conditions, flow rates, and the like of, e.g., Ar, $CF_4$, and $O_2$ which are 50 sccm, 100 sccm, and 50 sccm, an ICP excitation power of, e.g., 80 W, a power applied to a stage of, e.g., 10 W, and the like. Note that the etching apparatus may also be an ECR (Electron Cyclotron Resonance) etcher (high-density plasma etching apparatus) or another form of dry etcher. However, in the case of using the high-density plasma etching apparatus, a high selectivity can be ensured.

As a preferred example of a dry etching method (second method, i.e., a dry & wet etching method) for the trenches to be filled with P-type body regions, a method including the following first and second steps can be shown by way of example. That is, in the first step (1), the semiconductor substrate is etched by, e.g., about 1 μm by anisotropic dry etching. Preferred examples of conditions for the etching treatment and the like which can be shown include the use of a high-density plasma etching apparatus such as an ICP (Inductively Coupled Plasma) etcher as an etching apparatus, a processing barometric pressure of, e.g., about 4 Pa, gas conditions, flow rates, and the like of, e.g., Ar, $SF_6$, and which are 200 sccm, 100 sccm, and 70 sccm, an ICP excitation power of, e.g., 150 W, a power applied to a stage of, e.g., 20 W, and the like. Note that the etching apparatus may also be an ECR (Electron Cyclotron Resonance) etcher (high-density plasma etching apparatus) or another form of dry etcher. However, in the case of using the high-density plasma etching apparatus, a high selectivity can be ensured. Subsequently, in the second step (2), the semiconductor substrate is further etched by, e.g., about 1 μm by wet etching (isotropic etching). Preferred examples of an etchant which can be shown include an aqueous solution of a fluoric acid, a nitric acid, an acetic acid, or the like.

As a preferred example of a dry etching method (third method, i.e., a full wet etching method) for the trenches to be filled with P-type body regions, the following method can be shown by way of example. That is, the method is implemented by one step of anisotropic wet etching using an anisotropic wet etchant containing KOH or the like. In this case, each of the sidewalls exhibits a (111) plane having an angle of 54 degrees between itself and a horizontal plane (plane parallel with the main surface of the wafer).

Next, as shown in FIG. 9, the trenches 23 to be filled with P-type body regions are each filled with a boron-doped Si epitaxial layer by selective epitaxial growth. As preferred examples of conditions for the selective epitaxial growth, the following can be shown. That is, a processing temperature is, e.g., about 750 to 900° C. (or 750 to 850° C.), a processing barometric pressure is, e.g., about 1.3 kPa to 101 kPa, a deposition time is, e.g., 5 to 30 minutes, and gas conditions, flow rates, and the like of, e.g., $H_2$, DCS (Dichlorosilane), HCl, and $B_2H_6$ are about 10000 to 20000 sccm, 300 to 500 sccm, 300 to 800 sccm, and 100 to 500 sccm. Note that, when there is a portion in which Si:C layers are to be formed, the foregoing MMS (Monomethylsilane) is further added in the portion. The flow rate is adjusted within a range of, e.g., about 50 to 100 sccm such that the concentration of carbon is, e.g., about 0.05 at % to 0.1 at %. As a precursor for the selective epitaxial growth, not only the DCS, but also TCS (Trichlorosilane) can also be used. If consideration is given also to these precursors, a preferred range of a temperature for the foregoing selective epitaxial growth is about 600 to 900° C. (more preferably, about 650 to 850° C.). A preferred range of the processing barometric pressure can be adjusted to be about 660 Pa to an atmospheric pressure.

Next, as shown in FIG. 10, by a planarization step, e.g., CMP, the entire hard mask 20 for processing for formation of trenches to be filled with P-type body regions and a part of the P-type Si selective epitaxial layer 23 are removed. As a result, the P-type Si selective epitaxial layer 23 serves as the P-type body regions (channel regions) 6.

Next, as shown in FIG. 11, in the state shown in FIG. 10, the gate insulating film 7 is formed over substantially the entire device surface 1a (first main surface) of the wafer 1 by, e.g., thermal oxidation or the like. Then, over the gate insulating film 7 over substantially the entire device surface 1a of the wafer 1, a polysilicon film 12 is deposited as a gate electrode material or the like by, e.g., CVD (Chemical Vapor Deposition). Then, by patterning the polysilicon film 12 and the gate insulating film 7 by, e.g., typical lithography, the polysilicon film 12 is processed to form the gate electrodes 12. Then, over the device surface 1a of the wafer 1 and the surfaces (upper surfaces and side surfaces) of the gate electrodes 12, a surface oxide film 24 is deposited by, e.g., thermal oxidation, CVD, or the like.

Next, as shown in FIG. 12, over the device surface 1a of the wafer 1, a resist film 28 for introducing $N^+$-type source regions is formed by, e.g., typical lithography and, using the resist film 28 as a mask, a resist film 15 for introducing $N^+$-type source regions is introduced into the surface area of the semiconductor region by, e.g., ion implantation. Thereafter, the resist film 15 for introducing $N^+$-type source regions which is no longer needed is removed by, e.g., ashing or the like, and then activation anneal is performed.

Next, as shown in FIG. 13, over substantially the entire surface of the wafer 1 on the device surface 1a side, the interlayer insulating film 8 formed of a silicon-oxide-based insulating film or the like is deposited by, e.g., CVD.

Next, as shown in FIG. 14, over the interlayer insulating film 8, a resist film 29 for contact trench processing is formed by, e.g., typical lithography (note that a hard mask of a silicon oxide film, a silicon nitride film, or the like may also be used). Then, using the resist film for contact trench processing as a mask, the contact trenches 11 are opened by, e.g., anisotropic dry etching and extended as necessary in the semiconductor substrate.

Next, as shown in FIG. 15, into the surface area of the semiconductor substrate at the bottom of each of the contact trenches 11, the $P^+$-type body contact regions 19 are introduced by, e.g., ion implantation. Thereafter, the resist film 29 for contact trench processing is removed by, e.g., ashing or the like, and then activation anneal is performed.

Next, as shown in FIG. 16, over the interlayer insulating film 8 and substantially the entire inner surface of each of the contact trenches 11, a titanium film and a titanium nitride film which are relatively thin (thinner than a tungsten film described later) are successively deposited as a barrier metal film or the like by, e.g., sputtering deposition. Then, over the barrier metal film over substantially the entire device surface 1a of the wafer 1, the tungsten film is deposited by, e.g., CVD so as to fill the contact trenches 11. Then, by removing the barrier metal film and the tungsten film outside the contact holes 11 by an etch-back process or CMP (Chemical Mechanical Polishing), the contact trenches 11 are filled with the tungsten plugs 9. Then, over substantially the entire surface of the wafer 1 on the device surface 1a side, a barrier metal film (such as a titanium film, a titanium film/nitride film, a TiW film or the like) which is relatively thin (thinner than an aluminum-based metal film described later) is deposited by, e.g., sputtering deposition. Then, over substantially the entire surface of the barrier metal film, an aluminum-based metal film is deposited by, e.g., sputtering deposition. Then, by, e.g., typical lithography, a metal electrode film including the barrier metal film, the aluminum-based metal film, and the like is processed to form the source metal electrode 21 and the like. Then, over substantially the entire surface of the wafer 1 on the device surface 1a side, e.g., a photosensitive polyimide-based insulating film is deposited as the final passivation film 10 by, e.g., coating. Then, by processing the photosensitive polyimide-based insulating film by typical lithography, the final passivation film 10 is formed into a pattern (alternatively, the patterning may also be performed using a non-photosensitive polyimide-based insulating film). Note that, here, the opening of the final passivation film 10 corresponding to a source pad opening is shown schematically, but a real source pad opening is wider. Preferred examples of the final passivation film 10 include not only an organic single-layer film of a polyimide resin (polyimide-based resin), BCB (Benzocyclobutene), or the like, but also an organic/inorganic composite final passivation film including a plasma TEOS (Tetraethylorthosilicate)-based silicon oxide film or another silicon oxide film, a silicon nitride film, a polyimide-based resin film, and the like which are shown in ascending order, an inorganic final passivation film including a silicon oxide film, a silicon nitride film, and the like which are shown in ascending order, and the like. Then, the back surface 1b of the wafer 1 is subjected to back grinding treatment to reduce the thickness of the wafer (having an original thickness of about 500 to 1000 μm) to about 100 to 300 μm. Then, the back-surface metal electrode 5 is formed by sputtering deposition or the like. Examples of the configuration of the back-surface metal electrode 5 which can be shown include that of a film including a titanium film, a nickel film, a gold film, and the like which are shown in order of increasing distance from the silicon substrate 1s. Thereafter, by dicing, the wafer 1 is divided into individual chips to provide discrete devices 2 (semiconductor chips).

3. Description of Modification (Pre-Gate Process) of Wafer Process in Manufacturing Method of Semiconductor Device of Embodiment of Present Invention (See Mainly FIGS. 17 to 23)

In this section, a description will be given to another example based on a trench-fill method different from that of the manufacturing method described in Section 2. However, it will be appreciated that the manufacturing method based on the trench-fill method intended for the device structure described in Section 1 is not limited to the two examples, and can be variously modified.

The modification is related to FIGS. 8 to 12. Since the portions described using FIGS. 4 to 7 and 13 to 16 are basically unchanged, a description will be given below only to different portions in principle.

Figure 17:
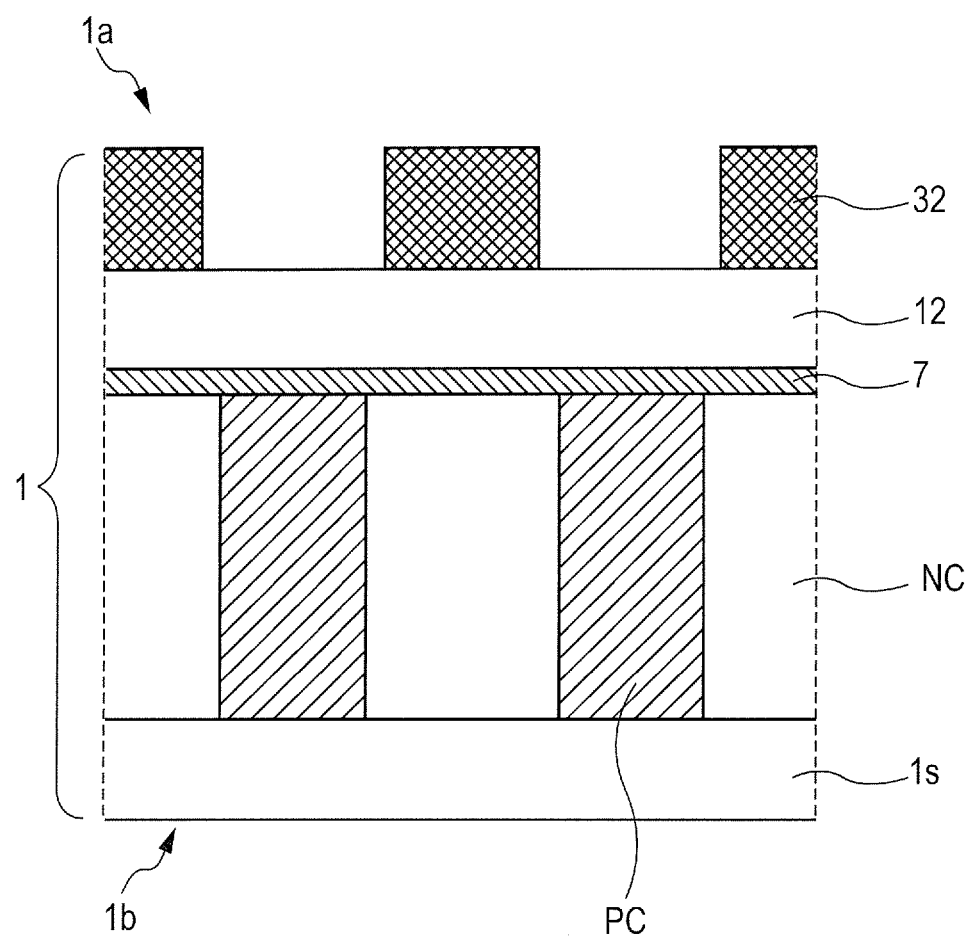
FIG. 17 is a device cross-sectional view (of the step of forming a gate insulating film, etc.) during the manufacturing step corresponding to the A-A' cross section of the partially cut-away region R2 of the cell portion of FIG. 2, which is for illustrating a modification (pre-gate process) of a wafer process in the manufacturing method of the semiconductor device of the embodiment of the present invention.
Figure 18:
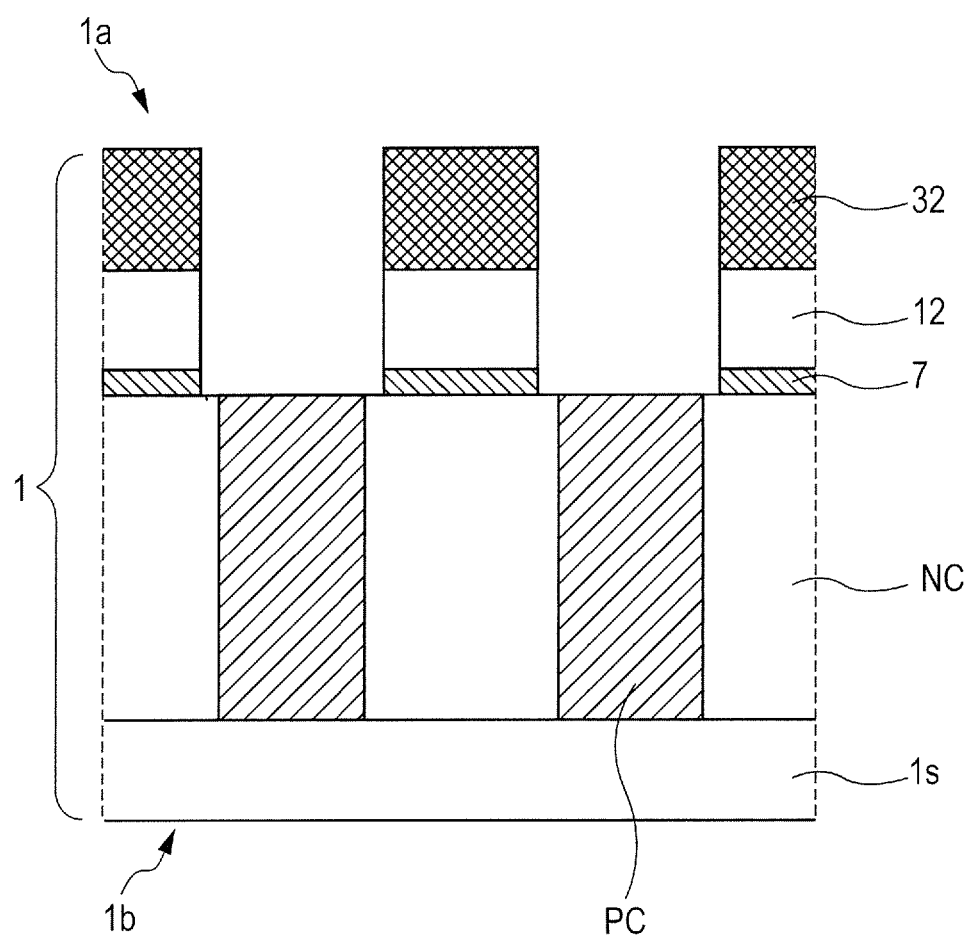
FIG. 18 is a device cross-sectional view (of the step of gate electrode processing) during the manufacturing step corresponding to the A-A' cross section of the partially cut-away region R2 of the cell portion of FIG. 2, which is for illustrating the modification (pre-gate process) of the wafer process in the manufacturing method of the semiconductor device of the embodiment of the present invention.
Figure 19:
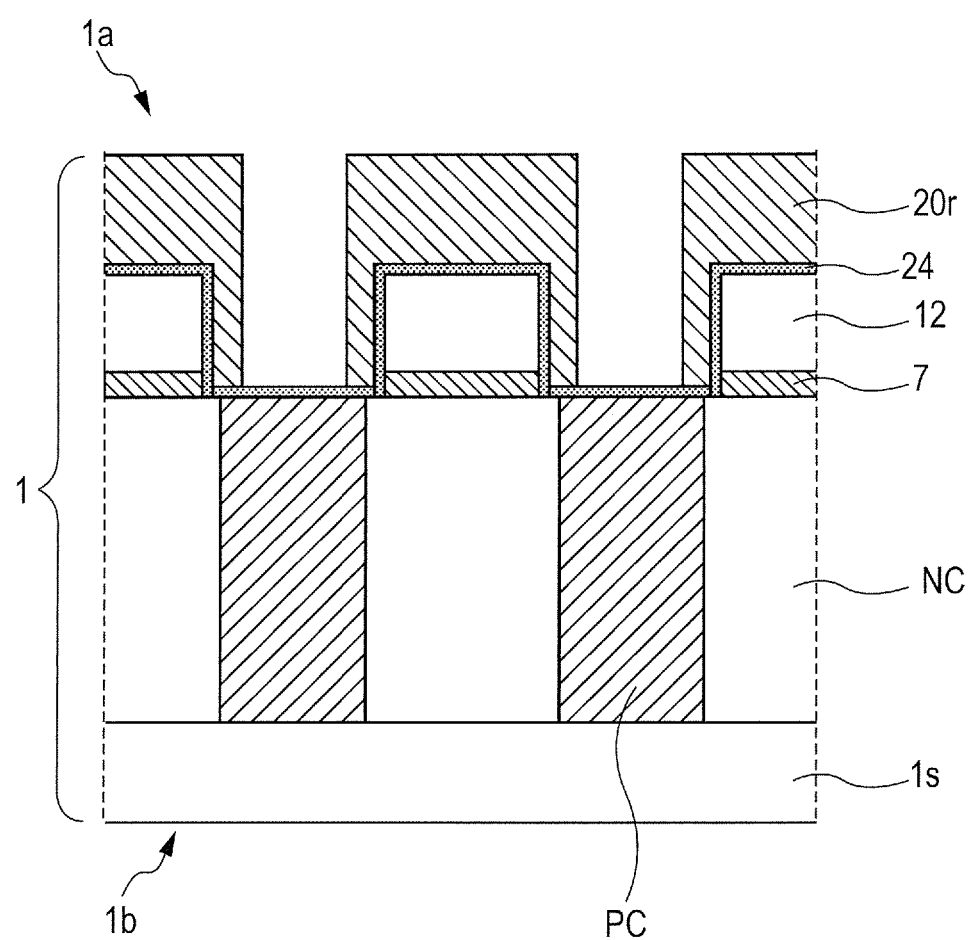
FIG. 19 is a device cross-sectional view (of the step of forming a surface oxide film, etc.) during the manufacturing step corresponding to the A-A' cross section of the partially cut-away region R2 of the cell portion of FIG. 2, which is for illustrating the modification (pre-gate process) of the wafer process in the manufacturing method of the semiconductor device of the embodiment of the present invention.
Figure 20:
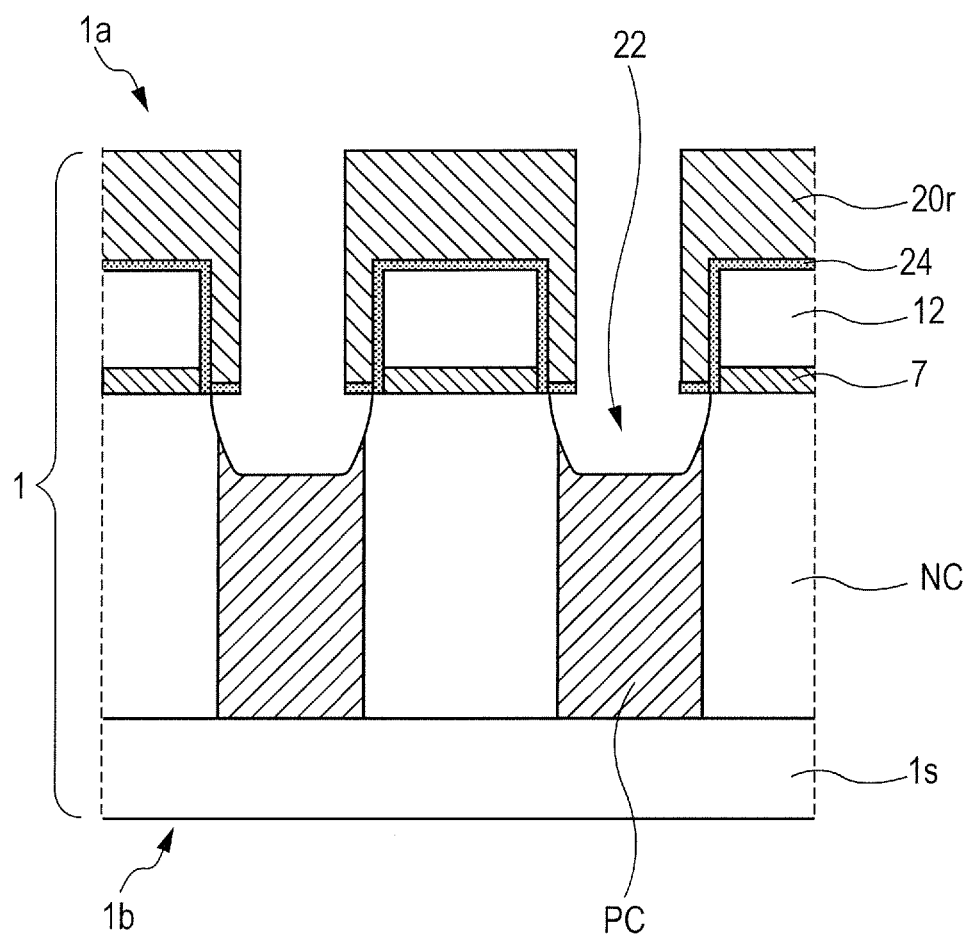
FIG. 20 is a device cross-sectional view (of the step of forming trenches to be filled with P-type body regions) during the manufacturing step corresponding to the A-A' cross section of the partially cut-away region R2 of the cell portion of FIG. 2, which is for illustrating the modification (pre-gate process) of the wafer process in the manufacturing method of the semiconductor device of the embodiment of the present invention.
Figure 21:
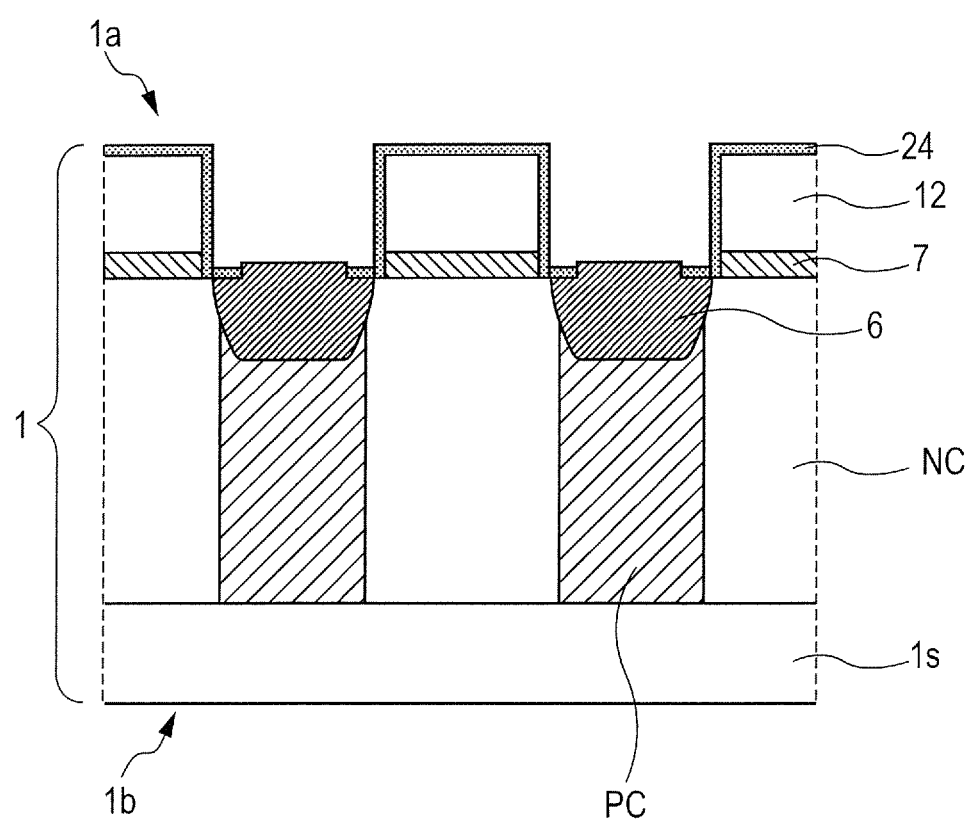
FIG. 21 is a device cross-sectional view (of the step of selective epitaxial growth of P-type body regions) during the manufacturing step corresponding to the A-A' cross section of the partially cut-away region R2 of the cell portion of FIG. 2, which is for illustrating the modification (pre-gate process) of the wafer process in the manufacturing method of the semiconductor device of the embodiment of the present invention.
Figure 22:
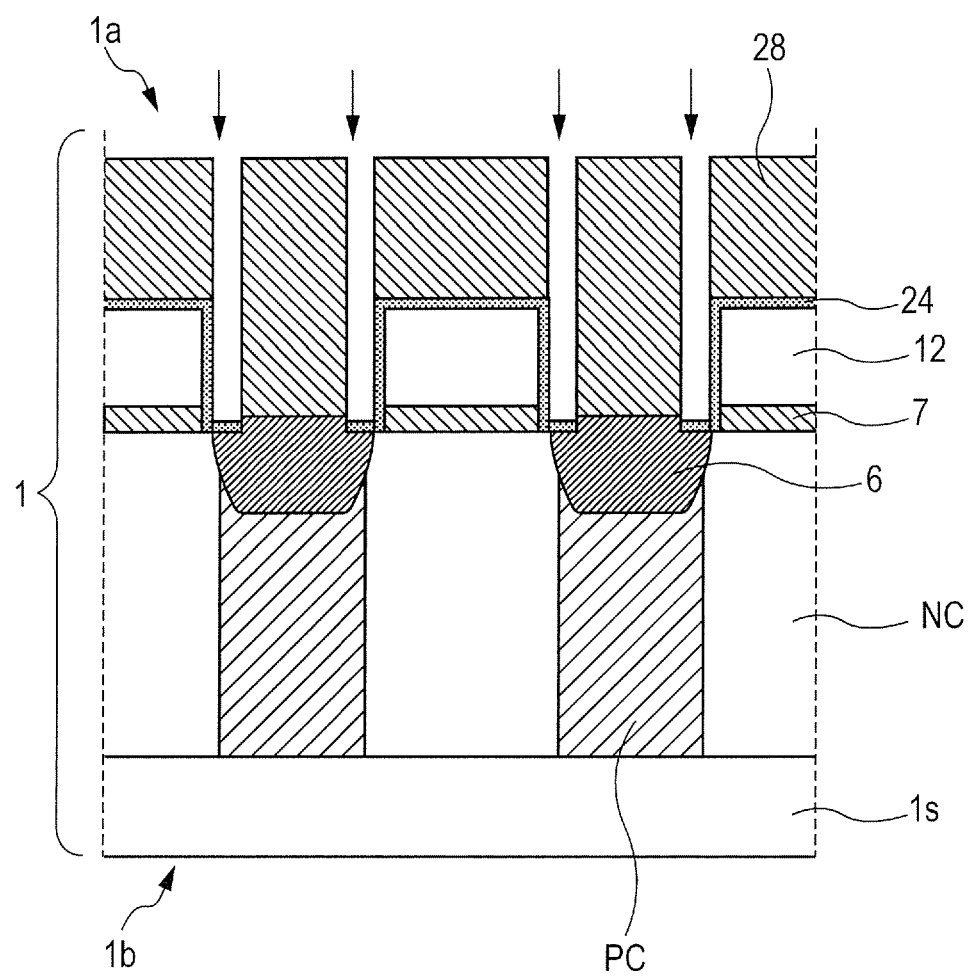
FIG. 22 is a device cross-sectional view (of the step of introducing $N^+$-type source regions) during the manufacturing step corresponding to the A-A' cross section of the partially cut-away region R2 of the cell portion of FIG. 2, which is for illustrating the modification (pre-gate process) of the wafer process in the manufacturing method of the semiconductor device of the embodiment of the present invention.
Figure 23:
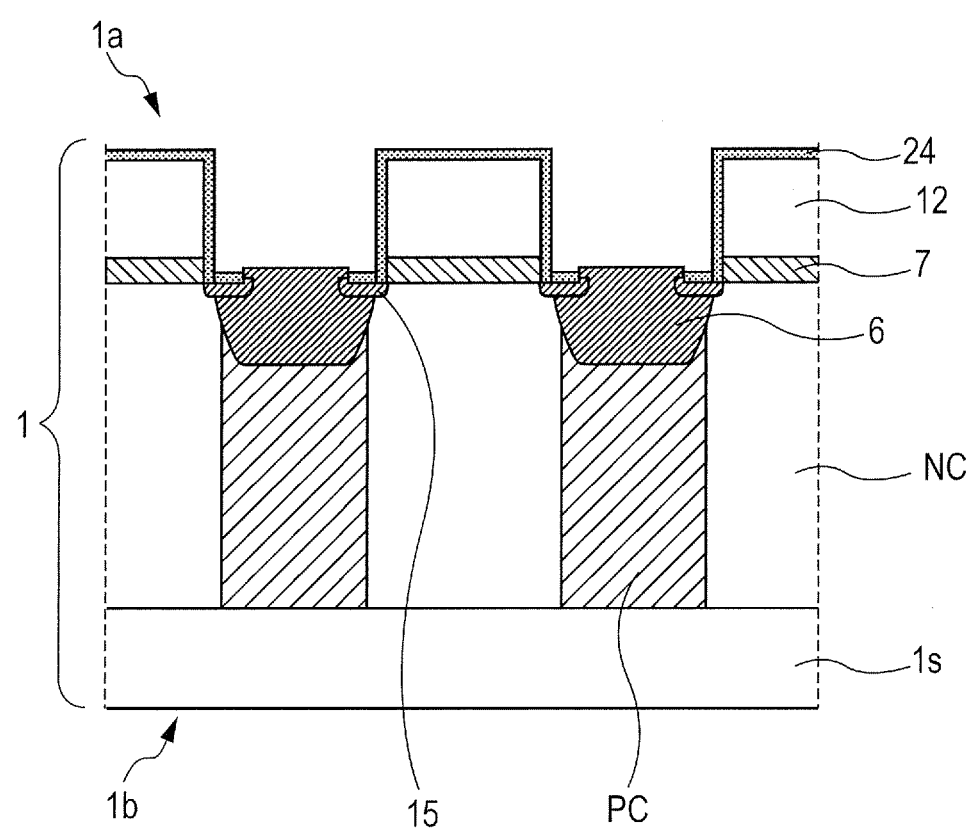
FIG. 23 is a device cross-sectional view (of the step of removing a resist film for introducing $N^+$-type source regions) during the manufacturing step corresponding to the A-A' cross section of the partially cut-away region R2 of the cell portion of FIG. 2, which is for illustrating the modification (pre-gate process) of the wafer process in the manufacturing method of the semiconductor device of the embodiment of the present invention.

FIG. 17 is a device cross-sectional view (of the step of forming a gate insulating film, etc.) during the manufacturing step corresponding to the A-A' cross section of the partially cut-away region R2 of the cell portion of FIG. 2, which is for illustrating a modification (pre-gate process) of a wafer process in the manufacturing method of the semiconductor device of the embodiment of the present invention. FIG. 18 is a device cross-sectional view (of the step of gate electrode processing) during the manufacturing step corresponding to the A-A' cross section of the partially cut-away region R2 of the cell portion of FIG. 2, which is for illustrating the modification (pre-gate process) of the wafer process in the manufacturing method of the semiconductor device of the embodiment of the present invention. FIG. 19 is a device cross-sectional view (of the step of forming a surface oxide film, etc.) during the manufacturing step corresponding to the A-A' cross section of the partially cut-away region R2 of the cell portion of FIG. 2, which is for illustrating the modification (pre-gate process) of the wafer process in the manufacturing method of the semiconductor device of, the embodiment of the present invention. FIG. 20 is a device cross-sectional view (of the step of forming trenches to be filled with P-type body regions) during the manufacturing step corresponding to the A-A' cross section of the partially cut-away region R2 of the cell portion of FIG. 2, which is for illustrating the modification (pre-gate process) of the wafer process in the manufacturing method of the semiconductor device of the embodiment of the present invention. FIG. 21 is a device cross-sectional view (of the step of selective epitaxial growth of P-type body regions) during the manufacturing step corresponding to the A-A' cross section of the partially cut-away region R2 of the cell portion of FIG. 2, which is for illustrating the modification (pre-gate process) of the wafer process in the manufacturing method of the semiconductor device of the embodiment of the present invention. FIG. 22 is a device cross-sectional view (of the step of introducing $N^+$-type source regions) during the manufacturing step corresponding to the A-A' cross section of the partially cut-away region R2 of the cell portion of FIG. 2, which is for illustrating the modification (pre-gate process) of the wafer process in the manufacturing method of the semiconductor device of the embodiment of the present invention. FIG. 23 is a device cross-sectional view (of the step of removing a resist film for introducing $N^+$-type source regions) during the manufacturing step corresponding to the A-A' cross section of the partially cut-away region R2 of the cell portion of FIG. 2, which is for illustrating the modification (pre-gate process) of the wafer process in the manufacturing method of the semiconductor device of the embodiment of the present invention. Based on these drawings, a description will be given to the modification (pre-gate process) of the wafer process in the manufacturing method of the semiconductor device of the embodiment of the present invention.

Next, as shown in FIG. 17, in the state shown in FIG. 7, the gate insulating film 7 is formed over substantially the entire device surface 1a (first main surface) of the wafer 1 by, e.g., thermal oxidation or the like. Then, over the gate insulating film 7 over substantially the entire device surface 1a of the wafer 1, the polysilicon film 12 is deposited as a gate electrode material or the like by, e.g., CVD (Chemical Vapor Deposition). Then, by patterning the polysilicon film 12 and the gate insulating film 7 by, e.g., typical lithography, the polysilicon film 12 is processed to form the gate electrodes 12. Then, by typical lithography, over the polysilicon film 12, a resist film 32 for gate electrode processing is formed.

Next, as shown in FIG. 18, the polysilicon film 12 and the gate insulating film 7 are processed by, e.g., anisotropic dry etching to form the gate electrodes 12. Thereafter, the resist film 32 for gate electrode processing which is no longer needed is removed by, e.g., ashing or the like.

Next, as shown in FIG. 19, over the device surface 1a of the wafer 1 and the surfaces (upper surfaces and side surfaces) of the gate electrodes 12, the surface oxide film 24 is deposited by, e.g., thermal oxidation, CVD, or the like. Then, by, e.g., typical lithography, on the device surface 1a side of the wafer 1, a resist film 20r for processing for formation of trenches to be filled with P-type body regions is formed.

Next, as shown in FIG. 20, over the device surface 1a of the wafer 1, the hard mask 20 for processing for formation of trenches to be filled with P-type body regions, such as, e.g., a TEOS-based silicon oxide film, is formed by, e.g., typical lithography. At this time, the widths of openings corresponding to trenches in the hard mask 20 for processing for formation of trenches to be filled with P-type body regions are, e.g., about 1 to 2 μm.

Next, using the hard mask 20 for processing for formation of trenches to be filled with P-type body regions, the trenches 22 to be filled with P-type body regions (trenches to be filled with channel regions) are formed by, e.g., dry etching. As a preferred example of a dry etching method (first method, i.e., a full dry etching method) for the trenches to be filled with P-type body regions, a method including the following first and second steps can be shown by way of example. That is, in the first step (1), the semiconductor substrate is etched by, e.g., about 1 μm by anisotropic dry etching. Preferred examples of conditions for the etching treatment and the like which can be shown include the use of a high-density plasma etching apparatus such as an ICP (Inductively Coupled Plasma) etcher as an etching apparatus, a processing barometric pressure of, e.g., about 4 Pa, gas conditions, flow rates, and the like of, e.g., Ar, $SF_6$, and $O_2$ which are 200 sccm, 100 sccm, and 70 sccm, an ICP excitation power of, e.g., 150 W, a power applied to a stage of, e.g., 20 W, and the like. Note that the etching apparatus may also be an ECR (Electron Cyclotron Resonance) etcher (high-density plasma etching apparatus) or another form of dry etcher. However, in the case of using the high-density plasma etching apparatus, a high selectivity can be ensured. Subsequently, in the second step (2), the semiconductor substrate is further etched by, e.g., about 1 μm by isotropic dry etching. Preferred examples of conditions for the etching treatment and the like which can be shown include the use of a high-density plasma etching apparatus such as an ICP (Inductively Coupled Plasma) etcher as an etching apparatus, a processing barometric pressure of, e.g., about 10 Pa, gas conditions, flow rates, and the like of, e.g., Ar, $CF_4$, and $O_2$ which are 50 sccm, 100 sccm, and 50 sccm, an ICP excitation power of, e.g., 80 W, a power applied to a stage of, e.g., 10 W, and the like. Note that the etching apparatus may also be an ECR (Electron Cyclotron Resonance) etcher (high-density plasma etching apparatus) or another form of dry etcher. However, in the case of using the high-density plasma etching apparatus, a high selectivity can be ensured.

As a preferred example of a dry etching method (second method, i.e., a dry & wet etching method) for the trenches to be filled with P-type body regions, a method including the following first and second steps can be shown by way of example. That is, in the first step (1), the semiconductor substrate is etched by, e.g., about 1 μm by anisotropic dry etching. Preferred examples of conditions for the etching treatment and the like which can be shown include the use of a high-density plasma etching apparatus such as an ICP (Inductively Coupled Plasma) etcher as an etching apparatus, a processing barometric pressure of, e.g., about 4 Pa, gas conditions, flow rates, and the like of, e.g., Ar, $SF_6$, and which are 200 sccm, 100 sccm, and 70 sccm, an ICP excitation power of, e.g., 150 W, a power applied to a stage of, e.g., 20 W, and the like. Note that the etching apparatus may also be an ECR (Electron Cyclotron Resonance) etcher (high-density plasma etching apparatus) or another form of dry etcher. However, in the case of using the high-density plasma etching apparatus, a high selectivity can be ensured. Subsequently, in the second step (2), the semiconductor substrate is further etched by, e.g., about 1 μm by wet etching (isotropic etching). Preferred examples of an etchant which can be shown include an aqueous solution of a fluoric acid, a nitric acid, an acetic acid, or the like.

As a preferred example of a dry etching method (third method, i.e., a full wet etching method) for the trenches to be filled with P-type body regions, the following method can be shown by way of example. That is, the method is implemented by one step of anisotropic wet etching using an anisotropic wet etchant containing KOH or the like. In this case, each of the sidewalls exhibits a (111) plane having an angle of 54 degrees between itself and a horizontal plane (plane parallel with the main surface of the wafer).

Next, as shown in FIG. 21, the trenches 23 to be filled with P-type body regions are each filled with a boron-doped Si epitaxial layer by selective epitaxial growth. As preferred examples of conditions for the selective epitaxial growth, the following can be shown. That is, a processing temperature is, e.g., about 750 to 900° C. (or 750 to 850° C.), a processing barometric pressure of, e.g., about 1.3 kPa to 101 kPa, a deposition time of, e.g., 5 to 30 minutes, and gas conditions, flow rates, and the like of, e.g., $H_2$, DCS (Dichlorosilane), HCl, and $B_2H_6$ are about 10000 to 20000 sccm, 300 to 500 sccm, 300 to 800 sccm, and 100 to 500 sccm. Note that, when there is a portion in which Si:C layers are to be formed, the foregoing MMS (Monomethylsilane) is further added in the portion. The flow rate is adjusted within a range of, e.g., about 50 to 100 sccm such that the concentration of carbon is, e.g., about 0.05 at % to 0.1 at %.

Next, as shown in FIG. 22, over the device surface 1a of the wafer 1, the resist film 28 for introducing $N^+$-type source regions is formed by, e.g., typical lithography and, using the resist film 28 as a mask, the resist film 15 for introducing $N^+$-type source regions are introduced into the surface area of the semiconductor region by, e.g., ion implantation. Thereafter, the resist film 15 for introducing $N^+$-type source regions which is no longer needed is removed by, e.g., ashing or the like, and activation anneal is performed, as shown in FIG. 23.

Thereafter, the process moves to the step shown in FIG. 13, and the processings shown in FIGS. 13 to 16 are performed.

4. Description of Modification (Multi-Epitaxial Method) of Wafer Process in Manufacturing Method (Pre-Channel Process) of Semiconductor Device of Embodiment of Present Invention (See Mainly FIGS. 24 to 36)

In this section, a description will be given to an example of the manufacturing method based on the multi-epitaxial method, which is intended for the device structure described in Section 1. However, the manufacturing method based on the multi-epitaxial method intended for the device structure described in Section 1 is not limited to the two examples, and can be variously modified.

The example is related to a modification of a process related to FIGS. 4 to 7 of Section 2 and otherwise basically the same. A description will be given primarily to a case where the multi-epitaxial method is applied to the pre-channel process (Section 2), but it will be appreciated that the multi-epitaxial method is also similarly applicable to the pre-gate process (Section 3).

Figure 24:
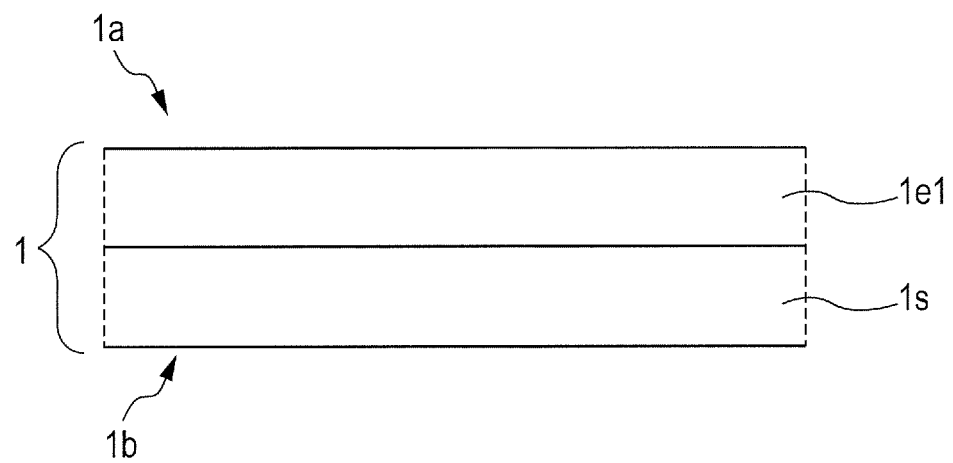
FIG. 24 is a device cross-sectional view (of the step of growing a first-level $N^-$-type silicon epitaxial layer) during the manufacturing step corresponding to the A-A' cross section of the partially cut-away region R2 of the cell portion of FIG. 2, which is for illustrating a modification (multi-epitaxial method) of a wafer process in the manufacturing method (pre-channel process) of the semiconductor device of the embodiment of the present invention.
Figure 25:
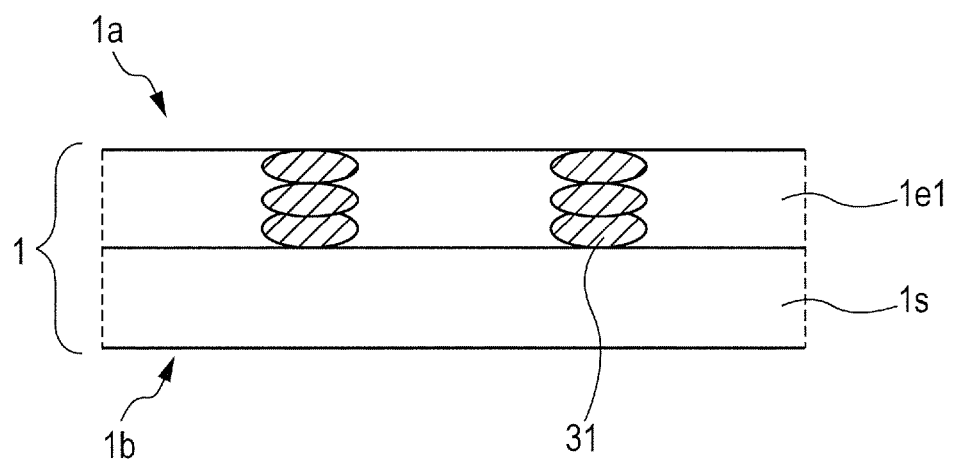
FIG. 25 is a device cross-sectional view (of the step of multi-stage implantation of boron ions into the first-level $N^-$-type silicon epitaxial layer) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention.

FIG. 24 is a device cross-sectional view (of the step of growing a first-level $N^-$-type silicon epitaxial layer) during the manufacturing step corresponding to the A-A' cross section of the partially cut-away region R2 of the cell portion of FIG. 2, which is for illustrating a modification (multi-epitaxial method) of a wafer process in the manufacturing method (pre-channel process) of the semiconductor device of the embodiment of the present invention. FIG. 25 is a device cross-sectional view (of the step of multi-stage implantation of boron ions into the first-level $N^-$-type silicon epitaxial layer) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention.

Figure 26:
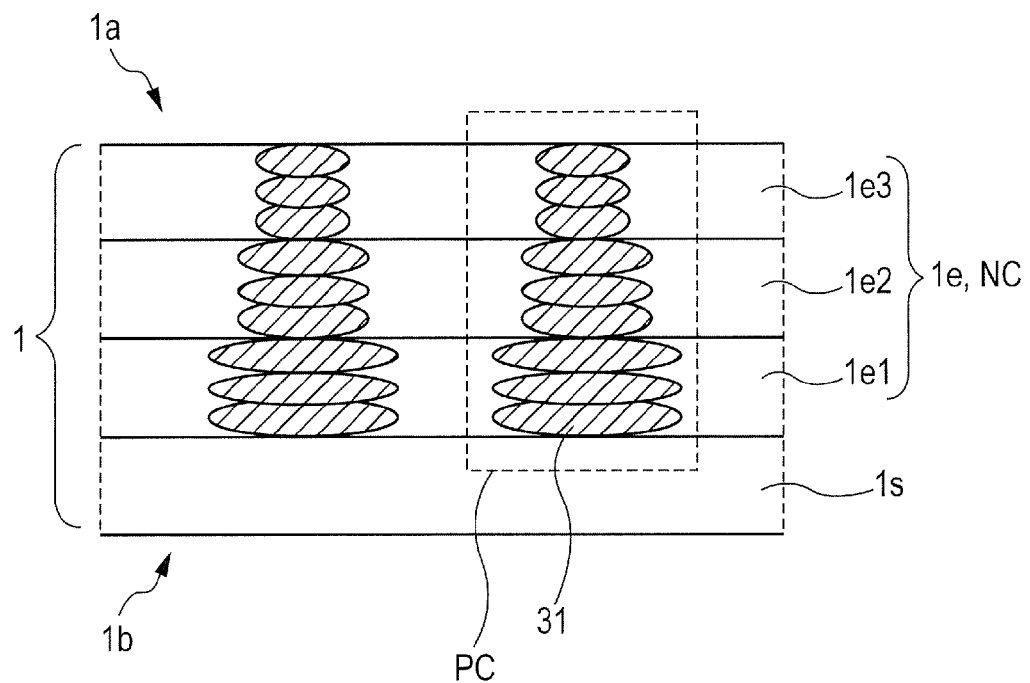
FIG. 26 is a device cross-sectional view (of the step of multi-stage implantation of boron ions into a second-level $N^-$-type silicon epitaxial layer, etc.) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention.
Figure 27:
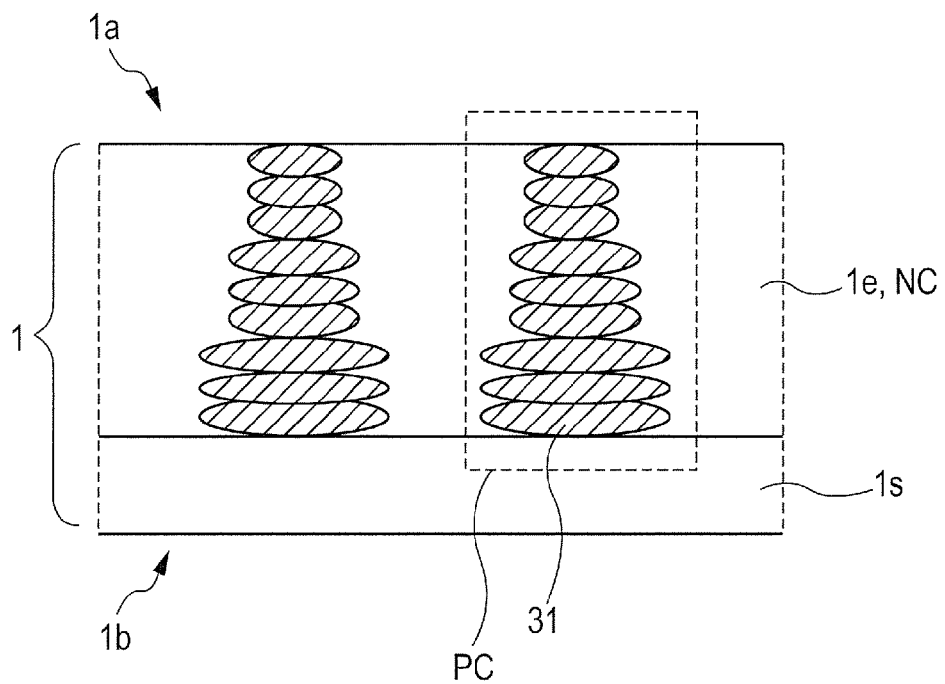
FIG. 27 is a device cross-sectional view (of the step of activation anneal after multi-stage implantation of boron ions into a third-level N⁻-type silicon epitaxial layer, etc.) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention.
Figure 28:
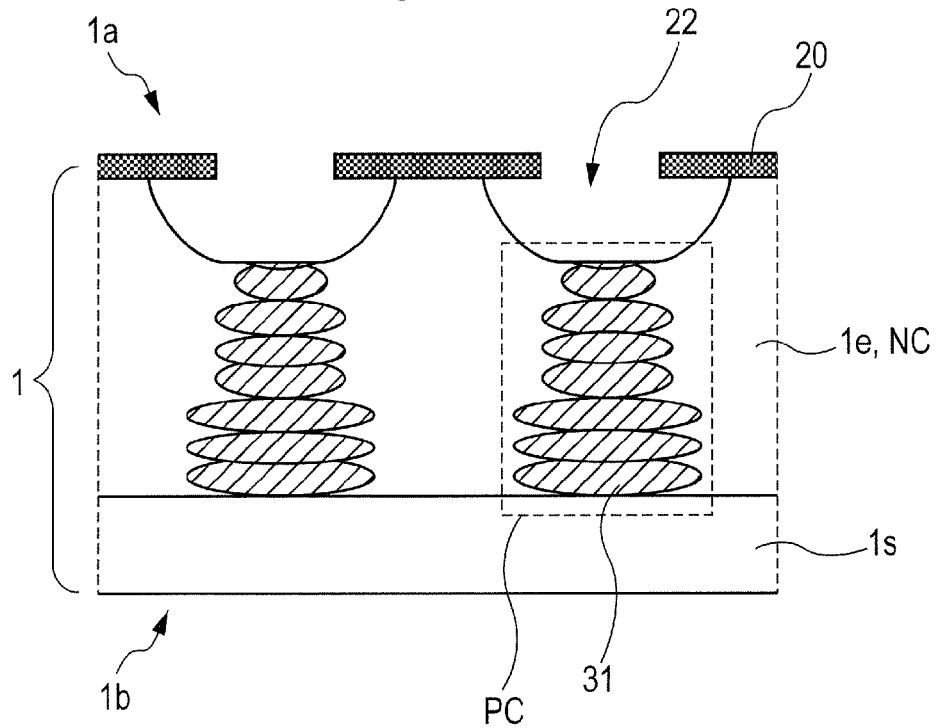
FIG. 28 is a device cross-sectional view (of the step of forming trenches to be filled with P-type body regions) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention.
Figure 29:
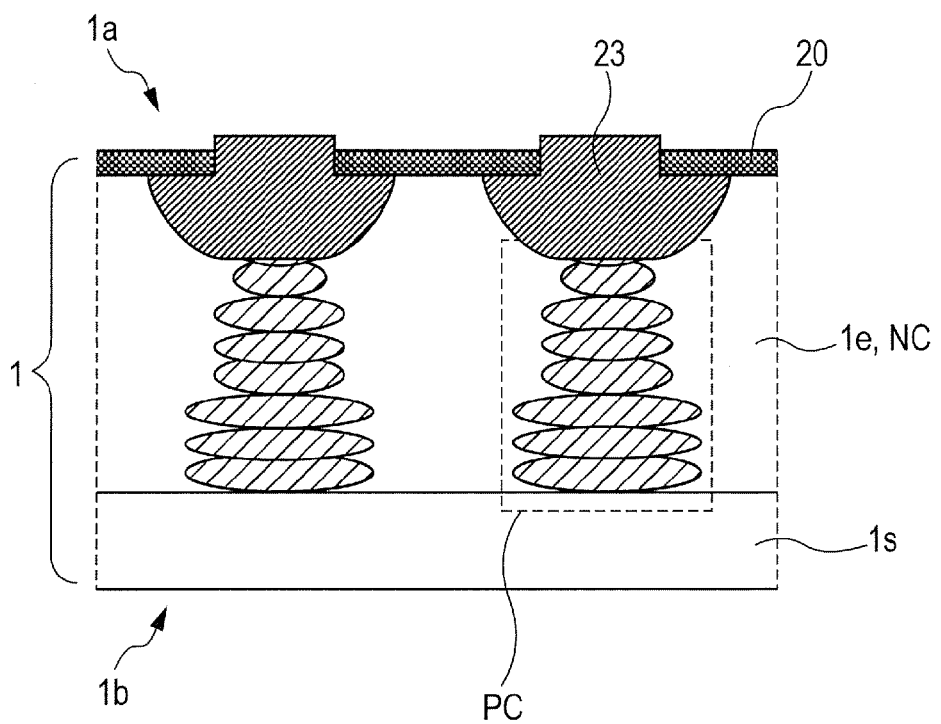
FIG. 29 is a device cross-sectional view (of the step of selective epitaxial growth of the P-type body regions) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention.
Figure 30:
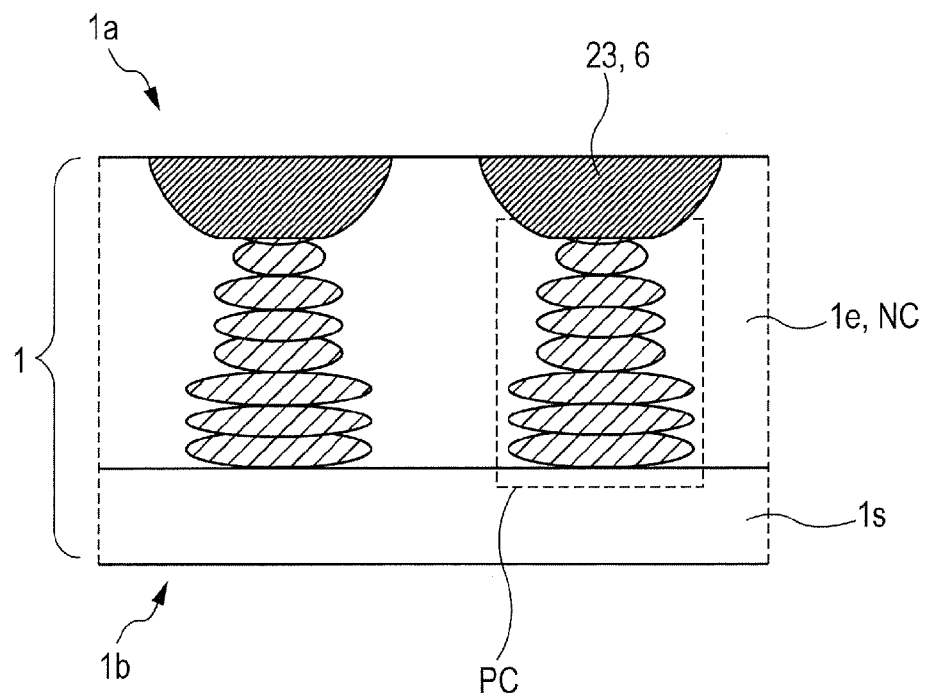
FIG. 30 is a device cross-sectional view (of the step of planarization after the selective epitaxial growth of P-type body regions) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention.
Figure 31:
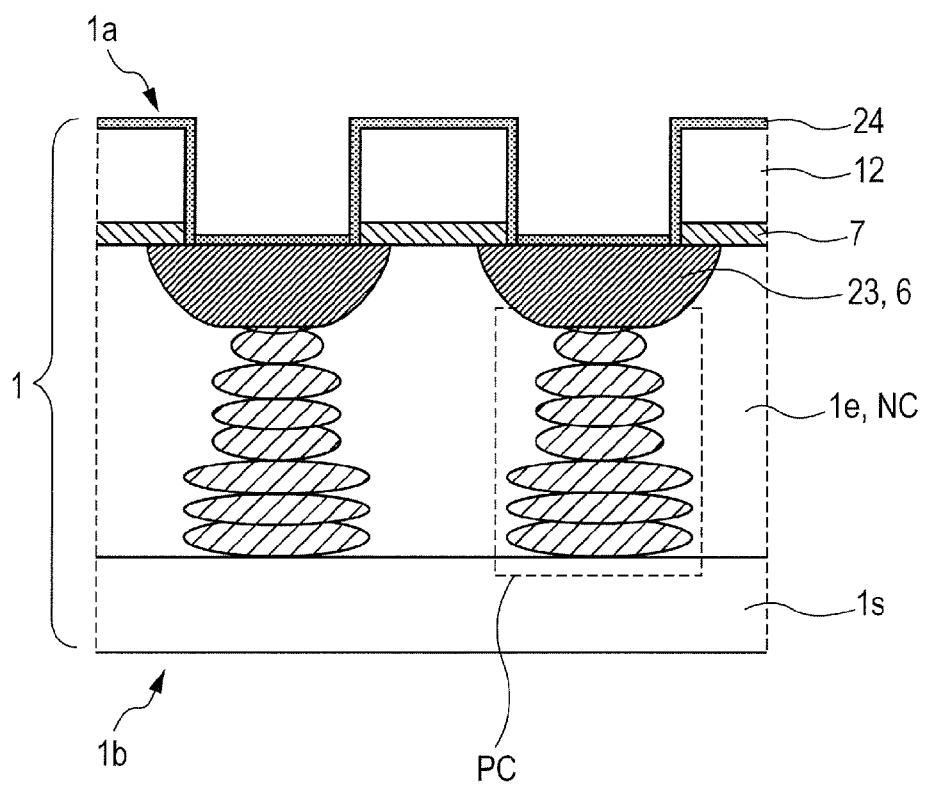
FIG. 31 is a device cross-sectional view (of the step of forming gate electrodes) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention.
Figure 32:
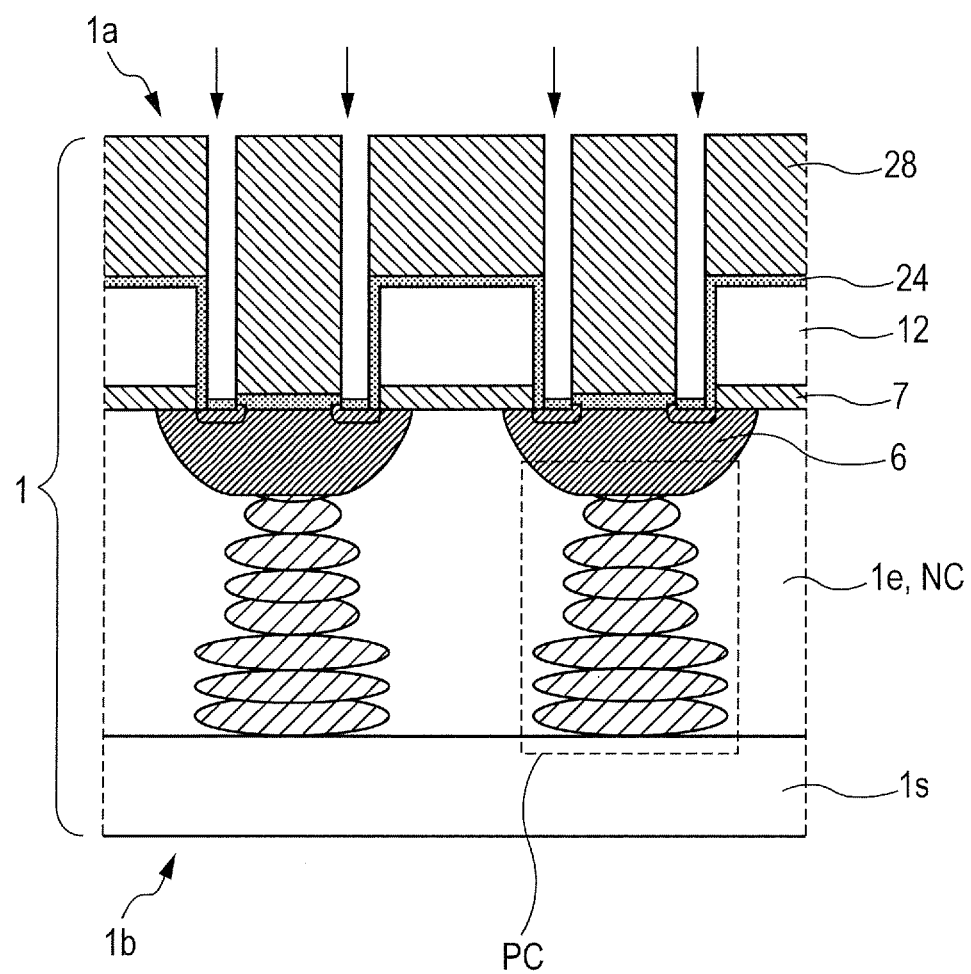
FIG. 32 is a device cross-sectional view (of the step of introducing N⁺-type source regions) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention.
Figure 33:
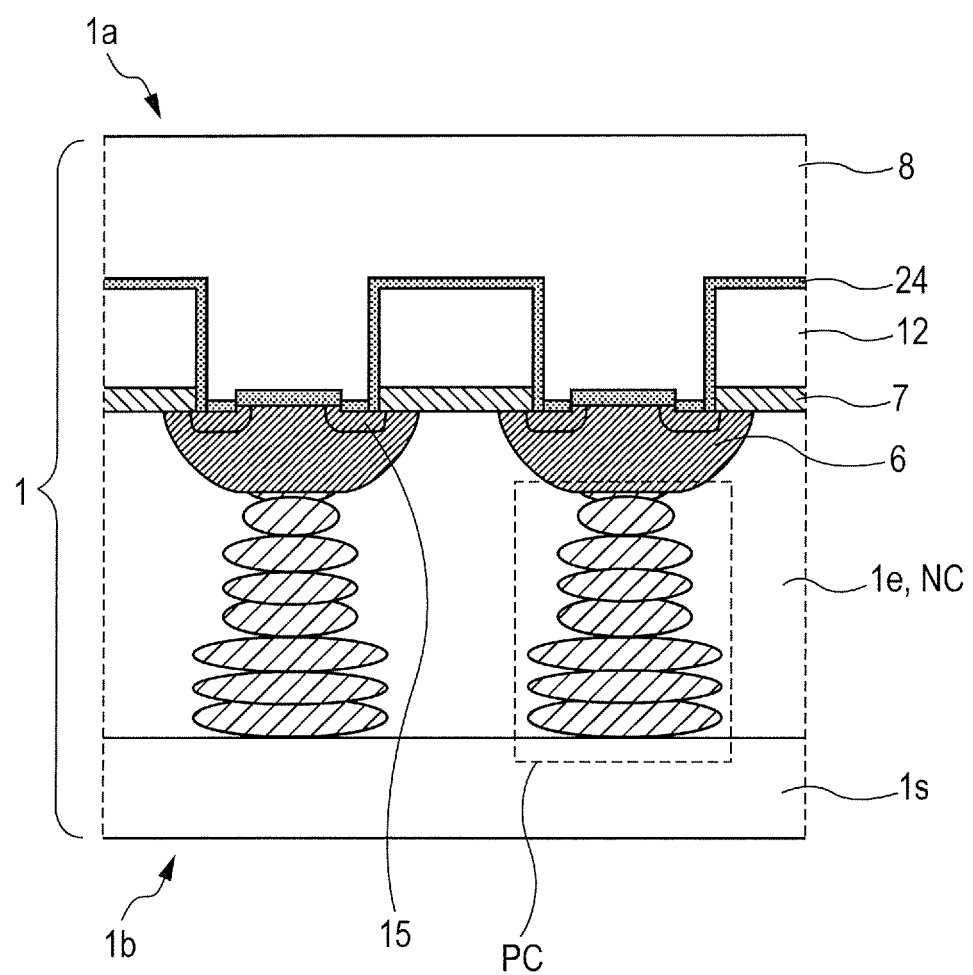
FIG. 33 is a device cross-sectional view (of the step of forming an interlayer insulating film) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention.
Figure 34:
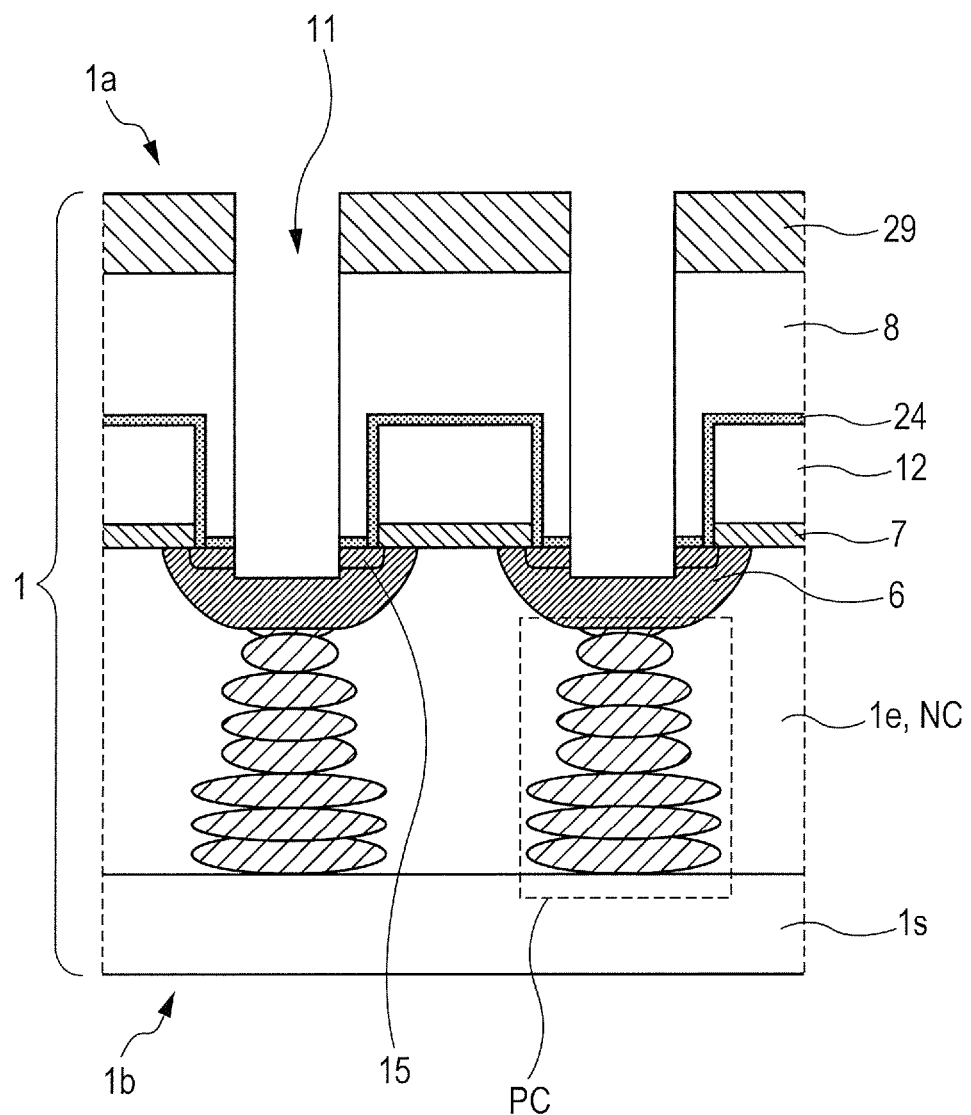
FIG. 34 is a device cross-sectional view (of the step of forming contact trenches) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention.
Figure 35:
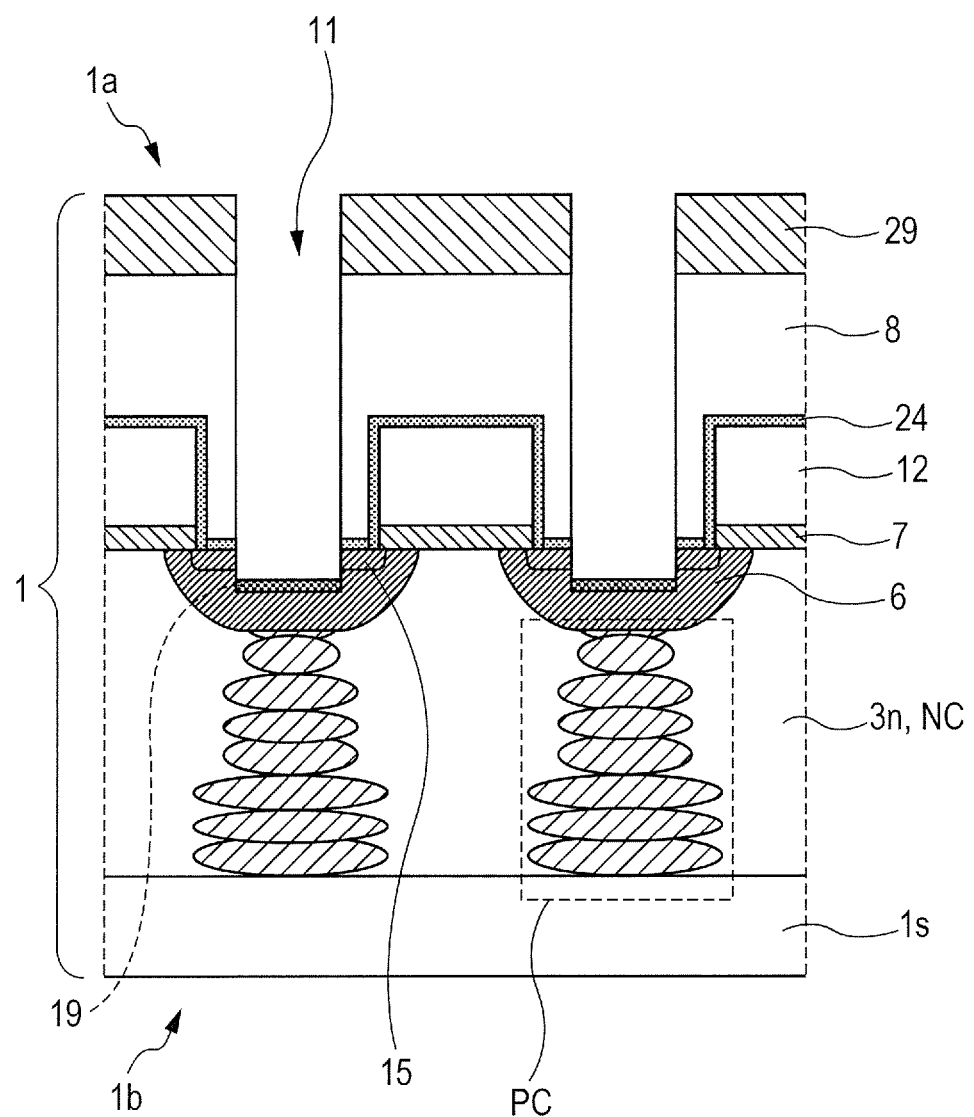
FIG. 35 is a device cross-sectional view (of the step of introducing P⁺-type body contact regions) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention.
Figure 36:
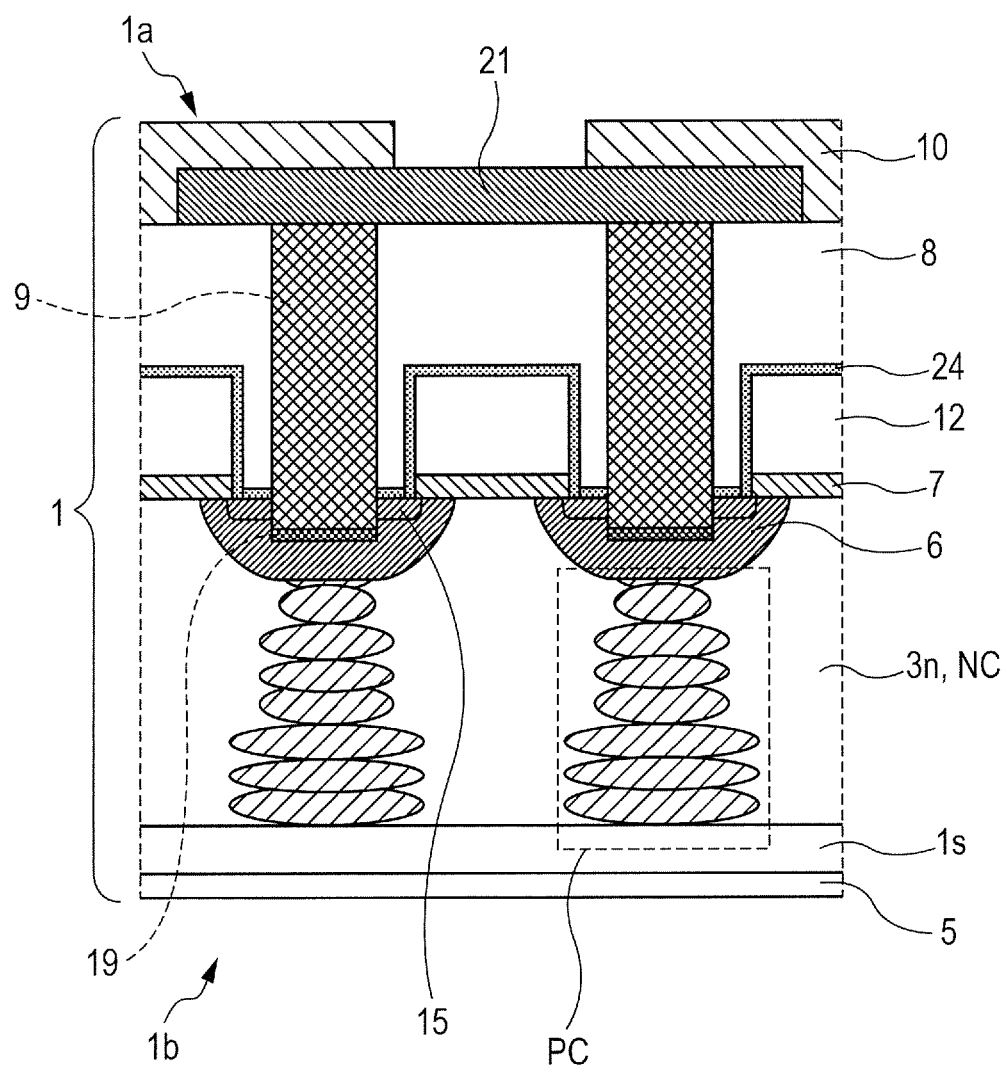
FIG. 36 is a device cross-sectional view (of the step of forming a source metal electrode, etc.) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention.

FIG. 26 is a device cross-sectional view (of the step of multi-stage implantation of boron ions into a second-level N⁻-type silicon epitaxial layer, etc.) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention. FIG. 27 is a device cross-sectional view (of the step of activation anneal after multi-stage implantation of boron ions into a third-level N⁻-type silicon epitaxial layer, etc.) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention. FIG. 28 is a device cross-sectional view (of the step of forming trenches to be filled with P-type body regions) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention. FIG. 29 is a device cross-sectional view (of the step of selective epitaxial growth of the P-type body regions) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention. FIG. 30 is a device cross-sectional view (of the step of planarization after the selective epitaxial growth of P-type body regions) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention. FIG. 31 is a device cross-sectional view (of the step of forming gate electrodes) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention. FIG. 32 is a device cross-sectional view (of the step of introducing N⁺-type source regions) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention. FIG. 33 is a device cross-sectional view (of the step of forming an interlayer, insulating film) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention. FIG. 34 is a device cross-sectional view (of the step of forming contact trenches) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention. FIG. 35 is a device cross-sectional view (of the step of introducing P⁺-type body contact regions) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention. FIG. 36 is a device cross-sectional view (of the step of forming a source metal electrode, etc.) during the manufacturing step corresponding to the A-A' cross section of the partially cut-away region R2 of the cell portion of FIG. 2, which is for illustrating the modification (multi-epitaxial method) of the wafer process in the manufacturing method (pre-channel process) of the semiconductor device of the embodiment of the present invention. Based on these drawings, a description will be given to the modification (multi-epitaxial method) of the wafer process in the manufacturing method (pre-channel process) of the semiconductor device of the embodiment of the present invention.

As shown in FIG. 24, the N⁺-type single-crystal silicon substrate 1s (which is, e.g., a 200-ϕ wafer here, but the diameter of the wafer may also be any of 150ϕ, 300ϕ, and 450ϕ) doped with, e.g., antimony (at a concentration of the order of, e.g., $10^{18}$ to $10^{19}/cm^3$) is prepared. Note that the thickness of the N⁺-type single-crystal silicon substrate is is, e.g., about 500 to 1000 μm. Next, over the device surface 1a (first main surface) of the N⁺-type single-crystal silicon substrate 1s (semiconductor wafer 1), a first-level N⁻-type silicon epitaxial layer 1e1 (at a concentration of the order of, e.g., about $10^{13}/cm^3$) doped with phosphorus and having a thickness of, e.g., about 15 μm (on the assumption that a breakdown voltage is about 600 V) is formed.

Next, as shown in FIG. 25, e.g., ion implantation of boron ions or the like is repeatedly performed to different depths to introduce a multi-level boron ion implantation region 31. Thereafter, surface planarization is performed as necessary.

Next, as shown in FIG. 26, the process shown in FIGS. 24 and 25 is repeated, e.g., about three times to successively form a second-level N⁻-type silicon epitaxial layer 1e2 (at a concentration of the order of, e.g., $10^{15}/cm^3$) and a third-level N⁻-type silicon epitaxial layer 1e3 (at a concentration of the order of, e.g., $10^{15}/cm^3$) over the first-level N⁻-type silicon epitaxial layer 1e1. As a result, the first-level N⁻-type silicon epitaxial layer 1e1, the second-level N⁻-type silicon epitaxial layer 1e2, and the third-level N⁻-type silicon epitaxial layer 1e3, i.e., the multi-level boron ion implantation region 31 in the N⁻-type silicon epitaxial layer 1e serves as each of the integral P-type column regions PC. On the other hand, the portions without the P-type column regions PC serve as the N-type column region NC.

Next, as shown in FIG. 27, activation anneal of the introduced impurities is performed, and surface planarization is performed as necessary.

Next, as shown in FIG. 28, over the device surface 1a of the wafer 1, the hard mask 20 for processing for formation of trenches to be filled with P-type body regions, such as a TEOS-based silicon oxide film, is formed by, e.g., typical lithography. At this time, the widths of openings corresponding to trenches in the hard mask 20 for processing for formation of trenches to be filled with P-type body regions are, e.g., about 1 to 2 μm.

Next, using the hard mask 20 for processing for formation of trenches to be filled with P-type body regions, the trenches 22 to be filled with P-type body regions (trenches to be filled with channel regions) are formed by, e.g., dry etching. As a preferred example of a dry etching method (first method, i.e., a full dry etching method) for the trenches to be filled with P-type body regions, a method including the following first and second steps can be shown by way of example. That is, in the first step (1), the semiconductor substrate is etched by, e.g., about 1 μm by anisotropic dry etching. Preferred examples of conditions for the etching treatment and the like which can be shown include the use of a high-density plasma etching apparatus such as an ICP (Inductively Coupled Plasma) etcher as an etching apparatus, a processing barometric pressure of, e.g., about 4 Pa, gas conditions, flow rates, and the like of, e.g., Ar, $SF_6$, and $O_2$ which are 200 sccm, 100 sccm, and 70 sccm, an ICP excitation power of, e.g., 150 W, a power applied to a stage of, e.g., 20 W, and the like. Note that the etching apparatus may also be an ECR (Electron Cyclotron Resonance) etcher (high-density plasma etching apparatus) or another form of dry etcher. However, in the case of using the high-density plasma etching apparatus, a high selectivity can be ensured. Subsequently, in the second step (2), the semiconductor substrate is further etched by, e.g., about 1 μm by isotropic dry etching. Preferred examples of conditions for the etching treatment and the like which can be shown include the use of a high-density plasma etching apparatus such as an ICP (Inductively Coupled Plasma) etcher as an etching apparatus, a processing barometric pressure of, e.g., about 10 Pa, gas conditions, flow rates, and the like of, e.g., Ar, $CF_4$, and $O_2$ which are 50 sccm, 100 sccm, and 50 sccm, an ICP excitation power of, e.g., 80 W, a power applied to a stage of, e.g., 10 W, and the like. Note that the etching apparatus may also be an ECR (Electron Cyclotron Resonance) etcher (high-density plasma etching apparatus) or another form of dry etcher. However, in the case of using the high-density plasma etching apparatus, a high selectivity can be ensured.

As a preferred example of a dry etching method (second method, i.e., a dry & wet etching method) for the trenches to be filled with P-type body regions, a method including the following first and second steps can be shown by way of example. That is, in the first step (1), the semiconductor substrate is etched by, e.g., about 1 μm by anisotropic dry etching. Preferred examples of conditions for the etching treatment and the like which can be shown include the use of a high-density plasma etching apparatus such as an ICP (Inductively Coupled Plasma) etcher as an etching apparatus, a processing barometric pressure of, e.g., about 4 Pa, gas conditions, flow rates, and the like of, e.g., Ar, $SF_6$, and $O_2$ which are 200 sccm, 100 sccm, and 70 sccm, an ICP excitation power of, e.g., 150 W, a power applied to a stage of, e.g., 20 W, and the like. Note that the etching apparatus may also be an ECR (Electron Cyclotron Resonance) etcher (high-density plasma etching apparatus) or, another form of dry etcher. However, in the case of using the high-density plasma etching apparatus, a high selectivity can be ensured. Subsequently, in the second step (2), the semiconductor substrate is further etched by, e.g., about 1 μm by wet etching (isotropic etching). Preferred examples of an etchant which can be shown include an aqueous solution of a fluoric acid, a nitric acid, an acetic acid, or the like.

As a preferred example of a dry etching method (third method, i.e., a full wet etching method) for the trenches to be filled with P-type body regions, the following method can be shown by way of example. That is, the method is implemented by one step of anisotropic wet etching using an anisotropic wet etchant containing KOH or the like. In this case, each of the sidewalls exhibits a (111) plane having an angle of 54 degrees between itself and a horizontal plane (plane parallel with the main surface of the wafer).

Next, as shown in FIG. 29, the trenches 23 to be filled with P-type body regions are each filled with a boron-doped Si epitaxial layer by selective epitaxial growth. As preferred examples of conditions for the selective epitaxial growth, the following can be shown. That is, a processing temperature is, e.g., about 750 to 900° C. (or about 750 to 850° C.), a processing barometric pressure is, e.g., about 1.3 kPa to 101 kPa, a deposition time is, e.g., 5 to 30 minutes, and gas conditions, flow rates, and the like of, e.g., $H_2$, DCS (Dichlorosilane), HCl, and $B_2H_6$ are about 10000 to 20000 sccm, 300 to 500 sccm, 300 to 800 sccm, and 100 to 500 sccm. Note that, when there is a portion in which Si:C layers are to be formed, the foregoing MMS (Monomethylsilane) is further added in the portion. The flow rate is adjusted within a range of, e.g., about 50 to 100 sccm such that the concentration of carbon is, e.g., about 0.05 at % to 0.1 at %.

Next, as shown in FIG. 30, by a planarization step, e.g., CMP, the entire hard mask 20 for processing for formation of trenches to be filled with P-type body regions and a part of the P-type Si selective epitaxial layer 23 are removed. As a result, the P-type Si selective epitaxial layer 23 serves as the P-type body regions (channel regions) 6.

Next, as shown in FIG. 31, in the state shown in FIG. 30, the gate insulating film 7 is formed over substantially the entire device surface 1a (first main surface) of the wafer 1 by, e.g., thermal oxidation or the like. Then, over the gate insulating film 7 over substantially the entire device surface 1a of the wafer 1, the polysilicon film 12 is deposited as a gate electrode material or the like by, e.g., CVD. Then, by patterning the polysilicon film 12 and the gate insulating film 7 by, e.g., typical lithography, the polysilicon film 12 is processed to form the gate electrodes 12. Then, over the device surface 1a of the wafer 1 and the surfaces (upper surfaces and side surfaces) of the gate electrodes 12, the surface oxide film 24 is deposited by, e.g., thermal oxidation, CVD, or the like.

Next, as shown in FIG. 32, over the device surface 1a of the wafer 1, the resist film 28 for introducing $N^+$-type source regions is formed by, e.g., typical lithography and, using the resist film 28 as a mask, the resist film 15 for introducing $N^+$-type source regions is introduced into the surface area of the semiconductor region by, e.g., ion implantation. Thereafter, the resist film 15 for introducing $N^+$-type source regions which is no longer needed is removed by, e.g., ashing or the like, and then activation anneal is performed.

Next, as shown in FIG. 33, over substantially the entire surface of the wafer 1 on the device surface 1a side, the interlayer insulating film 8 formed of a silicon-oxide-based insulating film or the like is deposited by, e.g., CVD.

Next, as shown in FIG. 34, over the interlayer insulating film 8, the resist film 29 for contact trench processing is formed by, e.g., typical lithography (note that a hard mask of a silicon oxide film, a silicon nitride film, or the like may also be used). Then, using the resist film for contact trench processing as a mask, the contact trenches 11 are opened by, e.g., anisotropic dry etching and extended as necessary in the semiconductor substrate.

Next, as shown in FIG. 35, into the surface area of the semiconductor substrate at the bottom of each of the contact trenches 11, the $P^+$-type body contact regions 19 are introduced by, e.g., ion implantation. Thereafter, the resist film 29 for contact trench processing is removed by, e.g., ashing or the like, and then activation anneal is performed.

Next, as shown in FIG. 36, over the interlayer insulating film 8 and substantially the entire inner surface of each of the contact trenches 11, a titanium film and a titanium nitride film which are relatively thin (thinner than a tungsten film described later) are successively deposited as a barrier metal film or the like by, e.g., sputtering deposition. Then, over the barrier metal film over substantially the entire device surface 1a of the wafer 1, the tungsten film is deposited by, e.g., CVD so as to fill the contact trenches 11. Then, by removing the barrier metal film and the tungsten film outside the contact holes 11 by an etch-back process or CMP (Chemical Mechanical Polishing), the contact trenches 11 are filled with the tungsten plugs 9. Then, over substantially the entire surface of the wafer 1 on the device surface 1a side, a barrier metal film (such as a titanium film, a titanium film/nitride film, a TiW film or the like) which is relatively thin (thinner than an aluminum-based metal film described later) is deposited by, e.g., sputtering deposition. Then, over substantially the entire surface of the barrier metal film, the aluminum-based metal film is deposited by, e.g., sputtering deposition. Then, by, e.g., typical lithography, a metal electrode film including the barrier metal film, the aluminum-based metal film, and the like is processed to form the source metal electrode 21 and the like. Then, over substantially the entire surface of the wafer 1 on the device surface 1a side, a photosensitive polyimide-based insulating film is deposited as the final passivation film 10 by, e.g., coating. Then, by processing the photosensitive polyimide-based insulating film by typical lithography, the final passivation film 10 is formed into a pattern (alternatively, the patterning may also be performed using a non-photosensitive polyimide-based insulating film). Note that, here, the opening of the final passivation film 10 corresponding to a source pad opening is shown schematically, but a real source pad opening is wider. Preferred examples of the final passivation film 10 include not only an organic single-layer film of a polyimide resin (polyimide-based resin), BCB (Benzocyclobutene), or the like, but also an organic/inorganic composite final passivation film including a plasma TEOS (Tetraethylorthosilicate)-based silicon oxide film or another silicon oxide film, a silicon nitride film, a polyimide-based resin film, and the like which are shown in ascending order, an inorganic final passivation film including a silicon oxide film, a silicon nitride film, and the like which are shown in ascending order, and the like. Then, the back surface 1b of the wafer 1 is subjected to back grinding treatment to reduce the thickness of the wafer (having an original thickness of about 500 to 1000 μm) to about 100 to 300 μm. Then, the back-surface metal electrode 5 is formed by sputtering deposition or the like. Examples of the configuration of the back-surface metal electrode 5 which can be shown include that of a film including a titanium film, a nickel film, a gold film, and the like which are shown in order of increasing distance from the silicon substrate 1s. Thereafter, by dicing, the wafer 1 is divided into individual chips to provide the discrete devices 2 (semiconductor chips).

5. Description of Modification 1 (P-type Body Carbon Doping) Related to Structure of Channel Regions in Vertical Planar Power MOSFET, etc. as Example of Target Device in Manufacturing Method of Semiconductor Device of Embodiment of Present Invention (See Mainly FIG. 37)

In this section, a description will be given to a modification intended for the device structure described in Section 1. To the manufacturing method of the device, any one of Sections 2 to 4 is basically applicable.

The characteristic feature of each of the device structures of Sections 5 to 8 is that each of the P-type body regions 6 (channel regions) or the N+-type source regions 15 has, e.g., a part thereof doped with carbon.

Figure 37:
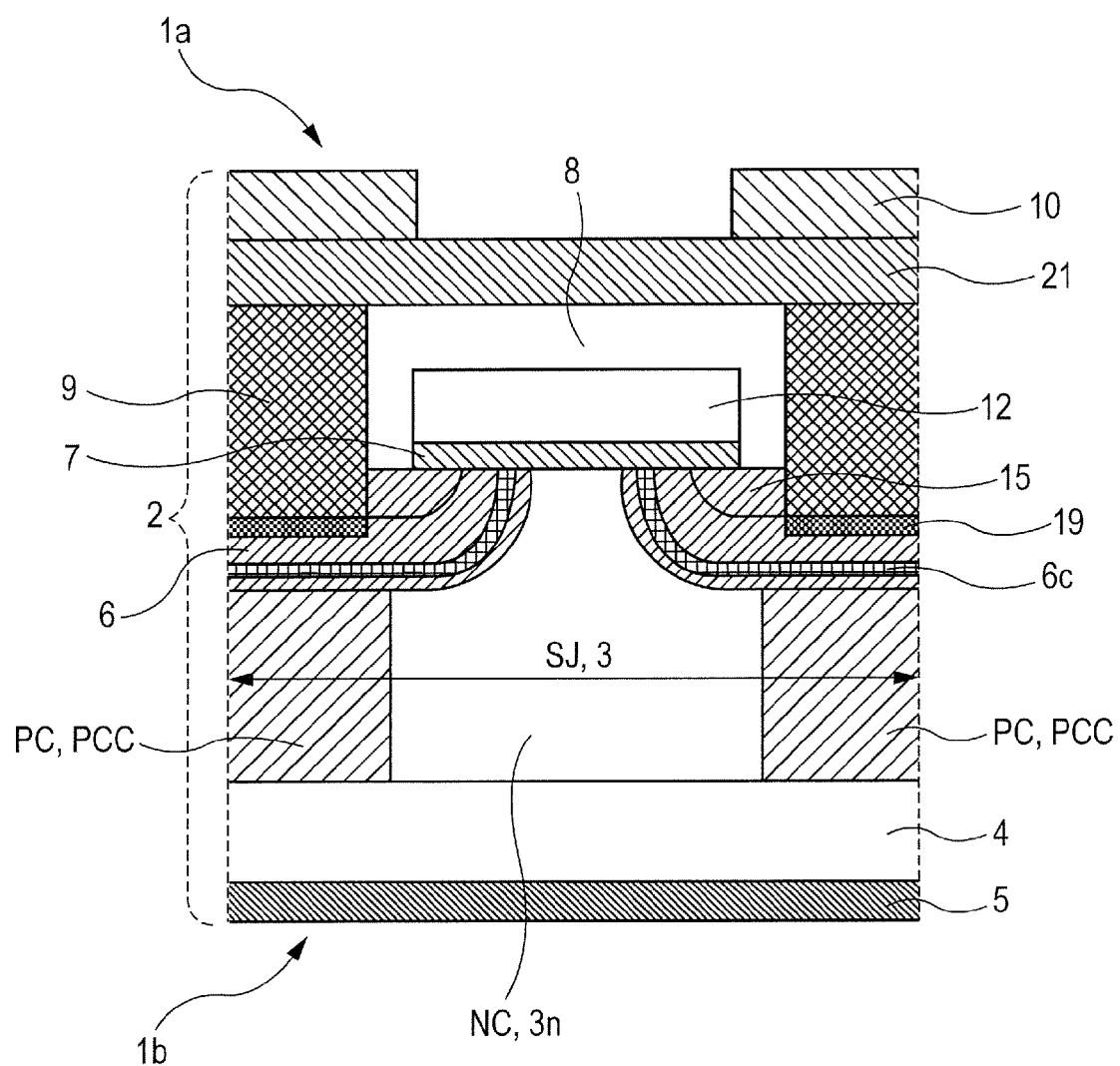
FIG. 37 is a device cross-sectional view of the unit active cell region corresponding to the B-B' cross section of the partially cut-away region R2 of the cell portion of FIG. corresponding to FIG. 3, which is for illustrating Modification 1 (P-type body carbon doping) related to the structure of channel regions in a vertical planar power MOSFET or the like as the example of the target device in the manufacturing method of the semiconductor device of the embodiment of the present invention.

FIG. 37 is a device cross-sectional view of the unit active cell region corresponding to the B-B' cross section of the partially cut-away region R2 of the cell portion of FIG. 2 corresponding to FIG. 3, which is for illustrating Modification 1 (P-type body carbon doping) related to the structure of channel regions in a vertical planar power MOSFET or the like as the example of the target device in the manufacturing method of the semiconductor device of the embodiment of the present invention. Based on this drawing, a description will be given to Modification 1 (P-type body carbon doping) related to the structure of channel regions in a vertical planar power MOSFET or the like as the example of the target device in the manufacturing method of the semiconductor device of the embodiment of the present invention.

The example is characterized in that, as shown in FIG. 37, in comparison to the structure of FIG. 3, a P-type body inner carbon-doped region 6c is provided in each of the P-type body regions 6. When there are such P-type body inner carbon-doped regions 6c, the effect of inhibiting boron from being diffused to the outside due to heat treatment is achieved. Therefore, it is possible to retain a sharp impurity profile in each of the P-type body regions 6. As a result, it is also possible to suppress an increase in ON resistance. A preferred range of the amount of carbon doping is, e.g., about 0.01 to 1 at % (more preferably, about 0.05 to 0.5 at %).

Note that, in terms of the manufacturing method, a period during which carbon is added may be provided appropriately midway (relatively early) in the selective growth shown in FIG. 9.

6. Description of Modification 2 (Source Carbon Doping) Related to Structure of Source Regions in Vertical Planar Power MOSFET, etc. as Example of Target Device in Manufacturing Method of Semiconductor Device of Embodiment of Present Invention (See Mainly FIG. 38)

In this section, a description will be given to another modification intended for the device structure described in Section 1. To the manufacturing method of the device, any one of Sections 2 to 4 is basically applicable.

Figure 38:
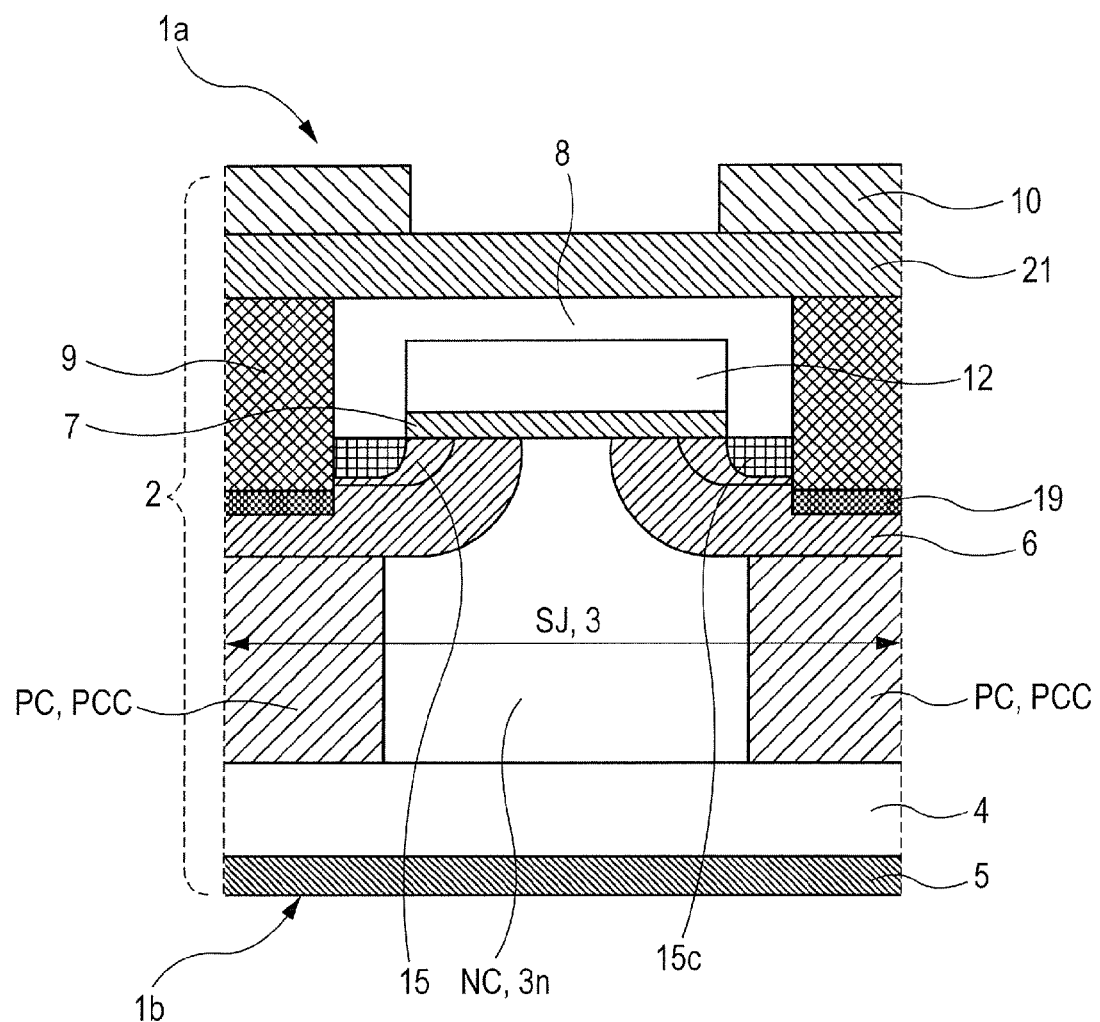
FIG. 38 is a device cross-sectional view of the unit active cell region corresponding to the B-B' cross section of the partially cut-away region R2 of the cell portion of FIG. corresponding to FIG. 3, which is for illustrating Modification 2 (source carbon doping) related to the structure of source regions in the vertical planar power MOSFET or the like as the example of the target device in the manufacturing method of the semiconductor device of the embodiment of the present invention.

FIG. 38 is a device cross-sectional view of the unit active cell region corresponding to the B-B' cross section of the partially cut-away region R2 of the cell portion of FIG. 2 corresponding to FIG. 3, which is for illustrating Modification 2 (source carbon doping) related to the structure of source regions in the vertical planar power MOSFET or the like as the example of the target device in the manufacturing method of the semiconductor device of the embodiment of the present invention. Based on this drawing, a description will be given to Modification 2 (source carbon doping) related to the structure of source regions in the vertical planar power MOSFET or the like as the example of the target device in the manufacturing method of the semiconductor device of the embodiment of the, present invention.

The example is characterized in that, as shown in FIG. 38, in comparison to the structure of FIG. 3, an N+-type source inner carbon-doped region 15c is provided in each of the N+-type source regions 15. When there are such N+-type source inner carbon-doped regions 15c, the lattice constant decreases in the portions therewith so that an extensional stress acts on the channel portions to increase the mobility of electrons. As a result, the ON resistance decreases. A preferred range of the amount of carbon doping is, e.g., about 0.1 to 1 at % (more preferably, about 0.3 to 0.5 at %).

Note that, in terms of the manufacturing method, a period during which carbon is added may be provided appropriately midway (relatively early) in the selective growth shown in FIG. 9.

7. Description of Modification 1 (P-Type Body & Source Carbon Doping) Related to Structures of Channel and Source Regions in Vertical Planar Power MOSFET, etc. as Example of Target Device in Manufacturing Method of Semiconductor Device of Embodiment of Present Invention (See Mainly FIG. 39)

In this section, a description will be given to a modification intended for the device structure described in Section 1 which is an example related to a combination of the individual modifications of Sections 5 and 6. To the manufacturing method of the device, any one of Sections 2 to 4 is basically applicable.

Figure 39:
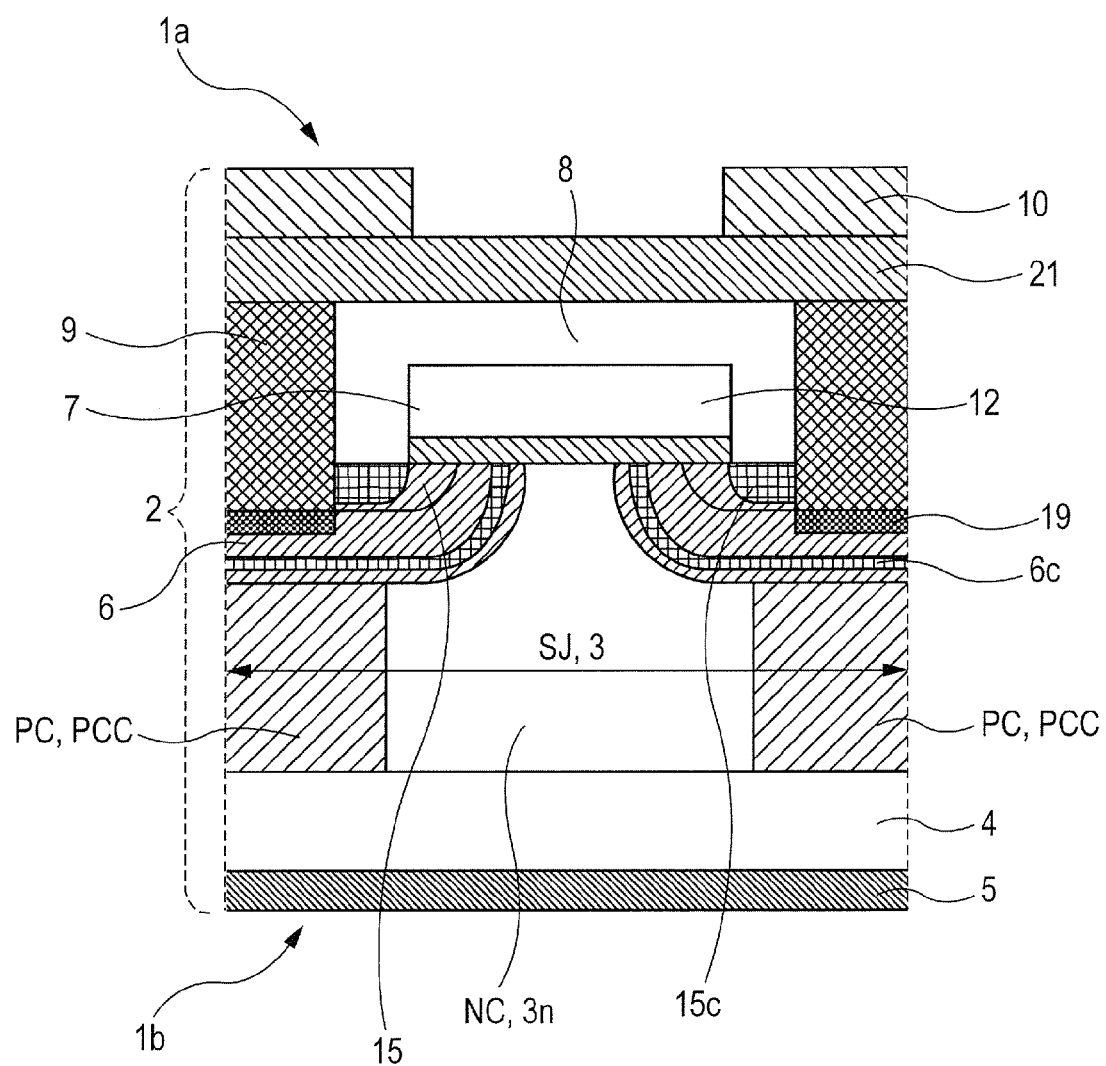
FIG. 39 is a device cross-sectional view of the unit active cell region corresponding to the B-B' cross section of the partially cut-away region R2 of the cell portion of FIG. corresponding to FIG. 3, which is for illustrating Modification 1 (P-type body & source carbon doping) related to the structure of the channel and source regions in the vertical planar power MOSFET or the like as the example of the target device in the method of manufacturing the semiconductor device of the embodiment of the present invention.

FIG. 39 is a device cross-sectional view of the unit active cell region corresponding to the B-B' cross section of the partially cut-away region R2 of the cell portion of FIG. 2 corresponding to FIG. 3, which is for illustrating Modification 1 (P-type body & source carbon doping) related to the structure of the channel and source regions in the vertical planar power MOSFET or the like as the example of the target device in the method of manufacturing the semiconductor device of the embodiment of the present invention. Based on this drawing, a description will be given to Modification 1 (P-type body & source carbon doping) related to the structures of channel and source regions in the vertical planar power MOSFET or the like as the example of the target device in the manufacturing method of the semiconductor device of the embodiment of the present invention.

The example is characterized in that, as shown in FIG. 39, in comparison to the structure of FIG. 3, the N$^+$-type source inner carbon-doped regions 15$c$ are provided in the respective N$^+$-type source regions 15 and also the P-type body inner carbon-doped regions 6$c$ are provided in the respective P-type body regions 6.

Note that, in terms of the manufacturing method, a period during which carbon is added may be provided appropriately midway (relatively early during a first half period and during a second half period) in the selective growth shown in FIG. 9.

8. Description of Modification (Carbon Cluster Implantation) of Dose Process Corresponding to Modification 2 (Source Carbon Doping) Related to Structure of Source Regions in Vertical Planar Power MOSFET, etc. as Example of Target Device in Manufacturing Method of Semiconductor Device of Embodiment of Present Invention (See Mainly FIG. 40)

In this section, a description will be given to a modification related to the manufacturing method of the device described in Section 6. To the manufacturing method of the device, any one of Sections 2 to 4 is basically applicable in the same manner as in Section 6.

Figure 40:
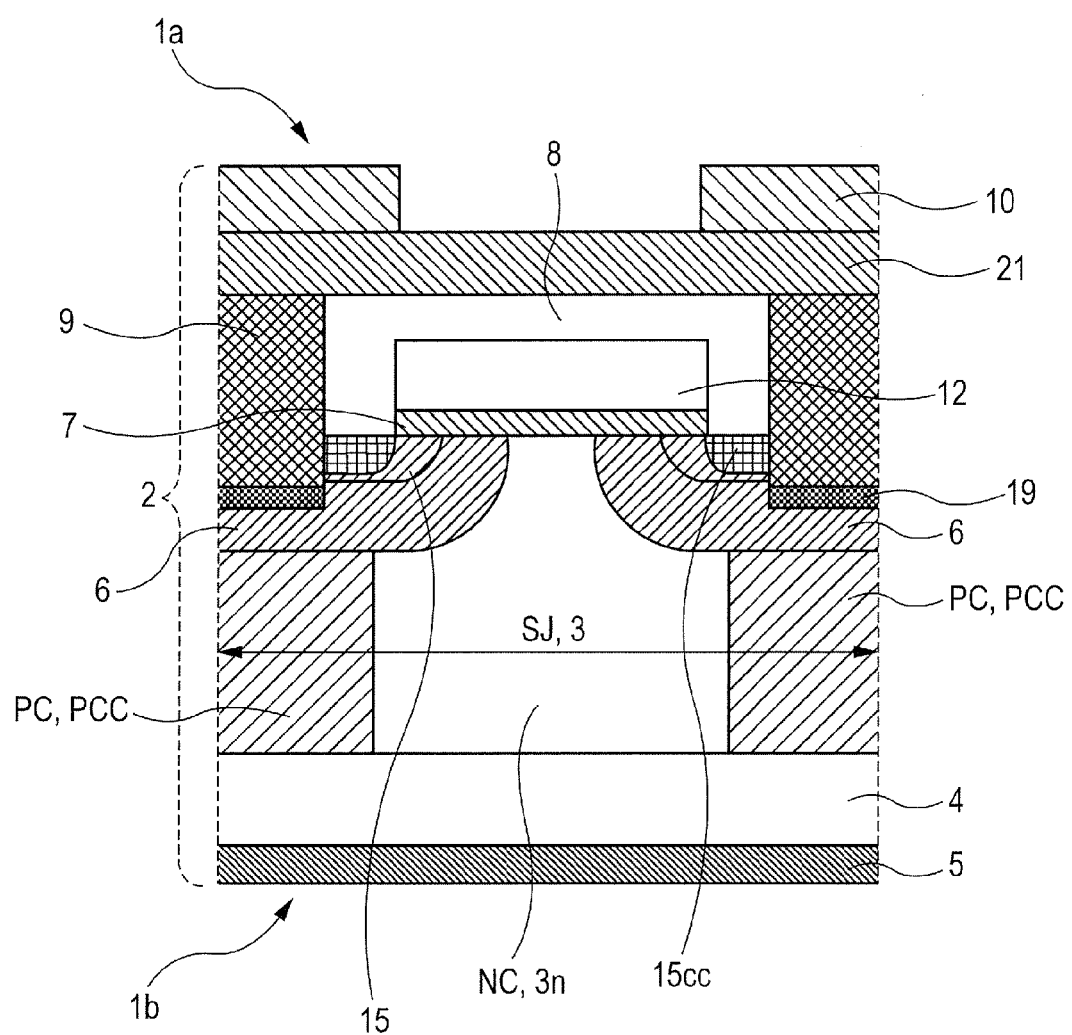
FIG. 40 is a device cross-sectional view of the unit active cell region corresponding to the B-B' cross section of the partially cut-away region R2 of the cell portion of FIG. corresponding to FIG. 3, which is for illustrating a modification (carbon cluster implantation) of a dose process corresponding to Modification 2 (source carbon doping) related to the structure of source regions in the vertical planar power MOSFET or the like as the example of the target device in the method of manufacturing the semiconductor device of the embodiment of the present invention.

FIG. 40 is a device cross-sectional view of the unit active cell region corresponding to the B-B' cross section of the partially cut-away region R2 of the cell portion of FIG. 2 corresponding to FIG. 3, which is for illustrating a modification (carbon cluster implantation) of a dose process corresponding to Modification 2 (source carbon doping) related to the structure of source regions in the vertical planar power MOSFET or the like as the example of the target device in the method of manufacturing the semiconductor device of the embodiment of the present invention. Based on this drawing, a description will be given to the modification (carbon cluster implantation) of the dose process corresponding to Modification 2 (source carbon doping) related to the structure of the source regions in the vertical planar power MOSFET or the like as the example of the target device in the manufacturing method of the semiconductor device of the embodiment of the present invention.

The example is characterized in that, as shown in FIG. 40, in comparison to the structure of FIG. 38, the N$^+$-type source inner carbon-doped regions 15$c$ are replaced with carbon-cluster-ion-implantation N$^+$-type source inner carbon-doped regions 15$cc$ formed by ion implantation of carbon cluster ions.

Note that, in terms of the manufacturing method, in the state shown in, e.g., FIG. 11 or 12, carbon cluster ions are implanted from the device surface 1$a$ of the wafer 1.

9. Description of Trench-Gate Power MOSFET, etc. as Example of Target Device in Manufacturing Method of Semiconductor Device of Another Embodiment of Present Invention (See Mainly FIGS. 41 and 42)

The example described in this section is a modification of a peripheral structure around a gate electrode, which is intended for each of the device structures described in Sections 1, 5, 6, and 7. Accordingly, the description given herein corresponds to FIGS. 1 to 3, and is exactly the same with regard to FIG. 1. Therefore, the description thereof is omitted, and a description will be given to FIGS. 2 and 3 as different portions.

Figure 41:
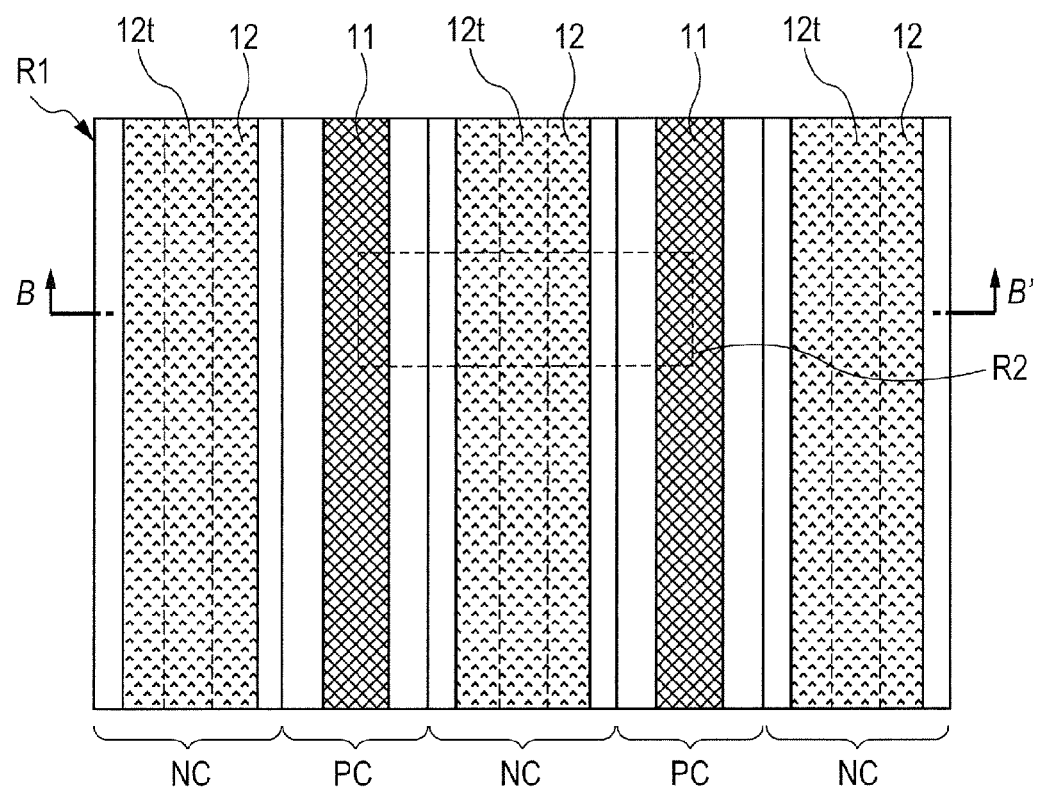
FIG. 41 is an enlarged plan view of the partially cut-away region R1 of the cell portion of FIG. 1 corresponding to FIG. 2, which is for illustrating a trench-gate power MOSFET as an example of the target device in a method of manufacturing a semiconductor device of another embodiment of the present invention.
Figure 42:
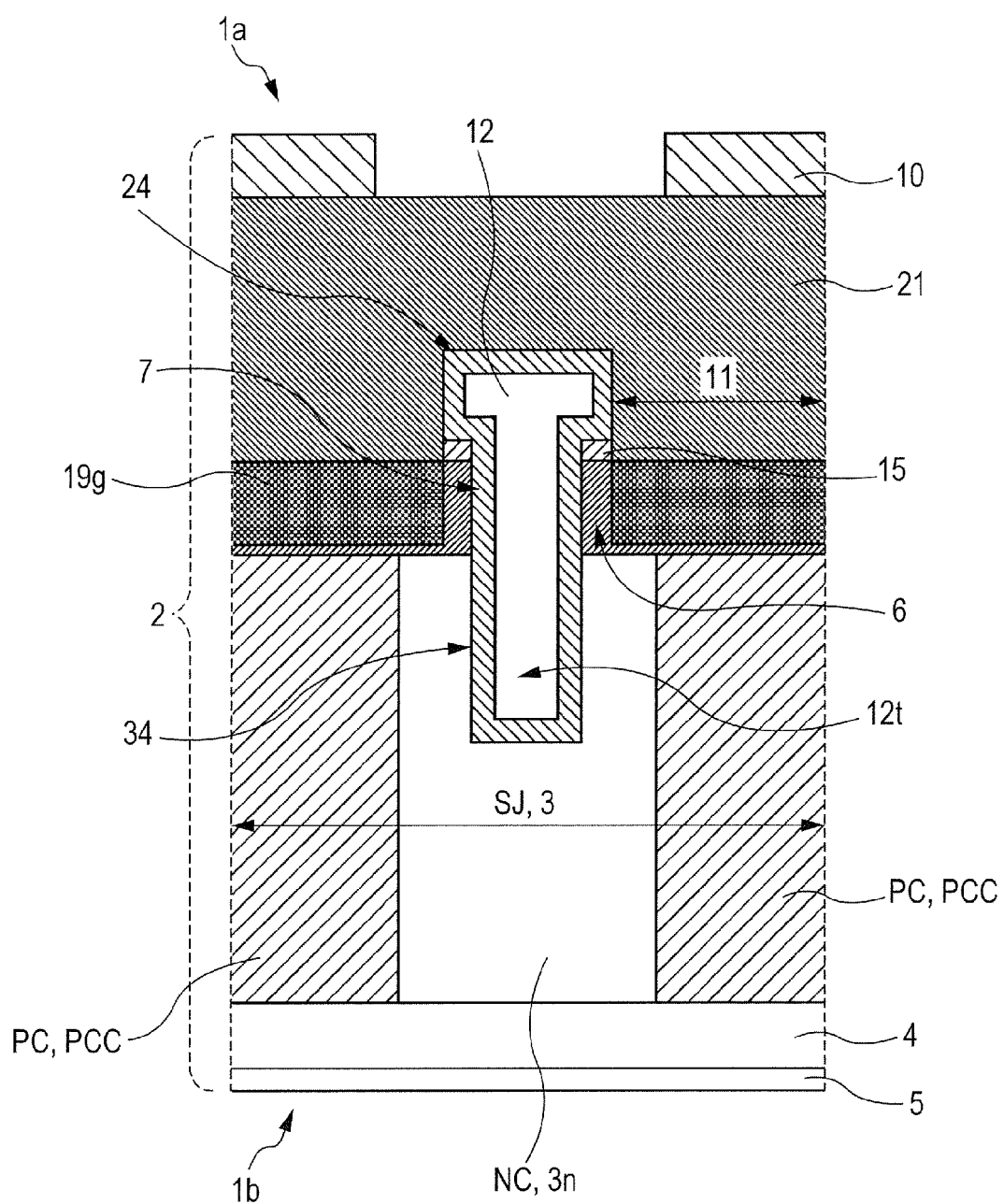
FIG. 42 is a device cross-sectional view (corresponding to FIG. 3) of the unit active cell region corresponding to the B-B' cross section of the partially cut-away region R2 of the cell portion of FIG. 41.

FIG. 41 is an enlarged plan view of the partially cut-away region R1 of the cell portion of FIG. 1 corresponding to FIG. 2, which is for illustrating a trench-gate power MOSFET as an example of the target device in a method of manufacturing a semiconductor device of another embodiment of the present invention. FIG. 42 is a device cross-sectional view (corresponding to FIG. 3) of the unit active cell region corresponding to the B-B' cross section of the partially cut-away region R2 of the cell portion of FIG. 41. Based on these drawings, a description will be given to the trench-gate power MOSFET or the like as an example of a target device in a manufacturing method of a semiconductor device of another example of the present invention.

Next, using FIGS. 41 and 42, a detailed structure of the cell region 26 (FIG. 1) is described. As shown in FIGS. 41 and 42, over an N$^+$-type Si single-crystal substrate region 1$s$, a drift region 3 having a super junction structure SJ is provided. In the drift region 3, the N-type column regions NC and the P-type column regions PC each having a plate-like shape and extending in a direction perpendicular to paper surfaces with FIGS. 41 and 42 are alternately formed. In this portion, the N-type column regions NC function as the N$^-$-type drift regions 3n. Note that, by adding carbon or germanium to the P-type column regions PC and providing the P-type column regions PCC doped with carbon or germanium, it is possible to reduce the scattering of an impurity profile due to heat treatment, though the addition of carbon or germanium is not mandatory.

Here, if the breakdown voltage of the drift region is assumed to be about 600 V, as a preferred thickness thereof, e.g., about 45 μm can be shown by way of example. As a preferred width of each of the N-type column regions, e.g., about 6 μm can be shown by way of example. Likewise, as a preferred width of each of the P-type column regions, e.g., about 4 μm can be shown by way of example. Note that the inner angle of the lower portion of each of the side surfaces of the N-type column region is typically 88 to 90 degrees.

In the upper end portion (closer to the substrate upper surface 1$a$) of the drift region 3, the P-type body regions 6 forming channel regions are provided. In the P-type body regions 6, N$^+$-type source regions 15 are provided. SiGe-based P$^+$-type body contact regions 19$g$ are provided so as to come in contact with the N$^+$-type source regions 15 when viewed from over the upper surface. On the device surface 1$a$ side of the semiconductor substrate 2, the polysilicon gate electrodes 12 (trench gate portions 12$t$ are in trenches 34 to be filled with gates) are provided via the gate insulating film 7. Substantially the upper half portions of the polysilicon gate electrodes 12 are covered with the surface oxide film 24 as the interlayer insulating film. The portions of the device surface 1*a* of the semiconductor substrate in which the polysilicon gate electrodes 12 are not provided serve as the contact trenches 11. In the contact trenches 11, the aluminum-based metal source electrode 21 is formed so as to be coupled to the $N^+$-type source regions 14 and to the SiGe-based $P^+$-type body contact region 19*g* via a barrier metal layer of, e.g., Ti/TiN, TiW, or the like. Note that, as shown in, e.g., FIG. 3, the metal source electrode 21 may also be formed via the tungsten plugs 9.

Over the aluminum-based metal source electrode 21, as a final passivation film 10, e.g., a polyimide-based insulating film 10 is formed. Note that, here, the opening of the final passivation film 10 corresponding to a source pad opening is shown schematically, but a real source pad opening is wider. Preferred examples of the final passivation film 10 include not only an organic single-layer film of a polyimide resin (polyimide-based resin), BCB (Benzocyclobutene), or the like, but also an organic/inorganic composite final passivation film including a plasma TEOS (Tetraethylorthosilicate)-based silicon oxide film or another silicon oxide film, a silicon nitride film, a polyimide-based resin film, and the like which are shown in ascending order, an inorganic final passivation film including a silicon oxide film, a silicon nitride film, and the like which are shown in ascending order, and the like.

On the other hand, the lower end portion of the drift region 3 serves as an $N^+$-type drain region 4 (i.e., the $N^+$-type semiconductor substrate is) and, on the back surface 1*b* side of the $N^+$-type drain region 4, a metal drain electrode 5 (including, e.g., Ti/Ni/Au layers shown in order of increasing distance from the silicon substrate).

As will be described later, here, the SiGe-based $P^+$-type body contact regions 19*g* are formed by selective epitaxial growth. As a result, compared to the case where the SiGe-based $P^+$-type body contact regions 19*g* are formed by a typical method including ion implantation, activation heat treatment, and the like, the scattering of an impurity profile in each of the P-type column regions PC or the like included in the super junction structure SJ can be prevented more reliably. In addition, since SiGe has a lattice constant larger than that of silicon, each of the channel regions receives a compressive stress perpendicular to a channel direction so that the mobility of electrons is improved.

10. Description of Wafer Process in Manufacturing Method of Semiconductor Device of Another Embodiment of Present Invention (See Mainly FIGS. 43 to 54)

In this section, a description will be given to an example of the manufacturing method based on the trench-fill method intended for the device structure described in Section 9. However, it will be appreciated that the manufacturing method based on the trench-fill method intended for the device structure described in Section 1 is not limited to these two examples, and can be variously modified. It will also be appreciated that the manufacturing method is not limited to a trench-fill method, and can also be based on a multi-epitaxial method.

Since the following process is basically the same in regard to FIGS. 4 to 7 described in Section 1, a description will be given below only to different portions in principle.

Figure 45:
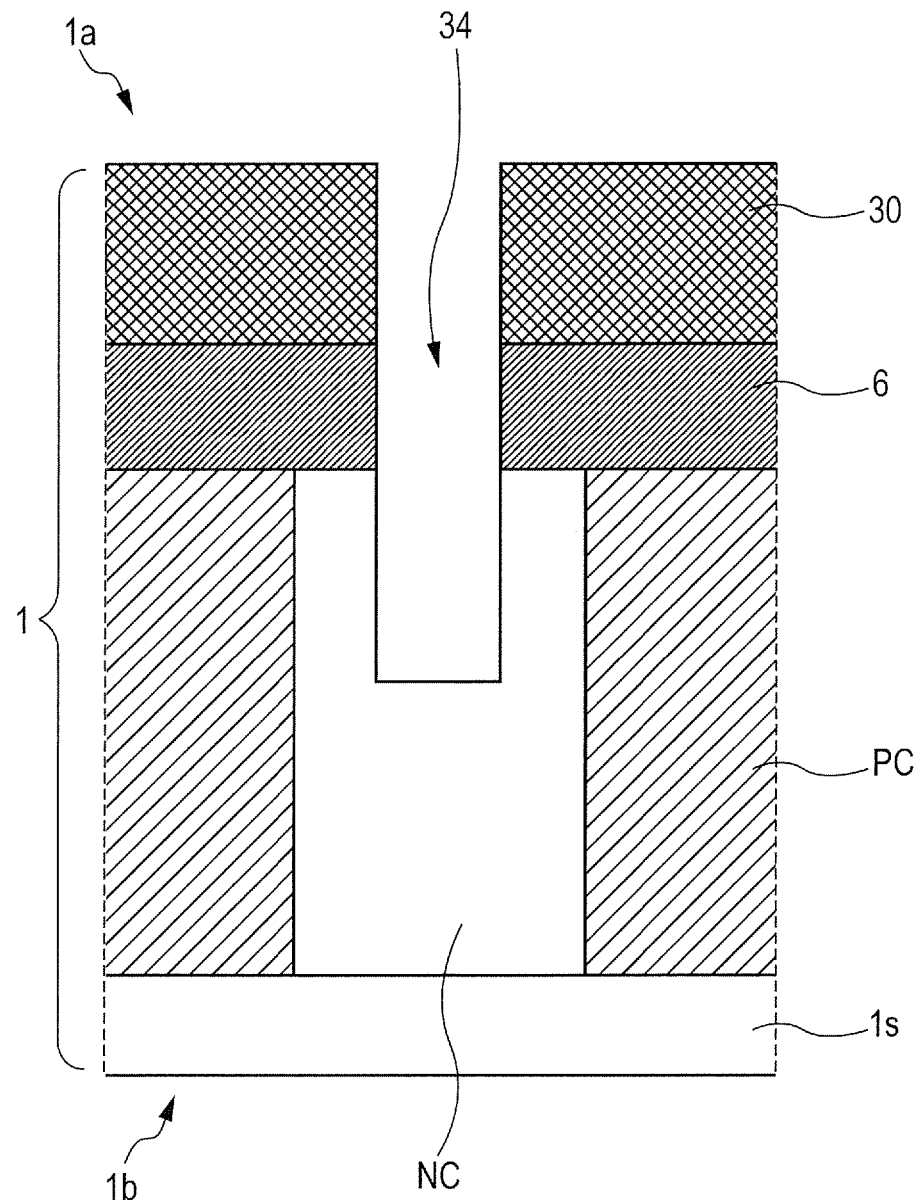
FIG. 45 is a device cross-sectional view (of the step of forming trenches to be filled with gate electrodes) during the manufacturing step corresponding to the B-B' cross section of the partially cut-away region R2 of the cell portion of FIG. 41, which is for illustrating the wafer process in the method of manufacturing the semiconductor device of the other embodiment of the present invention.
Figure 46:
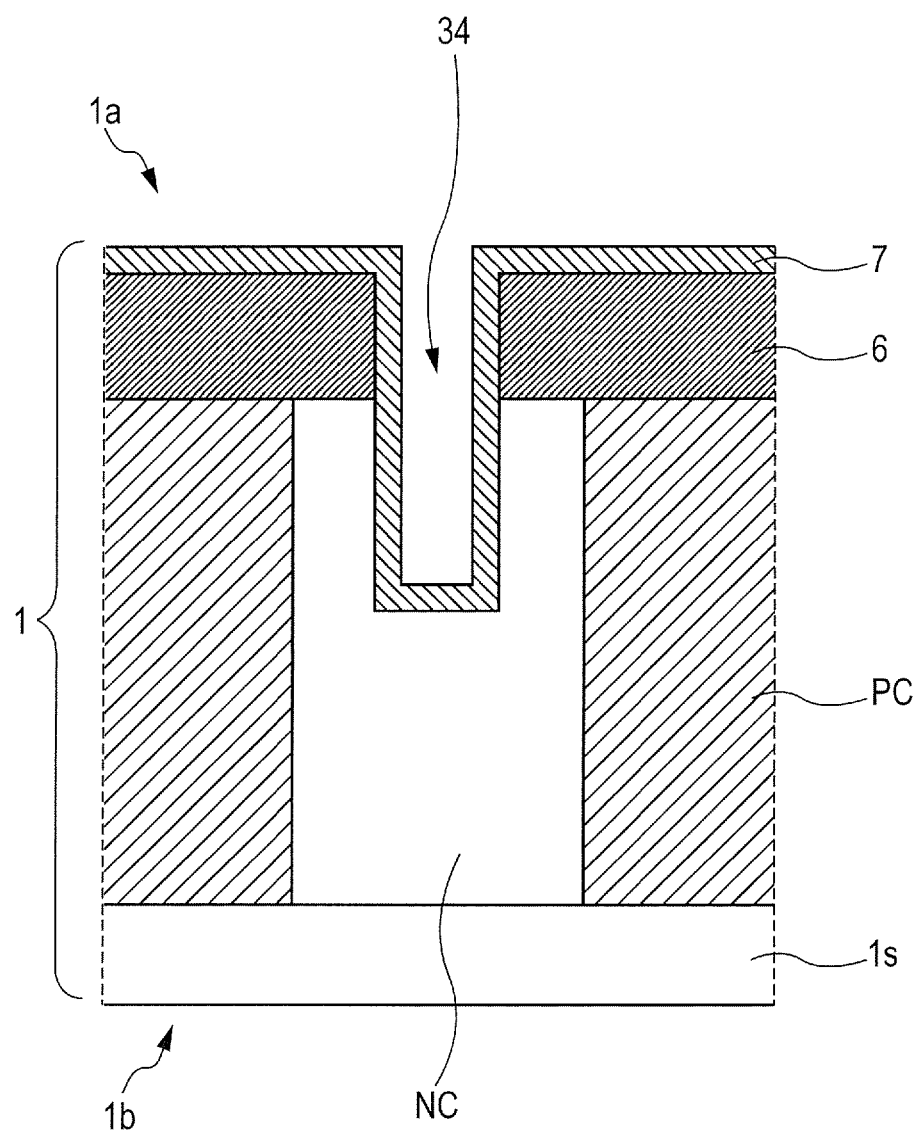
FIG. 46 is a device cross-sectional view (of the step of forming a gate insulating film) during the manufacturing step corresponding to the B-B' cross section of the partially cut-away region R2 of the cell portion of FIG. 41, which is for illustrating the wafer process in the method of manufacturing the semiconductor device of the other embodiment of the present invention.
Figure 47:
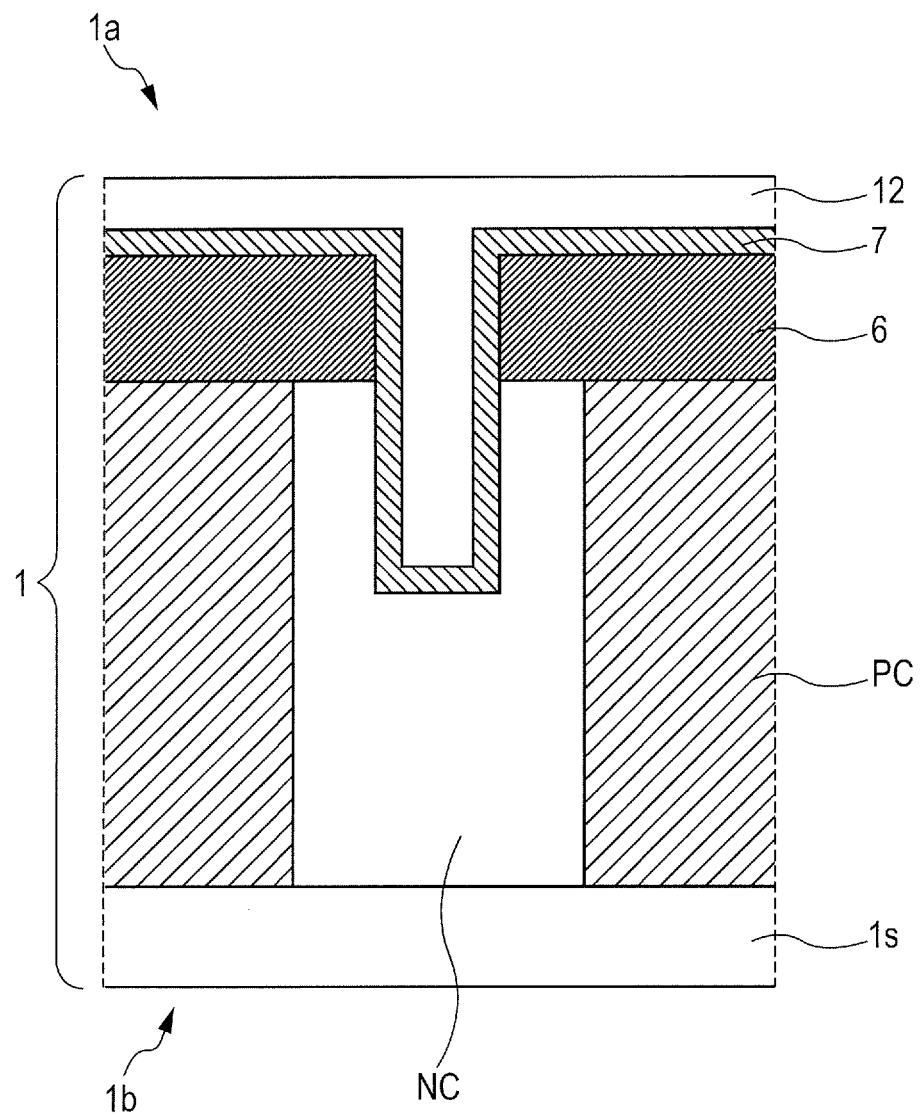
FIG. 47 is a device cross-sectional view (of the step of depositing a gate polysilicon film) during the manufacturing step corresponding to the B-B' cross section of the partially cut-away region R2 of the cell portion of FIG. 41, which is for illustrating the wafer process in the method f manufacturing the semiconductor device of the other embodiment of the present invention.
Figure 48:
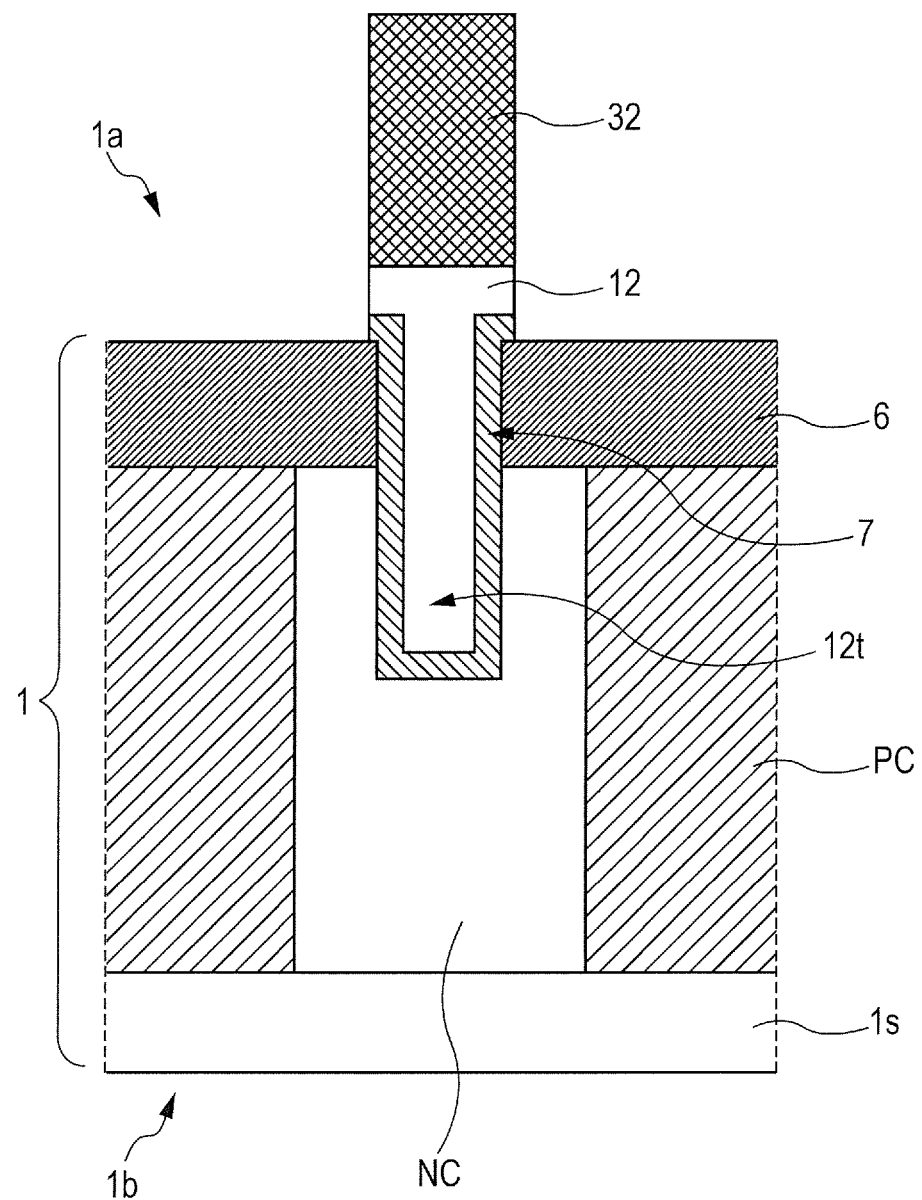
FIG. 48 is a device cross-sectional view (of the step of processing the gate polysilicon film) during the manufacturing step corresponding to the B-B' cross section of the partially cut-away region R2 of the cell portion of FIG. 41, which is for illustrating the wafer process in the method of manufacturing the semiconductor device of the other embodiment of the present invention.
Figure 49:
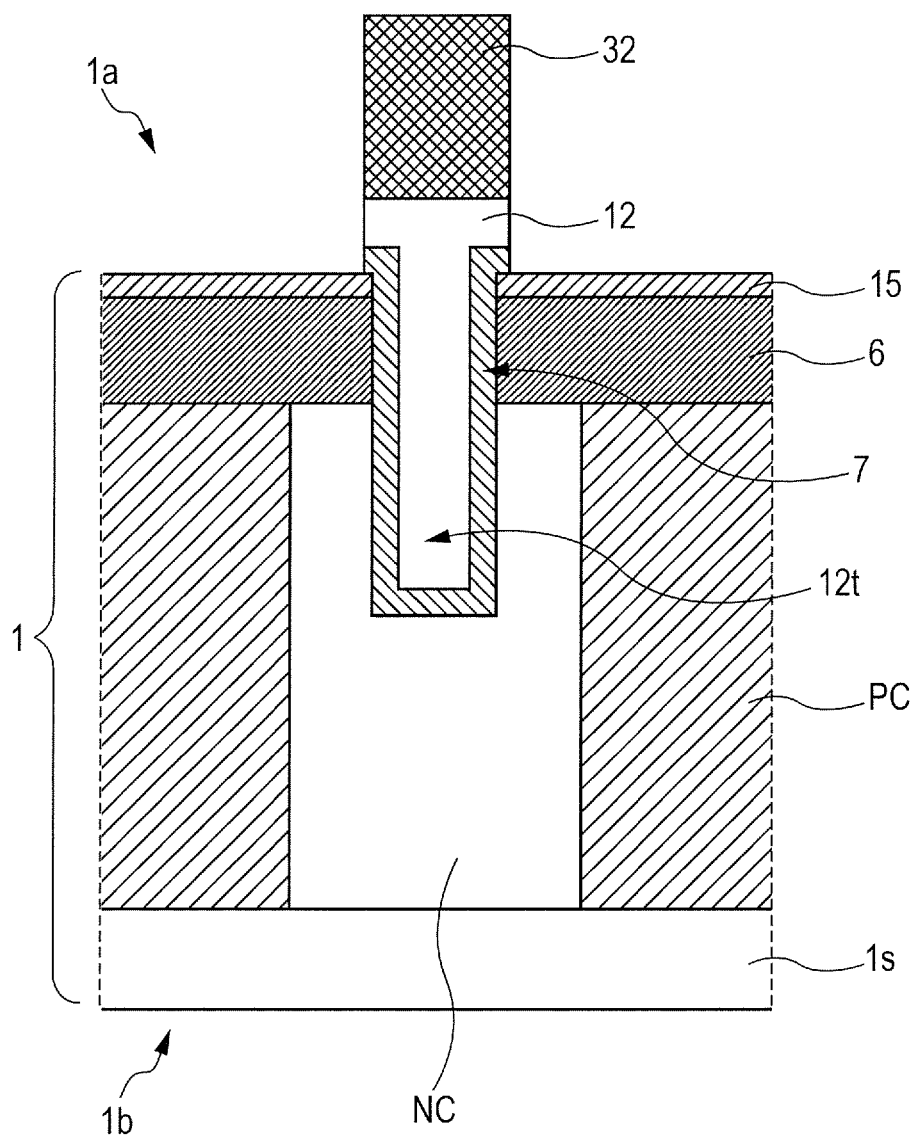
FIG. 49 is a device cross-sectional view (of the step of introducing $N^+$-type source regions) during the manufacturing step corresponding to the B-B' cross section of the partially cut-away region R2 of the cell portion of FIG. 41, which is for illustrating the wafer process in the method of manufacturing the semiconductor device of the other embodiment of the present invention.
Figure 50:
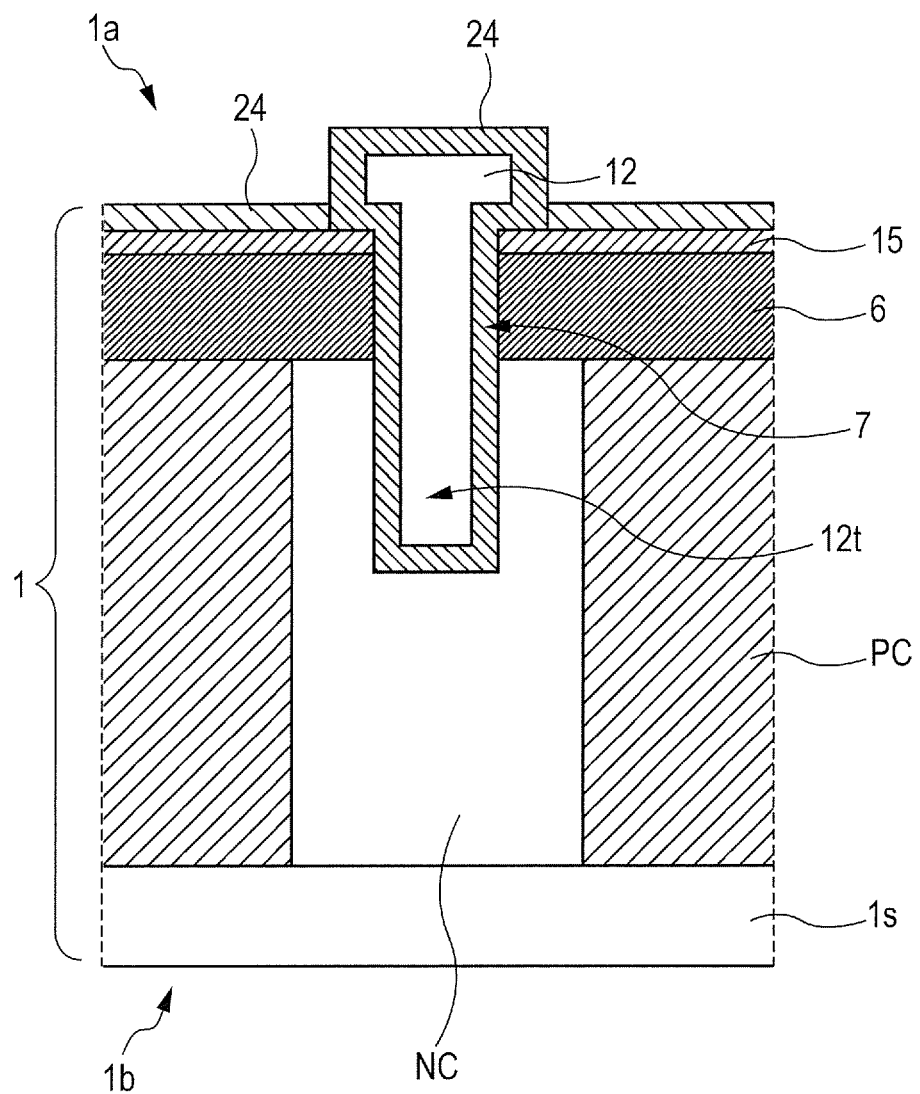
FIG. 50 is a device cross-sectional view (of the step of depositing a surface oxide film) during the manufacturing step corresponding to the B-B' cross section of the partially cut-away region R2 of the cell portion of FIG. 41, which is for illustrating the wafer process in the method of manufacturing the semiconductor device of the other embodiment of the present invention.
Figure 51:
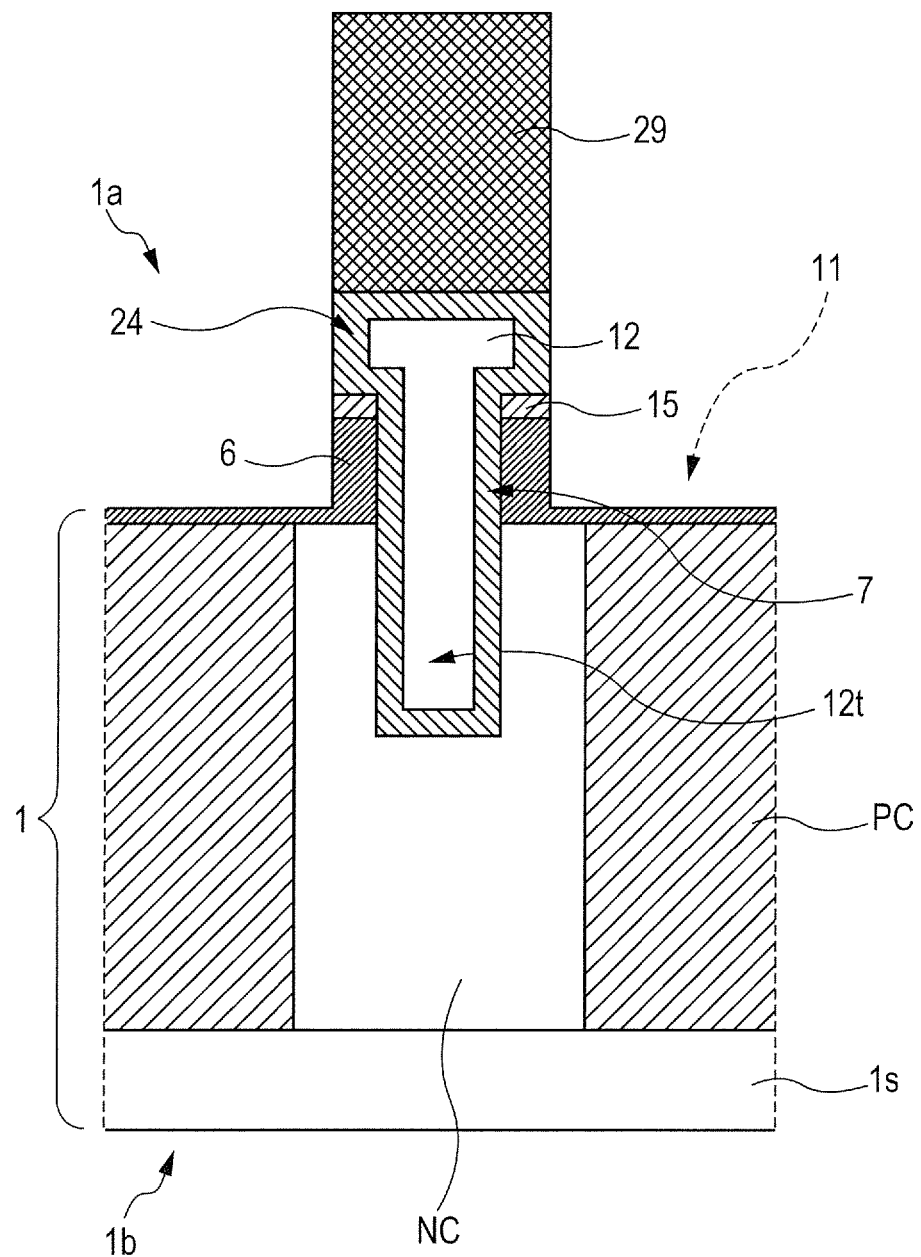
FIG. 51 is a device cross-sectional view (of the step of etching a surface of a semiconductor substrate) during the manufacturing step corresponding to the B-B' cross section of the partially cut-away region R2 of the cell portion of FIG. 41, which is for illustrating the wafer process in the method of manufacturing the semiconductor device of the other embodiment of the present invention.
Figure 52:
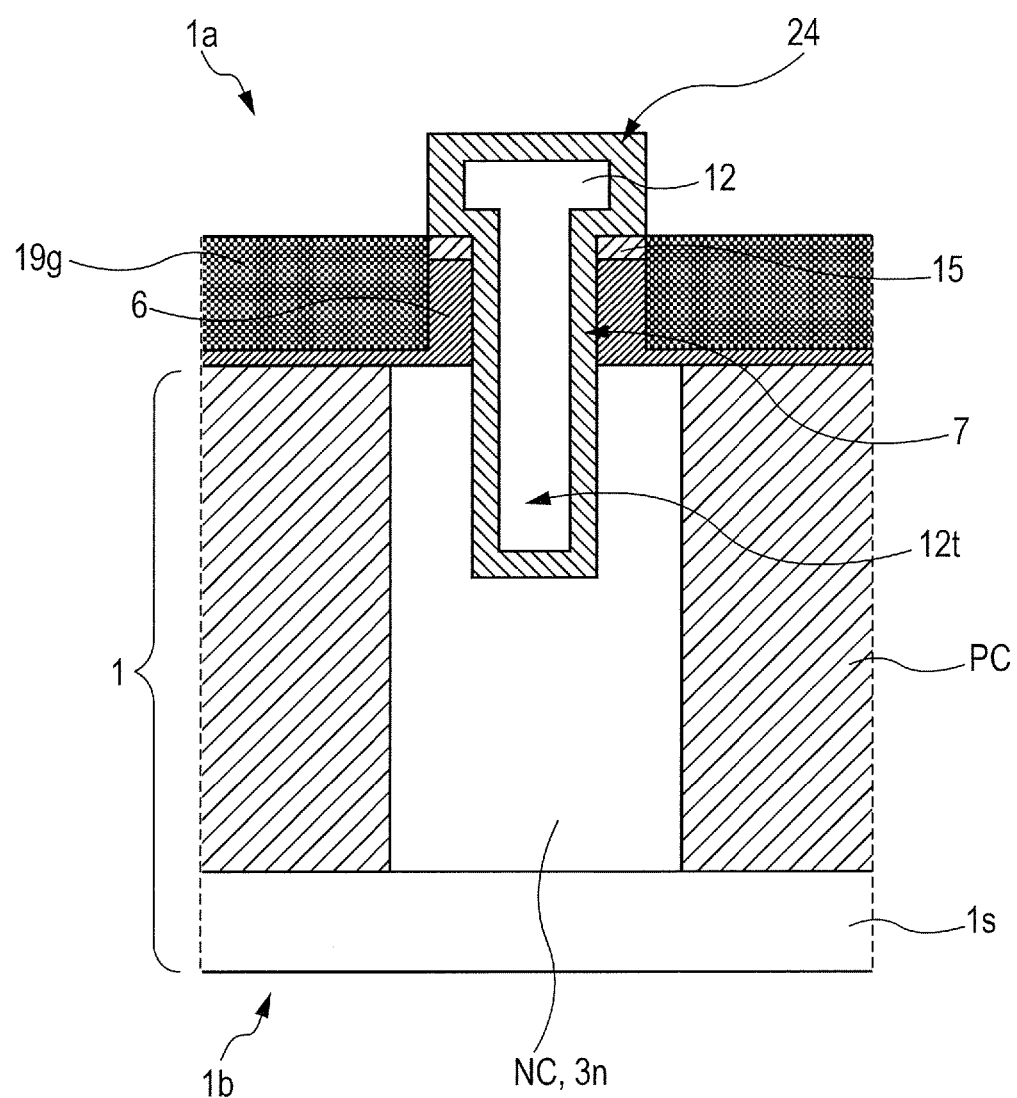
FIG. 52 is a device cross-sectional view (of the step of forming SiGe body contact regions) during the manufacturing step corresponding to the B-B' cross section of the partially cut-away region R2 of the cell portion of FIG. 41, which is for illustrating the wafer process in the method of manufacturing the semiconductor device of the other embodiment of the present invention.
Figure 53:
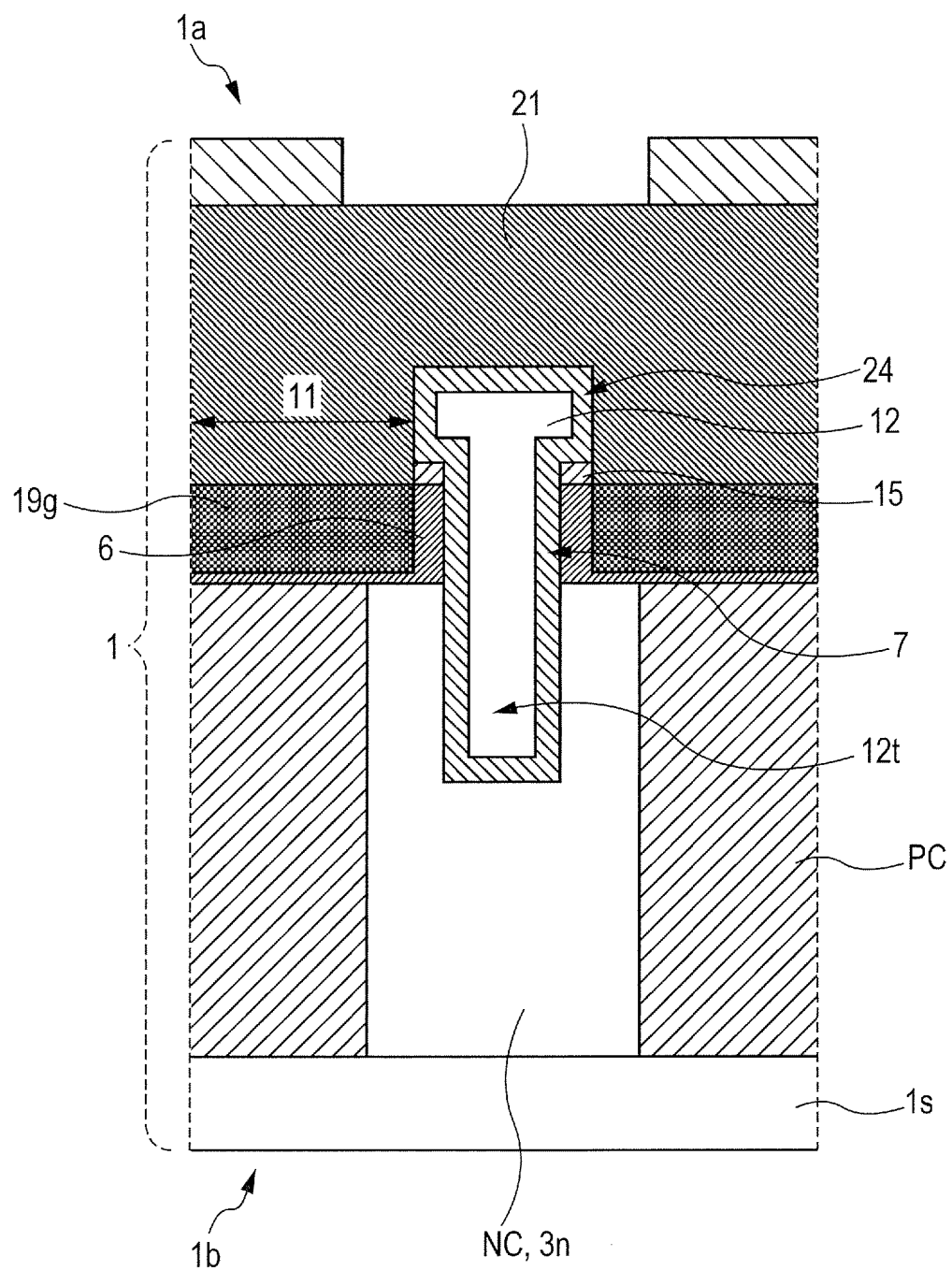
FIG. 53 is a device cross-sectional view (of the step of forming a source metal electrode) during the manufacturing step corresponding to the B-B' cross section of the partially cut-away region R2 of the cell portion of FIG. 41, which is for illustrating the wafer process in the method of manufacturing the semiconductor device of the other embodiment of the present invention.
Figure 54:
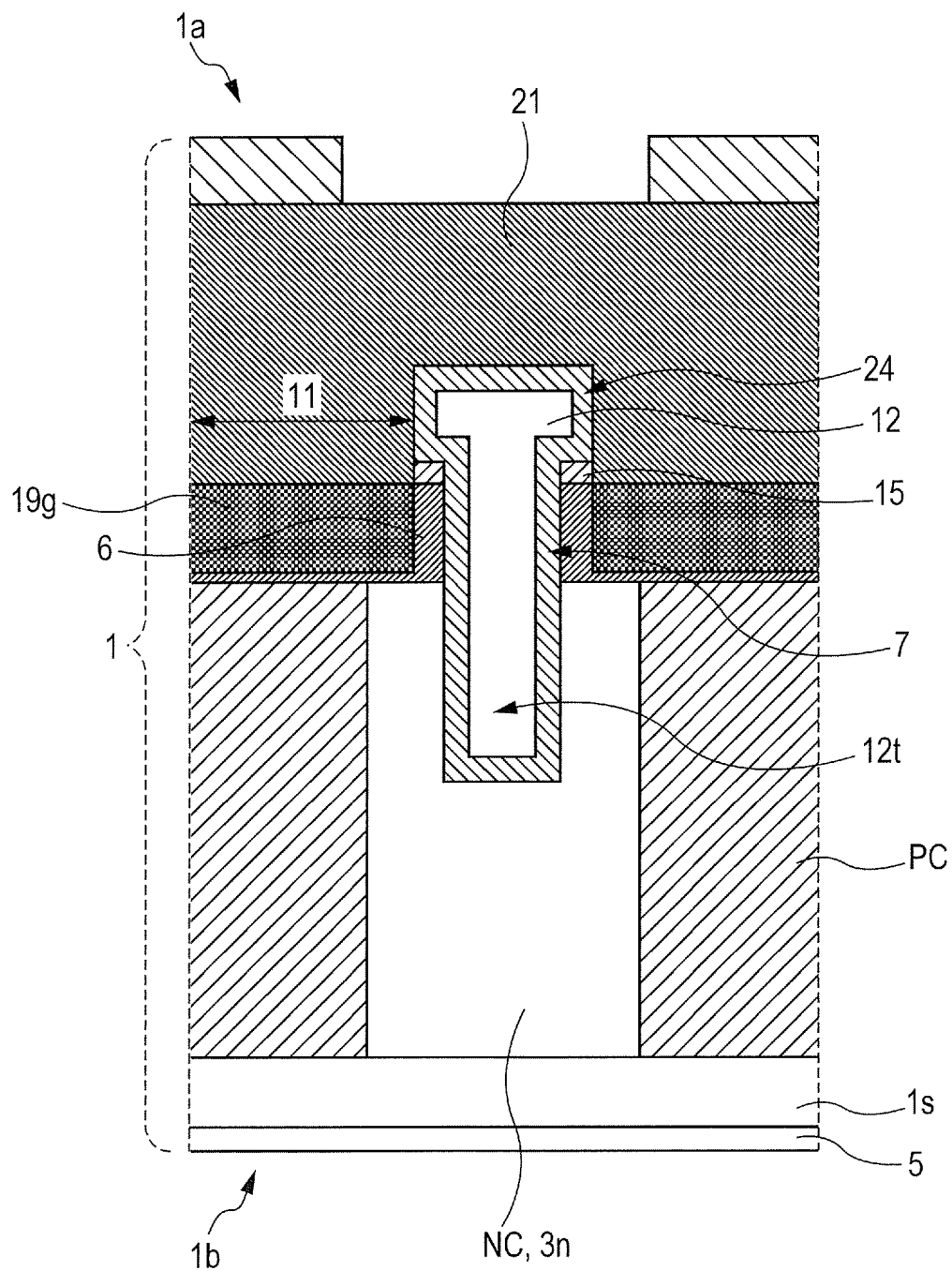
FIG. 54 is a device cross-sectional view (of the step of forming the metal drain electrode) during the manufacturing step corresponding to the B-B' cross section of the partially cut-away region R2 of the cell portion of FIG. 41, which is for illustrating the wafer process in the method of manufacturing the semiconductor device of the other embodiment of the present invention.

FIG. 43 is a device cross-sectional view (of the step of forming a super junction structure in a drift region) during the manufacturing step corresponding to the B-B' cross section of the partially cut-away region R2 of the cell portion of FIG. 41, which is for illustrating a wafer process in the method of manufacturing the semiconductor device of the other embodiment of the present invention. FIG. 44 is a device cross-sectional view (of the step of epitaxial growth of P-type body regions) during the manufacturing step corresponding to the B-B' cross section of the partially cut-away region R2 of the cell portion of FIG. 41, which is for illustrating the wafer process in the method of manufacturing the semiconductor device of the other embodiment of the present invention. FIG. 45 is a device cross-sectional view (of the step of forming trenches to be filled with gate electrodes) during the manufacturing step corresponding to the B-B' cross section of the partially cut-away region R2 of the cell portion of FIG. 41, which is for illustrating the wafer process in the method of manufacturing the semiconductor device of the other embodiment of the present invention. FIG. 46 is a device cross-sectional view (of the step of forming a gate insulating film) during ,he manufacturing step corresponding to the B-B' cross section of the partially cut-away region R2 of the cell portion of FIG. 41, which is for illustrating the wafer process in the method of manufacturing the semiconductor device of the other embodiment of the present invention. FIG. 47 is a device cross-sectional view (of the step of depositing a gate polysilicon film) during the manufacturing step corresponding to the B-B' cross section of the partially cut-away region R2 of the cell portion of FIG. 41, which is for illustrating the wafer process in the method of manufacturing ,he semiconductor device of the other embodiment of the present invention. FIG. 48 is a device cross-sectional view (of the step of processing the gate polysilicon film) during the manufacturing step corresponding to the B-B' cross section of the partially cut-away region R2 of the cell portion of FIG. 41, which is for illustrating the wafer process in the method of manufacturing the semiconductor device of the other embodiment of the present invention. FIG. 49 is a device cross-sectional view (of the step of introducing $N^+$-type source regions) during the manufacturing step corresponding to the B-B' cross section of the partially cut-away region R2 of the cell portion of FIG. 41, which is for illustrating the wafer process in the method of manufacturing the semiconductor device of the other embodiment of the present invention. FIG. 50 is a device cross-sectional view (of the step of depositing a surface oxide film) during ,he manufacturing step corresponding to the B-B' cross section of the partially cut-away region R2 of the cell portion of FIG. 41, which is for illustrating the wafer process in the method of manufacturing the semiconductor device of the other embodiment of the present invention. FIG. 51 is a device cross-sectional view (of the step of etching a surface of a semiconductor substrate) during the manufacturing step corresponding to the B-B' cross section of the partially cut-away region R2 of the cell portion of FIG. 41, which is for illustrating the wafer process in the method of manufacturing the semiconductor device of the other embodiment of the present invention. FIG. 52 is a device cross-sectional view (of the step of forming SiGe body contact regions) during the manufacturing step corresponding to the B-B' cross section of the partially cut-away region R2 of the cell portion of FIG. 41, which is for illustrating the wafer process in the method of manufacturing the semiconductor device of the other embodiment of the present invention. FIG. 53 is a device cross-sectional view (of the step of forming a source metal electrode) during the manufacturing step corresponding to the B-B' cross section of the partially cut-away region R2 of the cell portion of FIG. 41, which is for illustrating the wafer process in the method of manufacturing the semiconductor device of the other embodiment of the present invention. FIG. 54 is a device cross-sectional view (of the step of forming the metal drain electrode) during the manufacturing step corresponding to the B-B' cross section of the partially cut-away region R2 of the cell portion of FIG. 41, which is for illustrating the wafer process in the method of manufacturing the semiconductor device of the other embodiment of the present invention. Based on these drawings, a description will be given to a wafer process in the manufacturing method of the semiconductor device of the other embodiment of the present invention.

FIG. 43 shows substantially the same state as shown in FIG. 7 (FIG. 27). Accordingly, in the state shown in FIG. 43, as shown in FIG. 44, a channel-region epitaxially grown layer 33 is formed by non-selective epitaxial growth on the device surface 1a (first main surface) side of the wafer 1. The layer serves as each of the P-type body regions 6 (channel regions).

Next, as shown in FIG. 45, on the device surface 1a side of the wafer 1, a resist film 30 for gate trench formation is formed by, e.g., typical lithography. Then, using the resist film 30 for gate trench formation, the trenches 34 to be filled with gates are formed by, e.g., anisotropic dry etching. Thereafter, the resist film 30 for gate trench formation which is no longer needed is removed by, e.g., ashing or the like.

Next, as shown in FIG. 46, by, e.g., thermal oxidation or the like, a gate insulating film 7 is formed over the device surface 1a of the wafer 1 and the inner surfaces of the trenches 34 to be filled with gates by, e.g., thermal oxidation or the like.

Next, as shown in FIG. 47, over substantially the entire device surface 1a of the wafer 1, the polysilicon film 12 intended to serve as gate electrodes is deposited by, e.g., CVD so as to fill the trenches 34 to be filled with gates.

Next, as shown in FIG. 48, on the device surface 1a side of the wafer 1, the resist film 32 for gate electrode processing is formed by, e.g., typical lithography. Then, using the resist film 32 for gate electrode processing, the polysilicon film 12 and the gate insulating film 7 are processed by, e.g., anisotropic dry etching to form the gate electrodes 12.

Next, as shown in FIG. 49, in the state shown in FIG. 48, e.g., arsenic ions are implanted from the device surface 1a side of the wafer 1 to introduce the $N^+$-type source regions 15 into the surface areas of the P-type body regions 6 (channel regions). Thereafter, the resist film 32 for gate electrode processing which is no longer needed is removed by, e.g., ashing or the like.

Next, as shown in FIG. 50, over the device surface 1a of the wafer 1 and the side surfaces and upper surface of each of the gate electrodes 12, the surface oxide film 24 serving as the interlayer insulating film or the like is deposited by, e.g., thermal oxidation or the like.

Next, as shown in FIG. 51, over the device surface 1a of the wafer 1, the resist film 29 for contact trench processing is formed by, e.g., typical lithography. Then, using the resist film 29 for contact trench processing, by, e.g., anisotropic dry etching, the surface oxide film 24 is partly removed and the silicon substrate is removed by etching past the $N^+$-type source region 15 till a midpoint in each of the P-type body regions 6 is reached. In this manner, the contact trenches 11 (i.e., trenches to be filled with SiGe epitaxial regions) are formed. Thereafter, the resist film 29 for contact trench processing which is no longer needed is removed by, e.g., ashing or the like.

Next, as shown in FIG. 52, by, e.g., selective SiGe epitaxial growth, the contact trenches 11 are filled back to, e.g., the heights of the upper ends of the $N^+$-type source regions 15. As a result, the SiGe-based $P^+$-type body contact regions 19g (i.e., boron-doped SiGe epitaxial regions) are formed. As preferred examples of conditions for the selective epitaxial growth, the following can be shown. That is, a processing temperature is, e.g., about 600 to 700° C. (i.e., not more than 800° C.), a processing barometric pressure is, e.g., about 660 Pa to 2.7 kPa, a deposition time is, e.g., about 5 to 30 minutes, and gas conditions, flow rates, and the like of, e.g., DCS (Dichlorosilane), $GeH_4$, HCl, and $B_2H_6$ are about 50 to 100 sccm, 130 to 200 sccm, 20 to 40 sccm, and 10 to 20 sccm. Note that, as a precursor for the foregoing SiGe epitaxial growth, not only the DCS, but also TCS is also applicable. If consideration is given to these precursors, a preferred range of the growth temperature can be set to about 550 to 800° C. A preferred range of the processing barometric pressure can be set to about 660 Pa to an atmospheric pressure.

Next, as shown in FIG. 53, by, e.g., anisotropic dry etching, the surfaces of the SiGe-based $P^+$-type body contact regions 19g are etched back to, e.g., around the lower ends of the $N^+$-type source regions 15. However, this step is naturally not indispensable. Then, over substantially the entire device surface 1a of the wafer 1, by, e.g., sputtering deposition, a relatively thin (thinner than an aluminum-based metal film described later) barrier metal film (such as, e.g., a titanium film, a titanium film/titanium nitride film, or a TiW film) is deposited. Then, over substantially the entire surface of the barrier metal film, an aluminum-based metal film is deposited by, e.g., sputtering deposition. Then, by, e.g., typical lithography, a metal electrode film including the barrier metal film, the aluminum-based metal film, and the like is processed to form the source metal electrode 21 and the like. Then, over substantially the entire surface of the wafer 1 on the device surface 1a side, a photosensitive polyimide-based insulating film is deposited as the final passivation film 10 by, e.g., coating. Then, by processing the photosensitive polyimide-based insulating film by typical lithography, the final passivation film 10 is formed into a pattern (alternatively, the patterning may also be performed using a non-photosensitive polyimide-based insulating film). Note that, here, the opening of the final passivation film 10 corresponding to a source pad opening is shown schematically, but a real source pad opening is wider. Preferred examples of the final passivation film 10 include not only an organic single-layer film of a polyimide resin (polyimide-based resin), BCB (Benzocyclobutene), or the like, but also an organic/inorganic composite final passivation film including a plasma TEOS (Tetraethylorthosilicate)-based silicon oxide film or another silicon oxide film, a silicon nitride film, a polyimide-based resin film, and the like which are shown in ascending order, an inorganic final passivation film including a silicon oxide film, a silicon nitride film, and the like which are shown in ascending order, and the like. Then, the back surface 1b of the wafer 1 is subjected to back grinding treatment to reduce the thickness of the wafer (having an original thickness of about 500 to 1000 μm) to about 100 to 300 μm.

Next, as shown in FIG. 54, the back-surface metal electrodes 5 are formed by sputtering deposition or the like. Examples of a configuration of the back-surface metal electrode 5 which can be shown include a film including a titanium film, a nickel film, a gold film, and the like which are shown in order of increasing distance from the silicon substrate 1s. Thereafter, by dicing, the wafer 1 is divided into individual chips to provide the discrete devices 2 (semiconductor chips).

11. Description of Modification (Ion Implantation Method) Related to Method of Forming SiGe Regions in Manufacturing Method of Semiconductor Device of Another Embodiment of Present Invention (See Mainly FIG. 55)

In this section, a description will be given to a modification related to a method of forming the SiGe regions (body contact regions) in the manufacturing process described in Section 10. Since this example is a modification related to FIGS. 51 and 52 and otherwise unchanged, a description will be given only to different portions in FIGS. 51 and 52 in principle.

Figure 55:
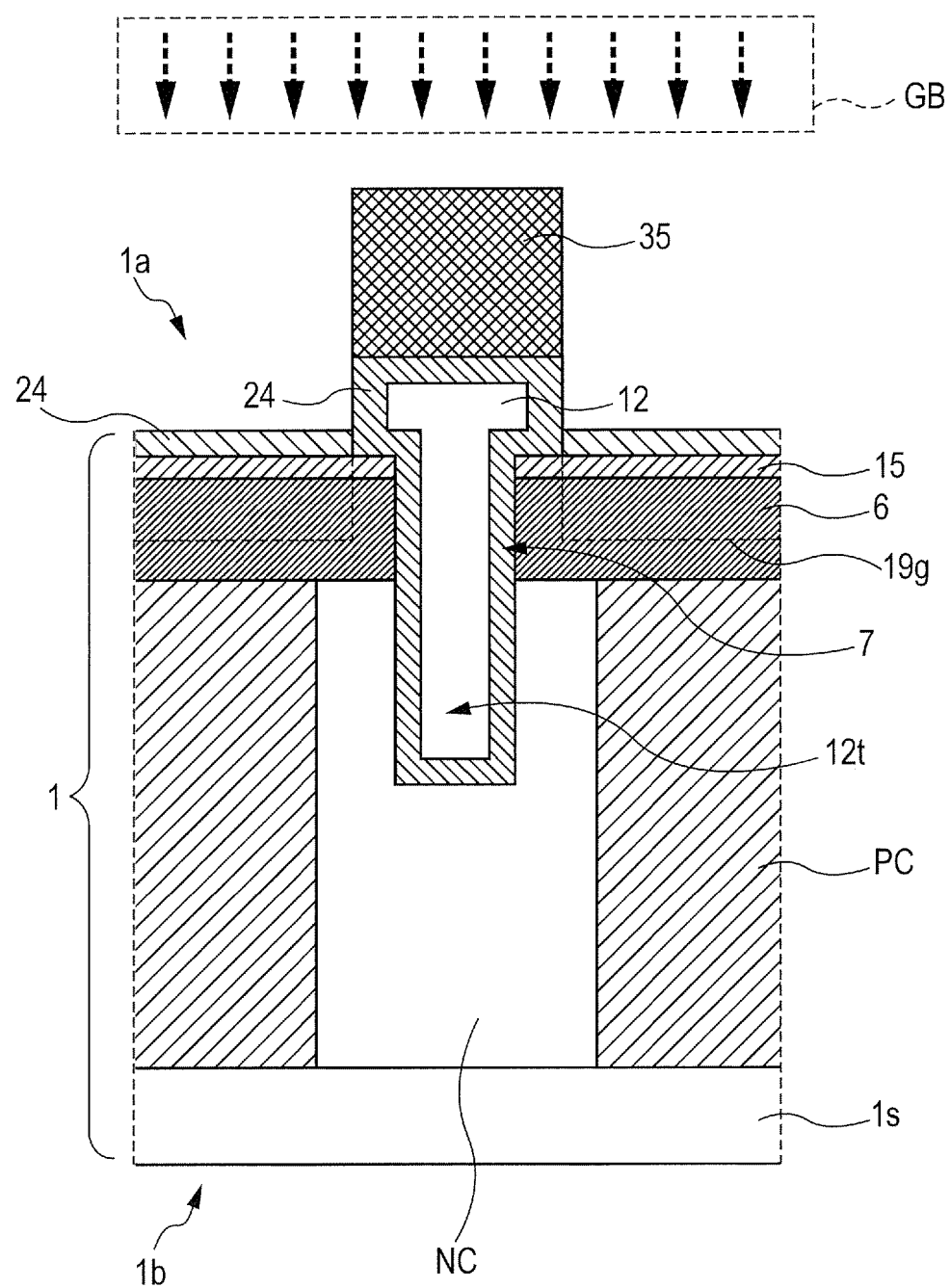
FIG. 55 is a device cross-sectional view (of the step of depositing a surface oxide film and introducing SiGe regions) during the manufacturing step corresponding to the B-B' cross section of the partially cut-away region R2 of the cell portion of FIG. 41 corresponding to FIG. 50, which is for illustrating a modification (ion implantation method) related to a method of forming the SiGe regions in the method of manufacturing the semiconductor device of the other embodiment of the present invention.

FIG. 55 is a device cross-sectional view (of the step of depositing a surface oxide film and introducing SiGe regions) during the manufacturing step corresponding to the B-B' cross section of the partially cut-away region R2 of the cell portion of FIG. 41 corresponding to FIG. 50, which is for illustrating a modification (ion implantation method) related to a method of forming the SiGe regions in the method of manufacturing the semiconductor device of the other embodiment of the present invention. Based on this drawing, a description will be given to a modification (ion implantation method) related to the method of forming the SiGe regions in the manufacturing method of the semiconductor device of the other embodiment of the present invention.

In the state shown in FIG. 50, as shown in FIG. 55, a resist film 35 for Ge & B ion implantation is formed by, e.g., typical lithography. Using the resist film 35 for Ge & B ion implantation as an ion implantation mask, e.g., boron ions and germanium ions GB are sequentially introduced into the $N^+$-type source regions 15 and the P-type body regions 6 (channel regions) by, e.g., ion implantation. Then, using the resist film 35 for Ge & B ion implantation as a mask, the surface oxide film 24 over the $N^+$-type source regions 15 is removed by, e.g., anisotropic dry etching. Thereafter, the resist film 35 for Ge & B ion implantation which is no longer needed is removed by, e.g., ashing or the like. Then, anneal for activating the boron ions and germanium ions or the like is performed. As a result, the SiGe-type $P^+$-type body contact regions 19g (i.e., boron-doped SiGe semiconductor regions) are substantially completed to result in the state shown in FIG. 52. The subsequent steps are substantially the same as shown in FIGS. 53 and 54.

Supplementary Explanation Related to Crystal Plane Orientation of Wafer, etc. Related to Each of Above Embodiments (Including Various Modifications) (See Mainly FIGS. 56 and 57)

In each of the examples described heretofore, the description has been given based on the following first crystal orientation (notch direction of <100> orientation) unless particularly described otherwise. However, it will be appreciated the following second crystal orientation (notch direction of <100> orientation) or another orientation may also be used for a reason other than what is required for the formation of the super junction structure.

Figure 56:
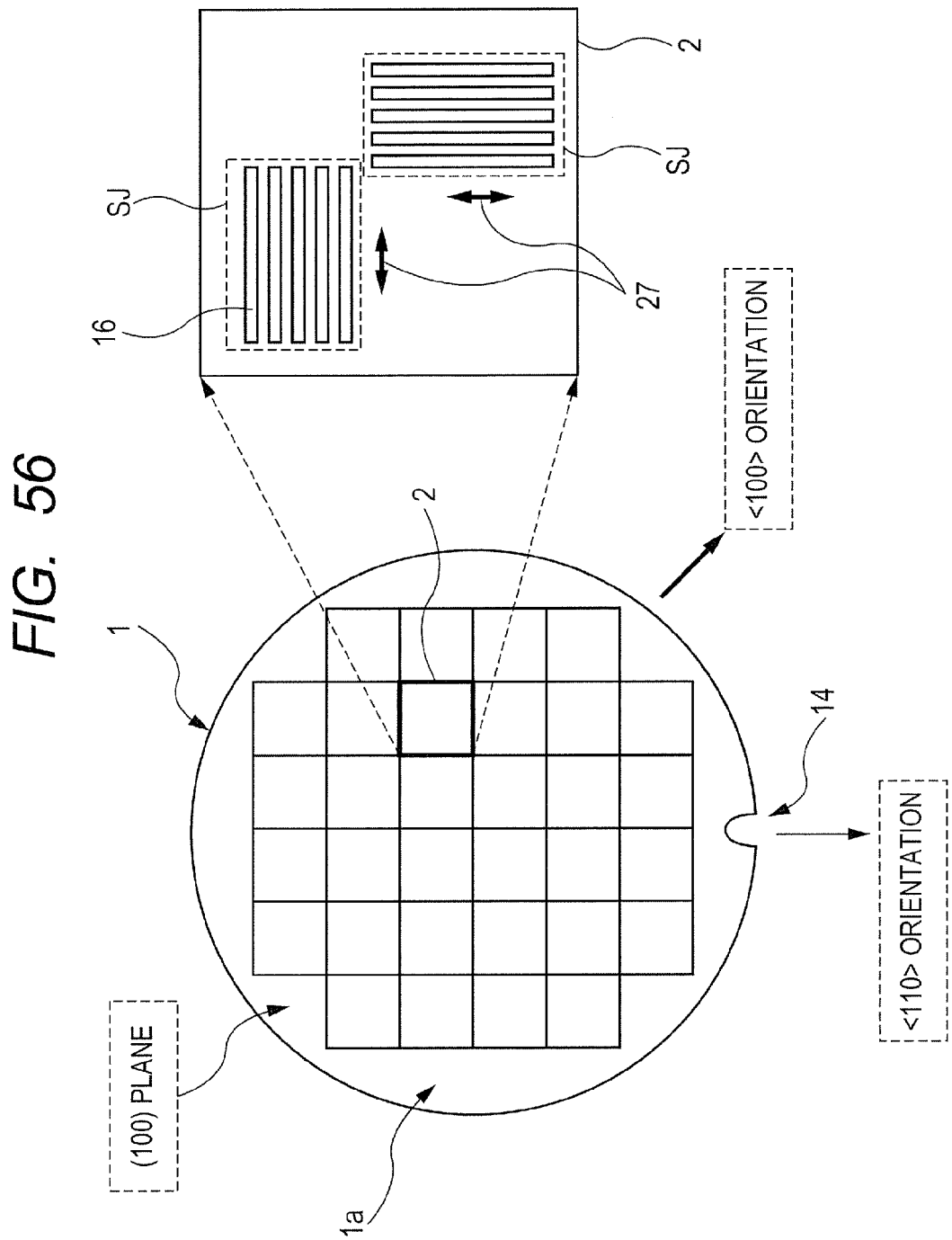
FIG. 56 is an overall top view or the like of a wafer or the like for supplementary explanation related to an example (notch <110> orientation) of the crystal plane orientation of the wafer or the like related to each of the foregoing embodiments (including the various modifications)
Figure 57:
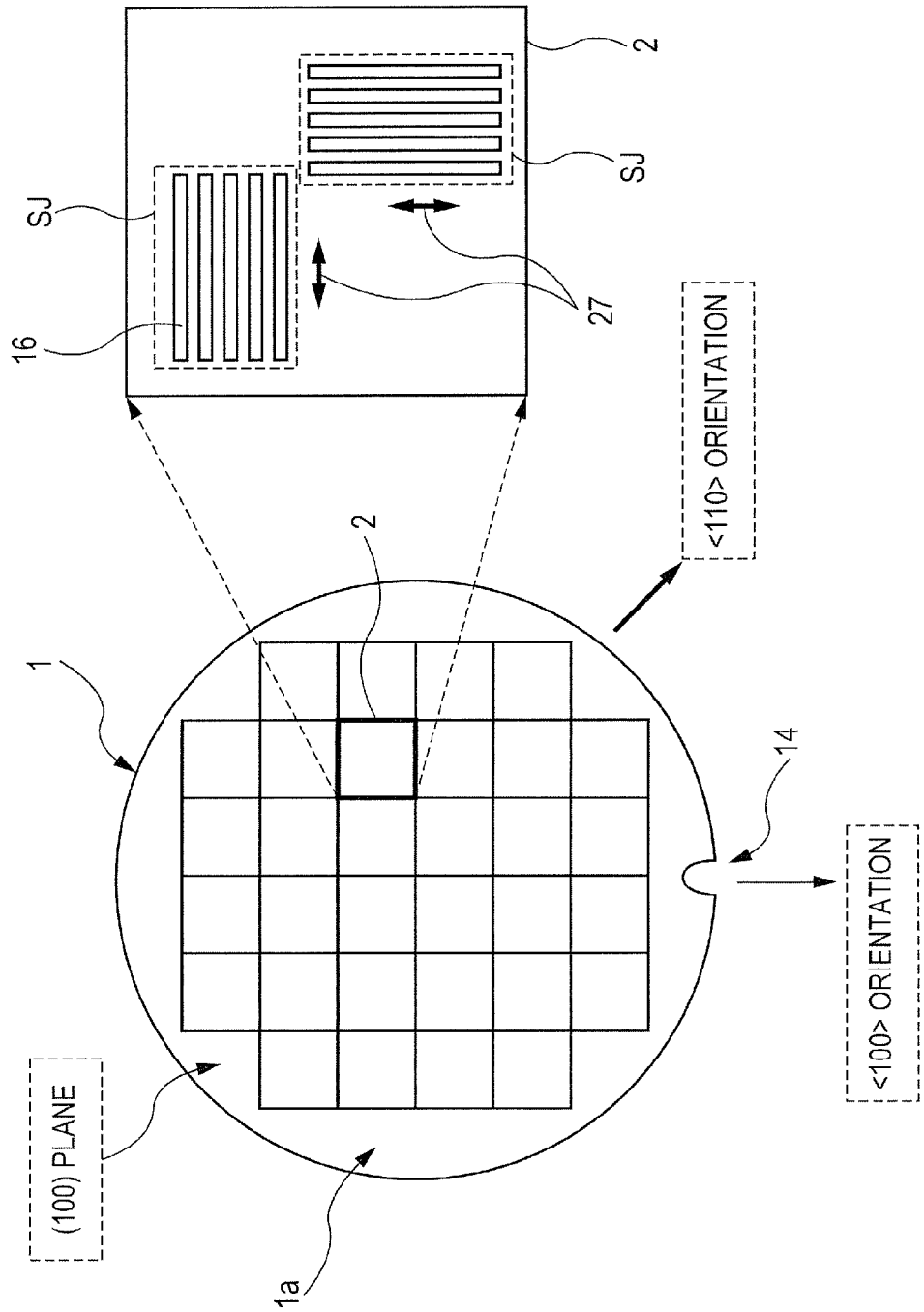
FIG. 57 is an overall top view or the like of the wafer or the like for supplementary explanation related to another example (notch <100> orientation) of the crystal plane orientation of the wafer or the like related to each of the foregoing embodiments (including the various modifications).

FIG. 56 is an overall top view or the like of a wafer or the like for supplementary explanation related to an example (notch direction of <110> orientation) of the crystal plane orientation of the wafer or the like related to each of the foregoing embodiments (including the various modifications). FIG. 57 is an overall top view or the like of the wafer or the like for supplementary explanation related to another example (notch direction of <100> orientation) of the crystal plane orientation of the wafer or the like related to each of the foregoing embodiments (including the various modifications). Based on these drawings, a supplementary explanation will be given to the crystal plane orientation of the wafer or the like related to each of the foregoing embodiments (including the various modifications) and the like.

(1) EXAMPLE (First Crystal Orientation) of Wafer Having Notch Direction of <110> Orientation FIG. 56 shows the entire upper surface of the wafer 1 having the first crystal orientation (notch direction of <110> orientation) and the upper surface of each of the chip regions thereof. As shown in FIG. 56, the device surface 1a of the wafer 1 is in a (100) plane, and the direction of a notch 14 is a <110> orientation. The characteristic feature of the wafer 1 is that, in a plane parallel with the device surface 1a, a direction resulting from a 45-degree rotation from the direction of the notch 14 around the center of the wafer is a <100> orientation. Here, the orientation of each of the trenches 16 to be filled with P-type columns in the super junction structure SJ in each of the chip regions 2 is parallel with any of the sides of the chip. Such an orientation of each of the trenches 16 to be filled with P-type columns has the advantage of improved filling properties when the trenches 16 are filled with the P-type column regions PC (e.g., FIG. 6) by a trench-fill method. In addition, the longitudinal direction (longitudinal direction of the trench of the trench gate MOSFET) of the gate electrode of each of the planar MOSFETs in each of the chip regions 2 is also parallel with any of the sides of the chip.

(2) EXAMPLE (Second Crystal Orientation) of Wafer Having Notch Direction of <110> Orientation In another preferred crystal orientation other than the first crystal orientation, as shown in FIG. 57, the device surface 1a of the wafer 1 is in the (100) plane, and the direction of the notch 14 is the <100> orientation. The characteristic feature of the wafer 1 is that, in a plane parallel with the device surface 1a, a direction resulting from a 45-degree rotation from the direction of the notch 14 around the center of the wafer is the <110> direction. Here, in the same manner as described above, the orientation of each of the trenches 16 to be filled with P-type columns in the super junction structure SJ in each of the chip regions 2 is parallel with any of the sides of the chip. Such an orientation of each of the trenches 16 to be filled with P-type columns has the advantage of improved filling properties when the trenches 16 are filled with the P-type column regions PC (e.g., FIG. 6) by a trench-fill method. In addition, the longitudinal direction (longitudinal direction of the trench of the trench gate MOSFET) of the gate electrode of each of the planar MOSFETs in each of the chip regions 2 is also parallel with any of the sides of the chip. The wafer having the second crystal orientation is particularly effective for a method which does not include the process of filling each of trenches in a super junction structure with an epitaxial layer, such as, e.g., a multi-epitaxial method.

13. Consideration to Every Aspect of Present Invention and Supplementary Explanation Related to Each of Embodiments As has been described heretofore, in each of the examples in Sections 1 to 8, the formation of the body regions 6 (channel regions) is performed not by combining ion implantation with high-temperature activation anneal (at, e.g., 950 to 1100° C.), but by selective epitaxial growth at a relatively low temperature to prevent the scattering of an impurity profile in each of the P-type column regions PC included in the super junction structure SJ. Here, in the case of Si epitaxial growth, the relatively low temperature indicates a range of about 750 to 900° C., or more preferably about 750 to 850° C.

Also, in each of the examples in Sections 9 and 10, not the body regions 6 (channel regions), but the $P^+$-type body contact regions 19 are implemented by selective epitaxial growth at a relatively low temperature to prevent the scattering of an impurity profile in each of the P-type column regions PC included in the super junction structure SJ. Here, in the case of SiGe epitaxial growth, the relatively low temperature indicates a range of 600 to 700° C., i.e., not more than 800° C.

The examples in Sections 9 and 10 achieve an improvement in the mobility of electrons by means of a stress perpendicular to the channel of each of the trench-gate power MOSFETs produced using the P+-type body contact regions 19 embedded by selective epitaxial growth.

In regard to this, the example in Section 12 implements the structure in Section 9 by ion implantation and activation heat treatment.

14. Summary

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

For example, in each of the foregoing embodiments, the MOS structure of the planar gate structure has been described specifically by way of example. However, it will be appreciated that the present invention is not limited thereto, and can be similarly applied to the trench-gate structure of a U-MOSFET or the like or to an LD-MOSFET. Also, as the layout of the MOSFETs, the example has been shown in which the MOSFETs are arranged in a striped configuration in parallel with the pn columns. However, various applications are enabled by arranging the MOSFETs in a direction orthogonal to the pn columns or arranging the MOSFETs in a grid-like configuration.

Note that, in each of the foregoing embodiments, the configuration in which the N-channel devices are formed primarily over the upper surface of the N-type epitaxial layer over the N+-type single-crystal silicon substrate has been described specifically, but the present invention is not limited thereto. It may also be possible to use a configuration in which P-channel devices are formed over the upper surface of an N-type epitaxial layer over a P+-type single-crystal silicon substrate.

Also, in each of the foregoing embodiments, the N-channel power (or NPN) semiconductor has been mainly described, but a P-channel power (or PNP) semiconductor is obtained by structurally replacing the P and N types of all the regions with the opposite conductivity types (PN inversion). Note that, in terms of the manufacturing method, selective implantation of P-type or N-type ions, P-type or N-type (full-face or embedded) epitaxial growth, or the like may be used appropriately.

Also, in the foregoing embodiment, the power MOSFETs have been described specifically by way of example, but the present invention is not limited thereto. It will be appreciated that the present invention is also applicable to power devices each having a super junction structure (including an IGBT and a thyristor), i.e., a diode, a bipolar transistor, and the like. It will be appreciated that the present invention is also applicable to a semiconductor integrated circuit device or the like in which such a power MOSFET, a diode, a bipolar transistor, or the like are embedded.

Also, in each of the foregoing embodiments, the trench-fill method has been primarily described specifically as the method of forming the super junction structure, but the present invention is not limited thereto. For example, it will be appreciated that the present invention is also applicable to a multi-epitaxial method or the like.

Note that, in the foregoing embodiment, the example using monomethylsilane or the like for carbon doping has been described specifically. However, it will be appreciated the present invention is not limited thereto, and can also use a liquefied gas of, e.g., trimethylsilane or the like.

What is claimed is:

1. A method of manufacturing a trench-gate power MOSFET comprising:

(a) a semiconductor substrate having a first main surface and a second main surface;
    (b) a drift region having a super junction structure in which a plurality of column regions each of a first conductivity type and a plurality of column regions each of a second conductivity type which are provided in the semiconductor substrate are alternately formed;
    (c) a drain region of the first conductivity type provided in a semiconductor back surface area of the semiconductor substrate closer to the second main surface;
    (d) a metal drain electrode provided over the second main surface of the semiconductor substrate;
    (e) a body region of the second conductivity type provided in a semiconductor top surface area of the semiconductor substrate closer to the first main surface;
    (f) a trench extending from within each of the plurality of column regions each of the first conductivity type through the body region and reaching the first main surface of the semiconductor substrate;
    (g) a source region of the first conductivity type which is the semiconductor top surface area of the semiconductor substrate closer to the first main surface and provided in the body region;
    (h) a trench gate electrode provided in the trench via a gate insulating film;
    (i) a SiGe epitaxial region of the second conductivity type provided closer to the first main surface of the semiconductor substrate so as to oppose the trench gate electrode with the body region being interposed therebetween; and
    (j) a metal source electrode provided over the first main surface of the semiconductor substrate so as to be electrically coupled to the source region, the method of manufacturing the trench-gate power MOSFET comprising the steps of:

(x1) forming the super junction structure on the top surface side of the silicon-based wafer of the first conductivity type;
    (x2) forming the body region of the second conductivity type over the super junction structure on the top surface side of the silicon-based wafer;
    (x3) forming a trench to be filled with the SiGe epitaxial region in the body region so as to leave the body region between the trench to be filled with the SiGe epitaxial region and the trench gate electrode; and
    (x4) filling the trench to be filled with the SiGe epitaxial region by selective epitaxial growth.

2. A method of manufacturing a trench-gate power MOSFET according to claim 1, wherein each of the column regions of the second conductivity type is doped with germanium or carbon.

3. A method of manufacturing a trench-gate power MOSFET comprising:

(a) a semiconductor substrate having a first main surface and a second main surface;
    (b) a drift region having a super junction structure in which a plurality of column regions each of a first conductivity type and a plurality of column regions each of a second conductivity type which are provided in the semiconductor substrate are alternately formed;
    (c) a drain region of the first conductivity type provided in a semiconductor back surface area of the semiconductor substrate closer to the second main surface;
    (d) a metal drain electrode provided over the second main surface of the semiconductor substrate;

(e) a body region of the second conductivity type provided in a semiconductor top surface area of the semiconductor substrate closer to the first main surface;

(f) a trench extending from within each of the plurality of column regions each of the first conductivity type through the body region and reaching the first main surface of the semiconductor substrate;

(g) a source region of the first conductivity type which is the semiconductor top surface area of the semiconductor substrate closer to the first main surface and provided in the body region;

(h) a trench gate electrode provided in the trench via a gate insulating film;

(i) a SiGe semiconductor region of the second conductivity type provided closer to the first main surface of the semiconductor substrate so as to oppose the trench gate electrode with the body region being interposed therebetween; and (j) a metal source electrode provided over the first main surface of the semiconductor substrate so as to be electrically coupled to the source region, the method of manufacturing the trench-gate power MOSFET comprising the steps of:

(x1) forming the super junction structure on the top surface side of the silicon-based wafer of the first conductivity type;

(x2) forming the body region of the second conductivity type over the super junction structure on the top surface side of the silicon-based wafer;

(x3) forming the source region in a surface of the body region; and (x4) forming the SiGe semiconductor region in a part of the body region by ion implantation so as to leave the body region between the SiGe semiconductor region and the trench gate electrode.

4. A method of manufacturing a trench-gate power MOSFET according to claim 3, wherein each of the column regions of the second conductivity type is doped with germanium or carbon.

* * * * *